(12) United States Patent
Masui et al.

(10) Patent No.: US 8,497,141 B2
(45) Date of Patent: Jul. 30, 2013

(54) SEMICONDUCTOR DEVICE AND METHOD OF MANUFACTURING IT

(75) Inventors: Yuji Masui, Kanagawa (JP); Takahiro Arakida, Kanagawa (JP); Yoshinori Yamauchi, Tokyo (JP); Kayoko Kikuchi, Kanagawa (JP); Rintaro Koda, Tokyo (JP); Norihiko Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 86 days.

(21) Appl. No.: 13/137,339

(22) Filed: Aug. 8, 2011

(65) Prior Publication Data

US 2011/0294236 A1 Dec. 1, 2011

Related U.S. Application Data

(62) Division of application No. 11/806,884, filed on Jun. 5, 2007, now Pat. No. 8,022,424.

(30) Foreign Application Priority Data

Jun. 20, 2006 (JP) ................................ 2006-170369
May 7, 2007 (JP) ................................ 2007-122589

(51) Int. Cl.
 *H01L 21/66* (2006.01)
 *H01L 33/10* (2010.01)
(52) U.S. Cl.
 USPC ................ 438/14; 438/33; 438/39; 438/460; 257/E21.53
(58) Field of Classification Search
 USPC ..................... 438/39; 257/E21.522
 See application file for complete search history.

(56) References Cited

U.S. PATENT DOCUMENTS

| 5,801,538 | A | * | 9/1998 | Kwon ........................ 324/671 |
| 5,982,799 | A | | 11/1999 | Bour et al. |
| 6,993,055 | B2 | * | 1/2006 | Wang et al. .............. 372/46.013 |
| 2004/0008747 | A1 | | 1/2004 | Nakayama et al. |
| 2005/0078726 | A1 | | 4/2005 | Watanabe et al. |
| 2005/0139856 | A1 | | 6/2005 | Hino et al. |
| 2006/0227838 | A1 | | 10/2006 | Hata et al. |
| 2007/0054422 | A1 | * | 3/2007 | Lerner ........................ 438/14 |

FOREIGN PATENT DOCUMENTS

| JP | 2001-210608 | | 8/2001 |
| JP | 2003-347675 | A | 12/2003 |
| JP | 2004-047636 | | 2/2004 |
| JP | 2005-026625 | | 1/2005 |

OTHER PUBLICATIONS

Japanese Office Action issued Oct. 26, 2011 for corresponding Japanese Application No. 2007-122589.

* cited by examiner

*Primary Examiner* — Stephen W Smoot
(74) *Attorney, Agent, or Firm* — Rader, Fishman & Grauer PLLC

(57) ABSTRACT

A method of manufacturing a semiconductor device capable of largely increasing the yield and a semiconductor device manufactured by using the method is provided. After a semiconductor layer is formed on a substrate, as one group, a plurality of functional portions with at least one parameter value different from each other is formed in the semiconductor layer for every unit chip area. Then, a subject that is changed depending on the parameter value is measured and evaluated and after that, the substrate is divided for every chip area so that a functional portion corresponding with a given criterion as a result of the evaluation is not broken. Thereby, at least one functional portion corresponding with a given criterion can be formed by every chip area by appropriately adjusting each parameter value.

12 Claims, 43 Drawing Sheets

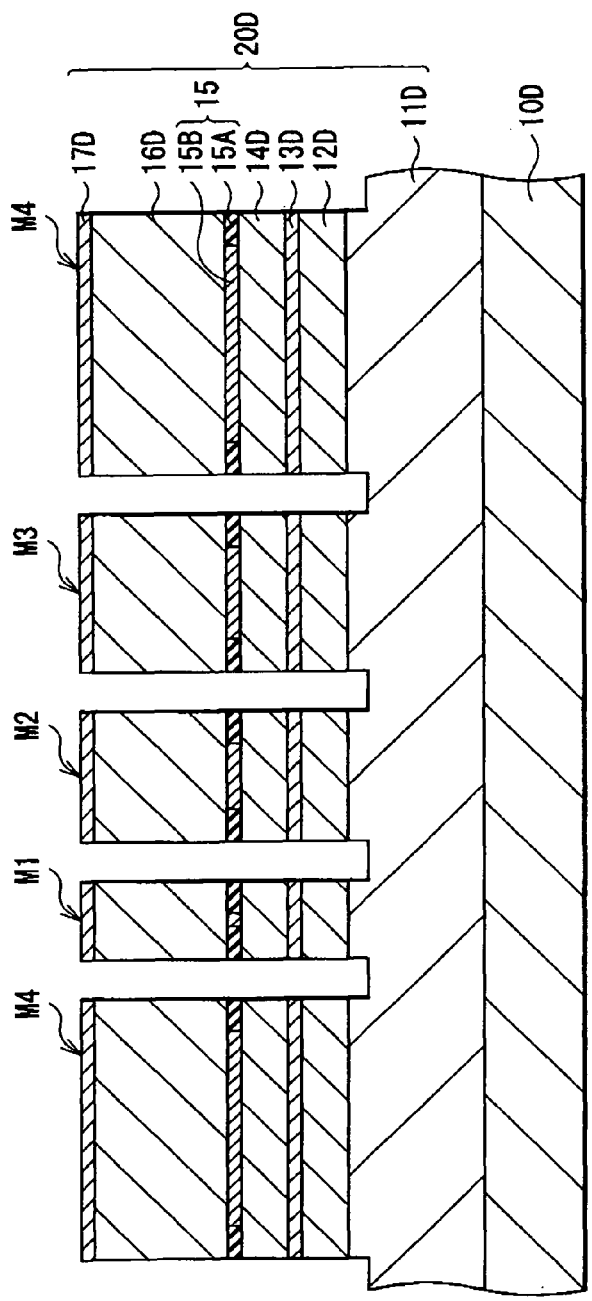
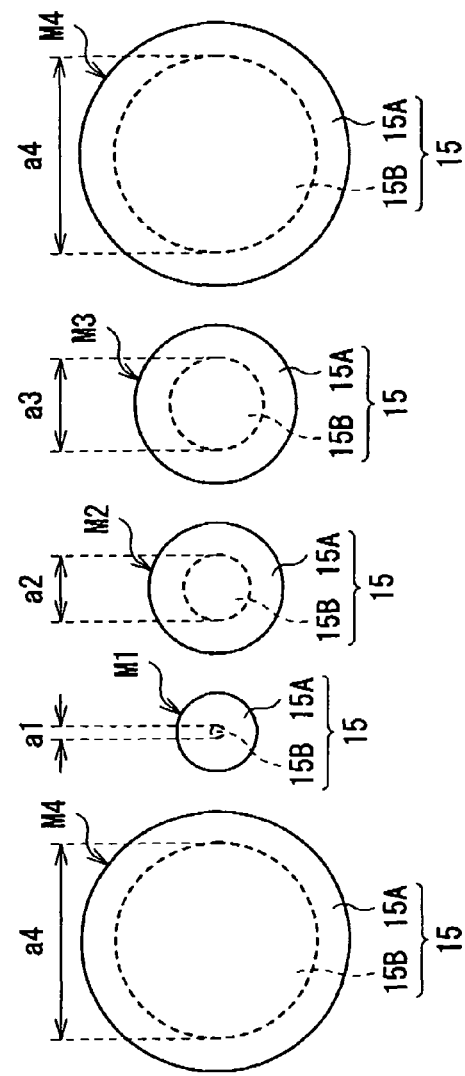
FIG. 11A
FIG. 11B

SEMICONDUCTOR DEVICE AND METHOD OF MANUFACTURING IT

CROSS REFERENCES TO RELATED APPLICATIONS

The present invention is a Divisional application of application Ser. No. 11/806,884, filed on Jun. 5, 2007, now U.S. Pat. No. 8,022,424, issued Sep. 20, 2011, which contains subject matter related to Japanese Patent Application JP 2006-170369 filed in the Japanese Patent Office on Jun. 20, 2006 and Japanese Patent Application JP 2007-122589 filed in the Japanese Patent Office on May 7, 2007, the entire contents of which being incorporated herein by references.

BACKGROUND OF THE INVENTION

1. Field of the Invention

The present invention relates to a semiconductor device having a functional portion with the characteristics being easily changed by an as-manufactured error, and a method of manufacturing the semiconductor device.

2. Description of the Related Art

In a Vertical Cavity Surface Emitting Laser (VCSEL), a pair of multilayer film reflectors is formed on a substrate, and an active layer as a light emitting region is provided between the pair of multilayer film reflectors. In one of the multilayer film reflectors, in order to improve efficiency of current injection into the active layer and lower the threshold value current, a current confinement layer having a structure that a current injection region is confined is provided. Further, a post-shaped mesa is formed in the semiconductor layers. An upper electrode is provided on the upper face side of the mesa. A lower electrode is provided on the rear face side of the substrate. An aperture for emitting laser light is provided in the upper electrode. In the VCSEL, a current injected from the upper electrode and the lower electrode is confined by the current confinement layer, and then is injected into the active layer, where light is emitted. While the light is repeatedly reflected by the pair of multilayer film reflectors, the light is emitted from the aperture as laser light.

The foregoing current confinement layer is generally formed by oxidizing an AlAs layer from the side face of the mesa. In the past, for example, the current confinement layer has been formed by controlling the oxidation confinement diameter (diameter of the current injection region as a non-oxidation region) by oxidation time. Otherwise, as described in Japanese Unexamined Patent Application Publication No. 2001-210908, the current confinement layer has been formed by forming a mesa for monitoring in one wafer, and controlling the oxidation confinement diameter by reflectance change corresponding to the oxidation area in the lamination face of the AlAs layer included in the mesa.

However, the oxidation rate of the AlAs layer largely depends on the thickness of the AlAs layer, the impurity concentration or the like as well as the substrate temperature and the supply flow rate of reactive gas. Therefore, in general, reproducibility of the oxidation confinement diameter is poor, and the oxidation confinement diameter varies even in one wafer face. In the result, even when the foregoing method is used, the error of the oxidation confinement diameter resulting from such poor reproducibility and variation of the oxidation confinement diameter in the wafer face is often larger than the precision necessary for the oxidation confinement diameter (for example, ±0.5 μm or more), leading to lowering of the number of VCSELs (yield) obtained from one wafer.

SUMMARY OF THE INVENTION

Therefore, for example, the following method can be cited. That is, as shown in FIG. 43, a plurality of mesas M101 to M103 with the mesa diameters R101 to R103 different from each other are formed in one wafer face, AlAs layers (not shown) included therein are oxidized to form non-oxidation regions 115B with the oxidation confinement diameters $a_{101}$ to $a_{103}$ different from each other are formed. Thereby, in one of these mesas, the non-oxidation region 115B having the oxidation confinement diameter corresponding with a given criterion ($a_0 \pm \Delta a$) is formed (refer to FIG. 44). The dashed lines in FIG. 43 show the dicing location where the wafer is divided into small chips after oxidation treatment.

When the foregoing method is used, it may be easy to form a VCSEL having the oxidation confinement diameter corresponding with a given criterion. However, VCSELs having the oxidation confinement diameter not corresponding with the given criterion are naturally disposed. Therefore, there is a shortcoming that as the number of types of mesa diameters is increased, the yield is decreased.

Further, the foregoing shortcoming also occurs in semiconductor devices having a functional portion with the characteristics being easily changed by as-manufactured errors.

In view of the foregoing, in the invention, it is desirable to provide a method of manufacturing a semiconductor device capable of largely increasing the yield, and a semiconductor device manufactured by the method.

According to an embodiment of the invention, there is provided a semiconductor device including a plurality of functional portions with at least one parameter value different from each other.

In the semiconductor device of the embodiment of the invention, the plurality of functional portions with at least one parameter value different from each other are provided. Therefore, by appropriately adjusting individual parameter values, at least one functional portion corresponding with a given criterion can be formed in a manufacturing step. The foregoing given criterion may be one or plural.

According to an embodiment of the invention, there is provided a first method of manufacturing a semiconductor device including the following steps A to C:

A. a first formation step of forming a semiconductor layer on a substrate, and then forming, as one group, a plurality of functional portions with at least one parameter value different from each other in the semiconductor layer for every unit chip area;

B. a measurement and evaluation step of measuring and evaluating a subject that is changed depending on the parameter value; and C. a dividing step of dividing the substrate for every chip area so that a functional portion corresponding with a given criterion as a result of the evaluation is not broken.

The foregoing given criterion may be one or plural.

In the first method of manufacturing a semiconductor device, the plurality of functional portions with at least one parameter value different from each other are formed in the semiconductor layer for every unit chip area. Therefore, by appropriately adjusting individual parameter values, at least one functional portion corresponding with a given criterion can be formed for every unit chip area.

For example, when a semiconductor device having a functional portion with the characteristics being easily changed by an as-manufactured error is manufactured, by setting at least one parameter value of the individual functional portions different from each other in consideration of the error, at least one functional portion corresponding with a given criterion can be surely formed for every unit chip area. Further, when a plurality of given criteria are provided, by setting at least one parameter value of the individual functional portions different from each other in consideration of the error, at least one functional portion corresponding with at least one given criterion can be surely formed for every unit chip area.

When a plurality of functional portions corresponding with a given criterion exist for every unit chip area, for example, the plurality of functional portions can be selected or used concurrently according to the purpose and usage. When a functional portion not corresponding with a given criterion exists, for example, the following action can be made. For example, when the functional portion not corresponding with the given criterion does not adversely affect the functional portion corresponding with the given criterion, the functional portion not corresponding with the given criterion is left as it is. Meanwhile, when the functional portion not corresponding with the given criterion somewhat adversely affects the functional portion corresponding with the given criterion, the functional portion not corresponding with the given criterion is preferably broken to the degree that adverse effects are not caused, or preferably removed.

According to an embodiment of the invention, there is provided a second method of manufacturing a semiconductor device including the following steps A to D:

A. a first formation step of forming a semiconductor layer on a substrate, and then forming a plurality of first functional portions and a plurality of second functional portions in the semiconductor layer respectively for every unit chip area, the first functional portion having each parameter value common to each other, the second functional portion having each parameter value common to each other, at least one parameter value being different from the parameter value of the first functional portion;

B. a second formation step of forming a common electrode corresponding to one of the first functional portions and one of the second functional portions;

C. a measurement and evaluation step of measuring and evaluating a subject that is changed depending on the parameter value; and D. a dividing step of dividing the substrate so that a region closest to a functional portion corresponding with a given criterion as a result of the evaluation in the common electrode is separated from a region closest to a functional portion not corresponding with the given criterion as a result of the evaluation in the common electrode.

In the second method of manufacturing a semiconductor device, the plurality of first functional portions with each parameter value common to each other and the plurality of second functional portions in which each parameter value is common to each other, and at least one parameter value is different from the parameter value of the first functional portion are respectively formed in the semiconductor layer for every unit chip area. Thereby, by appropriately adjusting individual parameter values, at least one functional portion corresponding with a given criterion can be formed in the semiconductor layer. Further, after the common electrode is formed correspondingly to one of the functional portions and one of the second functional portions, the substrate is divided so that the region closest to the functional portion corresponding with a given criterion in the common electrode is separated from the region closest to the functional portion not corresponding with the given criterion in the common electrode. Thereby, the number of electrodes formed on the semiconductor layer can be decreased more than in the case that an electrode is formed for every functional portion.

In the semiconductor device of the embodiment of the invention, the plurality of functional portions with at least one parameter value different from each other are included. Therefore, at least one functional portion corresponding with a given criterion exists in the manufacturing step. Thereby, in the manufacturing step, the waste such as disposing a chip (semiconductor device) with the functional portion not corresponding with the given criterion is not incurred, leading to largely increased yield.

According to the first method of manufacturing a semiconductor device, the plurality of functional portions with at least one parameter value different from each other are formed for every unit chip area. Therefore, at least one functional portion corresponding with a given criterion exists for every unit chip area. Thereby, the waste such as disposing a chip (semiconductor device) with a functional portion not corresponding with the given criterion is not incurred, leading to largely increased yield.

According to the second method of manufacturing a semiconductor device, in the semiconductor layer, the plurality of first functional portions and the plurality of second functional portions are respectively formed for every unit chip area. Therefore, at least one functional portion corresponding with a given criterion exists in the semiconductor layer. Thereby, the waste such as disposing the whole wafer with a functional portion not corresponding with the given criterion is not incurred, leading to largely increased yield. Further, after the common electrode is formed correspondingly to one of the first functional portions and one of the second functional portions, the substrate is divided so that the region closest to the functional portion corresponding with a given criterion in the common electrode is separated from the region closest to the functional portion not corresponding with the given criterion in the common electrode. Thereby, the number of chips including the functional portion corresponding with a given criterion that are capable of being obtained from one wafer can be increased more than in the case that an electrode is formed for every functional portion, and the yield is improved.

Other and further objects, features and advantages of the invention will appear more fully from the following description.

BRIEF DESCRIPTION OF THE DRAWINGS

FIGS. 11A and 11B are a cross section and a top view for explaining a step following FIG. 9;

DETAILED DESCRIPTION OF THE PREFERRED EMBODIMENTS

Descriptions will be given of embodiments of the invention in detail with reference to the drawings.

First Embodiment

Figure 1:
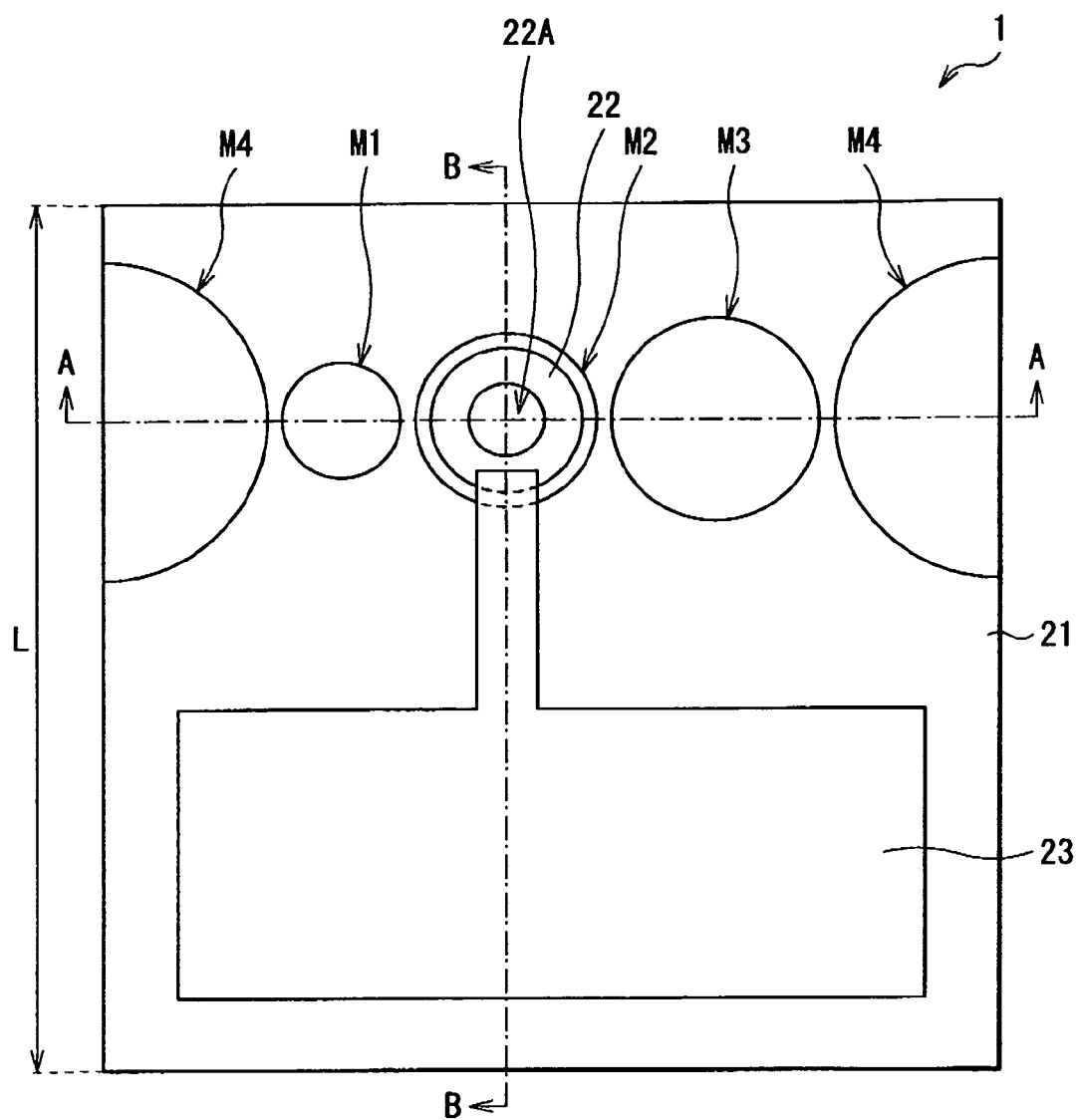
FIG. 1 is a top view of a semiconductor laser according to a first embodiment of the invention.
Figure 2:
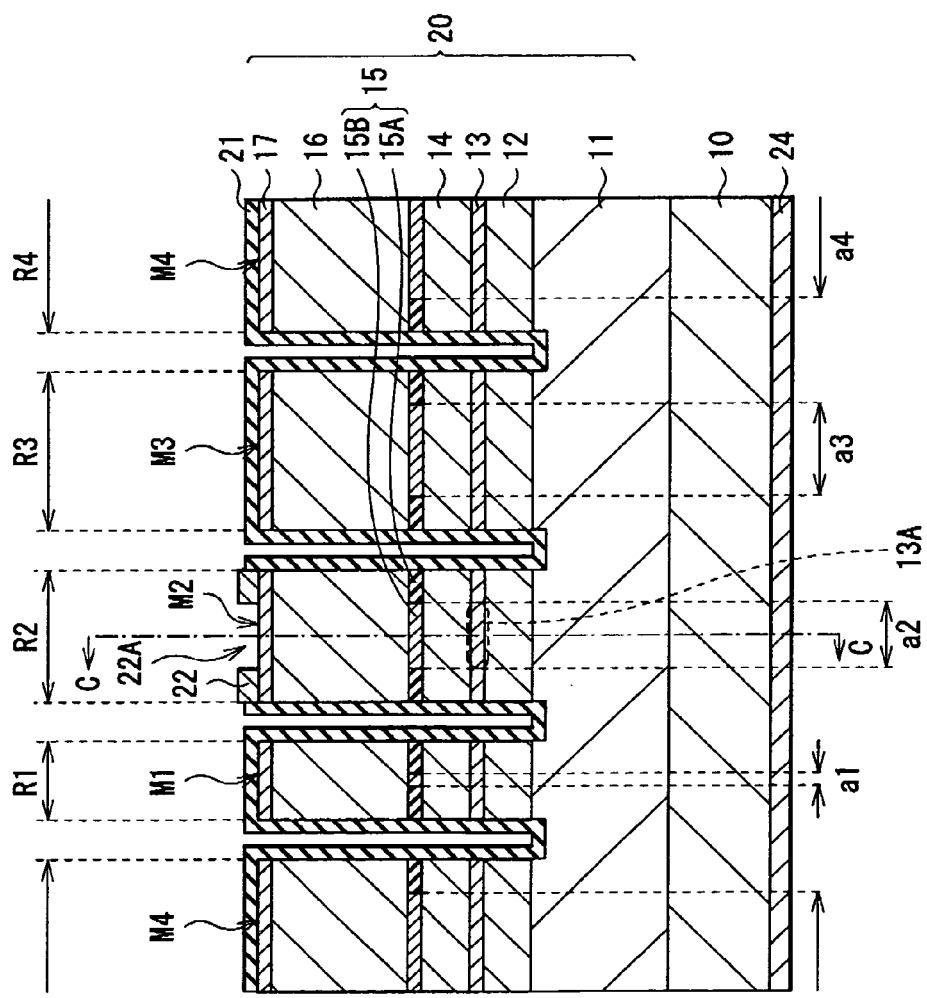
FIG. 2 is a view showing a cross sectional structure taken along the arrows A-A of the semiconductor laser of FIG. 1.
Figure 3:
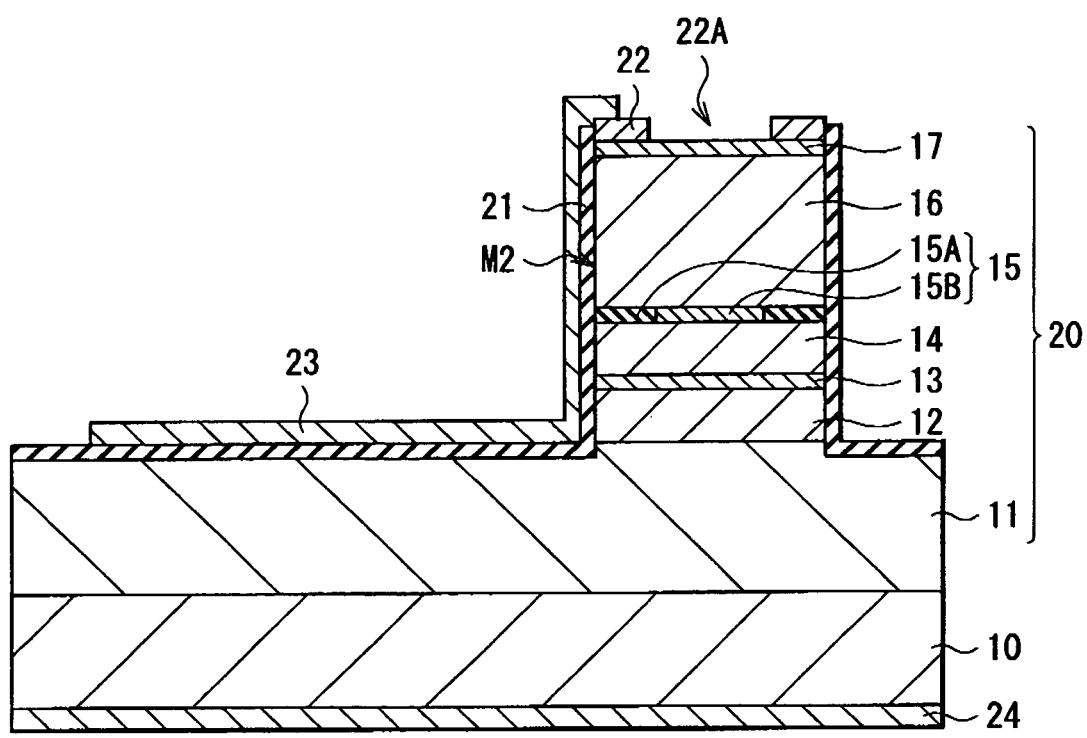
FIG. 3 is a view showing a cross sectional structure taken along the arrows B-B of the semiconductor laser of FIG. 1.

FIG. 1 shows a top view of a Vertical Cavity Surface Emitting Laser (VCSEL) 1 according to a first embodiment of the invention. FIG. 2 shows a cross sectional structure taken along the arrows A-A of the VCSEL 1 of FIG. 1. FIG. 3 shows a cross sectional structure taken along the arrows B-B of the VCSEL 1 of FIG. 1 or a cross sectional structure taken along the arrows C-C of VCSEL 1 of FIG. 2.

The VCSEL 1 includes four mesas M1 to M4 with the mesa diameters R1 to R4 different from each other, based on the mesa diameter as a parameter. The mesas M1 to M4 are formed in the chip area equal to that of an existing VCSEL.

Figure 4:
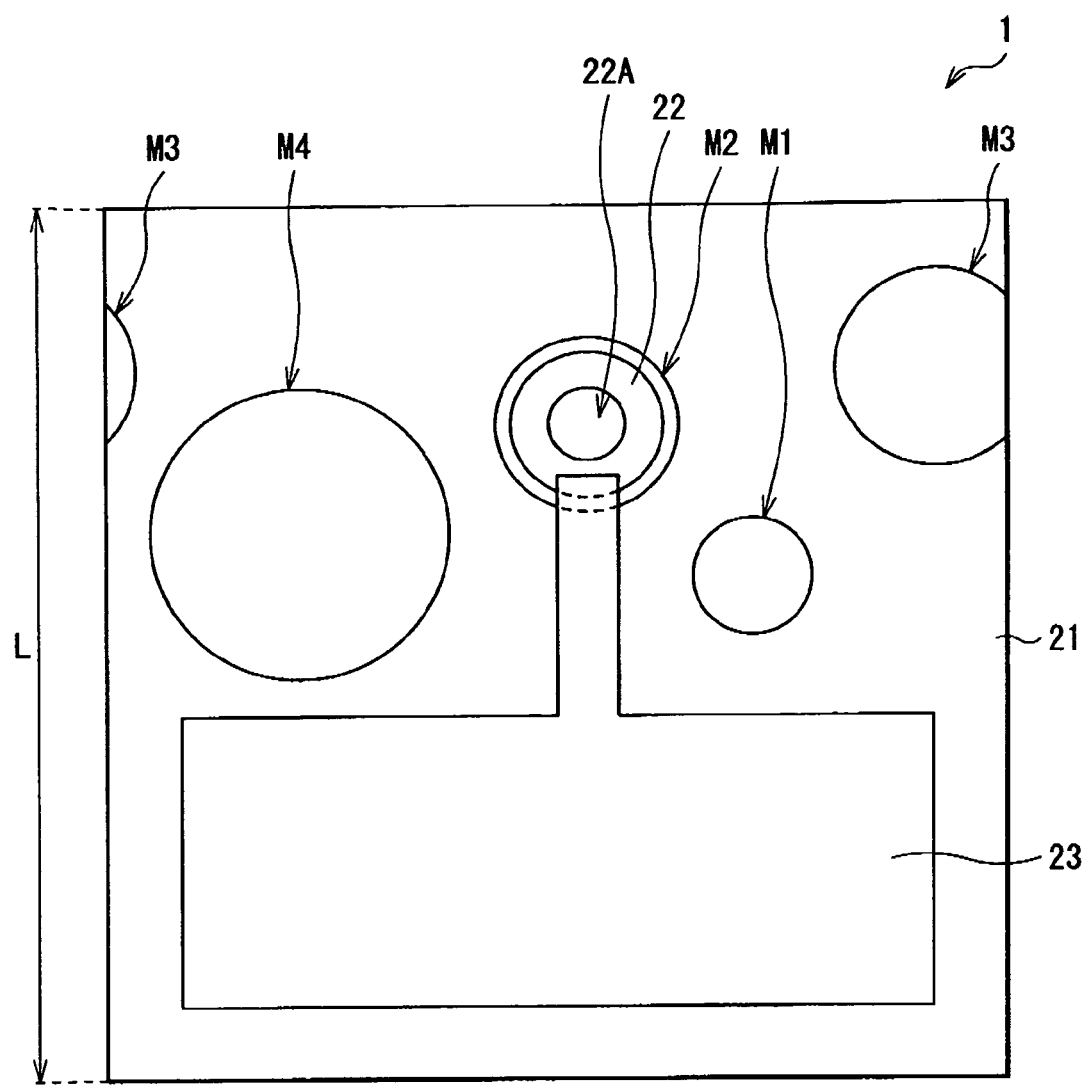
FIG. 4 is a top view showing a modification of the semiconductor laser of FIG. 1.

The chip area is generally defined by workability in handling the chip. For example, the chip area is about a square area (300 μm×300 μm) with the length L of one side of 300 μm. Further, it is enough that the mesas M1 to M4 are arranged in the chip so that at least the mesa M2 is not divided by dicing. For example, as shown in FIG. 1, the mesas M1 to M4 may be arranged in a line. Otherwise, as shown in FIG. 4, the mesas M1 to M4 may be arranged in zigzags. As a matter of convenience, descriptions will be given of a case that the mesas M1 to M4 are arranged in a line.

The VCSEL 1 includes a semiconductor layer 20 on one side of a substrate 10. The semiconductor layer 20 has a structure in which a lower DBR mirror layer 11, a lower cladding layer 12, an active layer 13, an upper cladding layer 14, a current confinement layer 15 (functional portion), an upper DBR mirror layer 16, and a contact layer 17 are layered in this order from the substrate 10 side. Of the semiconductor layer 20, in part of the lower DBR mirror layer 11, the lower cladding layer 12, the active layer 13, the upper cladding layer 14, the current confinement layer 15, the upper DBR mirror layer 16, and the contact layer 17, the mesas M1 to M4 are respectively formed by selectively etching from the contact layer 17 side to the part of the lower DBR mirror layer 11 as will be described later.

The substrate 10 is, for example, an n-type GaAs substrate. In the lower DBR mirror layer 11, a plurality of sets of a low-refractive index layer (not shown) and a high-refractive index layer (not shown) are layered. The low-refractive index layer is made of n-type $Al_{x1}Ga_{1-x1}As$ ($0<x1<1$) with the optical thickness of $\lambda/4$ ($\lambda$ is the oscillation wavelength), for example. The high-refractive index layer is made of n-type $Al_{x2}Ga_{1-x2}As$ ($0<x2<1$) with the optical thickness of $\lambda/4$, for example. As an n-type impurity, for example, silicon (Si), selenium (Se) or the like can be cited.

The lower cladding layer 12 is made of, for example, $Al_{x3}Ga_{1-x3}As$ ($0<x3<1$). The active layer 13 is made of, for example, a GaAs material. In the active layer 13, the region faces the portion of a non-oxidation region 15B (described later) formed in the mesa M2 is a light emitting region 13A. The upper cladding layer 16 is made of, for example, $Al_{x4}Ga_{1-x4}As$ ($0<x4<1$). The lower cladding layer 12, the active layer 13, and the upper cladding layer 14 desirably contain no impurity, but may contain a p-type impurity or an n-type impurity. As a p-type impurity, zinc (Zn), magnesium (Mg), beryllium (Be) or the like can be cited.

The current confinement layer 15 has an oxidation region 15A on each outer edge region of the mesas M1 to M4, and the non-oxidation region 15B in each central region of the mesas M1 to M4.

The non-oxidation region 15B is made of, for example, p-type $Al_{x5}Ga_{1-x5}As$ ($0<x5\leqq1$). As will be described later, an upper electrode 22 is formed on the top face of the mesa M2. Therefore, the portion of the non-oxidation region 15B formed in the mesa M2 functions as a current injection region to inject a current from the upper electrode 22 into the active layer 13. On the other hand, as will be described later, the mesas M1, M3, and M4 are covered with a protective film 21. Therefore, a current does not flow into the portion of the non-oxidation region 15B formed in the mesas M1, M3, and M4.

The oxidation region 15A contains $Al_2O_3$ (aluminum oxide). As will be described later, the oxidation region 15A is obtained by oxidizing high concentrated Al contained in an AlGaAs layer 15D (precursor oxidation confinement layer) from the side surface of the mesas M1 to M4. The AlGaAs layer 15D is made of a material that can be most easily oxidized out of the respective layers composing the semiconductor layer 20. The portion of the oxidation region 15A formed in the mesa M2 functions as a current confinement region that confines a current injected into the active layer 13, but the portion of the oxidation region 15A formed in the mesas M1, M3, and M4 has no current confinement function, since a current does not flow in the mesas M1, M3, and M4 as described above. That is, out of the mesas M1 to M4, only the mesa M2 functions as a laser, and the mesas M1, M3, and M4 do not function as a laser. However, the mesa M4 is divided by dicing. Therefore, the mesa M4 does not have an ability to oscillate laser originally.

In the upper DBR mirror layer 16, a plurality of sets of a low-refractive index layer (not shown) and a high-refractive index layer (not shown) are layered. The low-refractive index layer is made of p-type $Al_{x6}Ga_{1-x6}As$ ($0<x6<1$) with the optical thickness of $\lambda/4$, for example. The high-refractive index layer is made of p-type $Al_{x7}Ga_{1-x7}As$ ($0<x7<1$) with the optical thickness of $\lambda/4$, for example. The contact layer 17 is made of, for example, p-type GaAs.

The VCSEL 1 of this embodiment is further formed with the protective film 21 on the top face and the side face of the mesas M1, M3, and M4; on the side face of the mesa M2; and on the surface of the surrounding region of the mesas M1 to M4. Further, the circular upper electrode 22 is formed on the outer edge region of the top face (surface of the contact layer 17) of the mesa M2. The central region thereof, that is, the region corresponding to the foregoing non-oxidation region 15B is an aperture 22A. The upper electrode 22 is electrically connected to an electrode pad 23 formed on the surface of the protective film 21 at a location apart from the mesas M1 to M4. Further, a lower electrode 24 is formed on the rear face of the substrate 10.

The protective film 21 is made of an insulating material such as an oxide and a nitride. The protective film 21 insulates the electrode pad 23 from the lower DBR mirror layer 11/the side face of the mesa M2. In the upper electrode 22 and the electrode pad 23, for example, a titanium (Ti) layer, a platinum (Pt) layer, and a gold (Au) layer are layered in this order. The upper electrode 22 and the electrode pad 23 are electrically connected to the contact layer 17. The lower electrode 24 has a structure in which an alloy layer of gold (Au) and germanium (Ge), a nickel (Ni) layer, and a gold (Au) layer are sequentially layered from the substrate 10 side, and is electrically connected to the substrate 10.

In the VCSEL 1 of this embodiment, the respective mesas M1 to M4 are, for example, in the cylindrical shape. The diameters R1 to R4 of the respective mesas M1 to M4 are set by considering that the error $\pm\Delta y$ at the maximum is generated in the standard oxidation depth b obtained by multiplying the standard oxidation rate (described later) by oxidation time when the non-oxidation region 15B is formed by oxidizing the AlGaAs layer 15D of the respective mesas M1 to M4 in the oxidation step described later.

Figure 5:
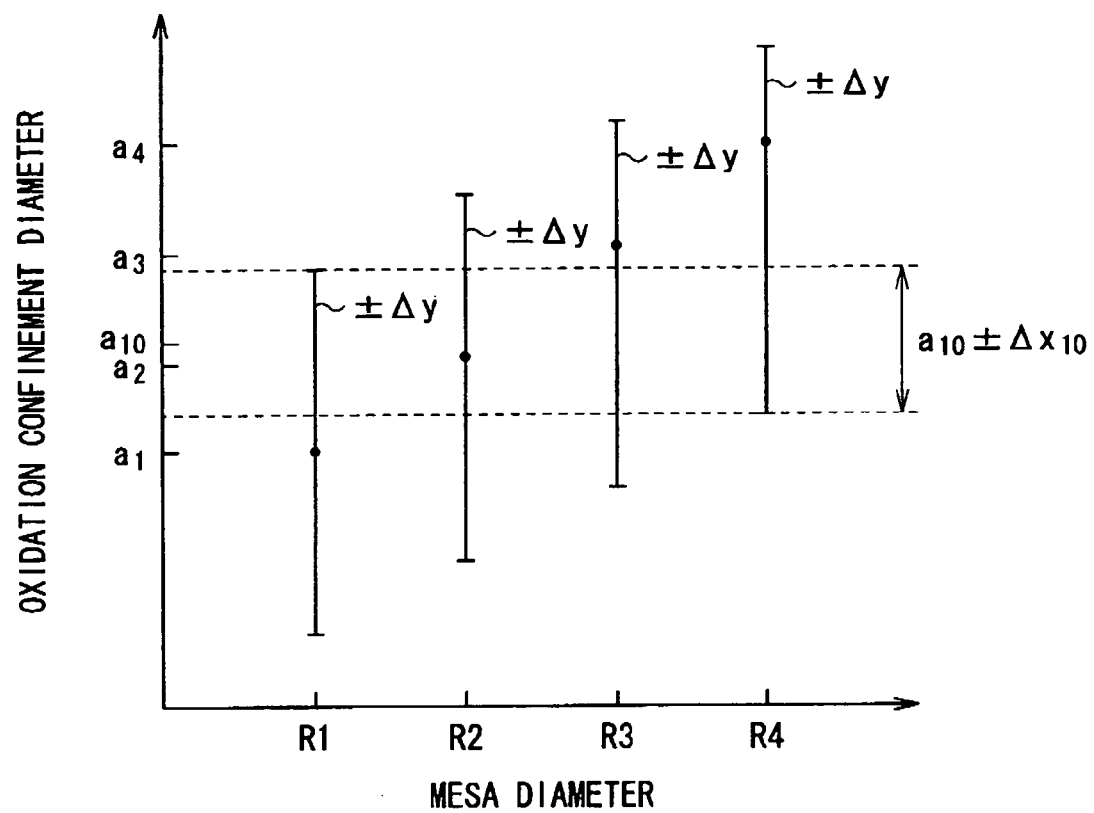
FIG. 5 is a relation diagram for explaining an example of a relation between a mesa diameter and an oxidation confinement diameter.

In general, the oxidation confinement diameter is strictly set as a value so that the laser characteristics necessary for a given purpose and usage are obtained. The precision necessary for the oxidation confinement diameter somewhat varies according to the purpose and usage. However, in general, it is often the case that such a precision is stricter than the error of the oxidation confinement diameter generated in the oxidation step. Therefore, in this embodiment, on the assumption that the oxidation depth b has the error $\pm\Delta y$ at the maximum, for example, as shown in FIG. 5, the diameters R1 to R4 of the respective mesas M1 to M4 are set so that at least one oxidation confinement diameter of the respective mesas M1 to M4 corresponds with the tolerance ($a_{10}\pm\Delta x_{10}$) necessary for the oxidation confinement diameter in a given purpose and usage. For example, when $a_{10}$ is 9.5 μm, $\Delta x_{10}$ is about 0.5 μm, and $\Delta y$ is about 2 μm, the diameter R1 of the mesa M1 is set to, for example, 28 μm ($=a_{10}+\Delta x_{10}+b-\Delta y$), the diameter R2 of the mesa M2 is set to, for example, 29 μm ($=R1+2\Delta x_{10}$), the diameter R3 of the mesa M3 is set to, for example, 30 μm ($=R2+2\Delta x_{10}=R4-2\Delta x_{10}$), and the diameter R4 of the mesa M4 is set to, for example, 31 μm ($=a_{10}-\Delta x_{10}+b+\Delta y$). Thereby, when the oxidation depth b is 20 μm±$\Delta y$ or less, at least one of the oxidation confinement diameters $a_1$ to $a_4$ surely corresponds with the given criterion ($a_{10}\pm\Delta x_{10}$).

Figure 6:
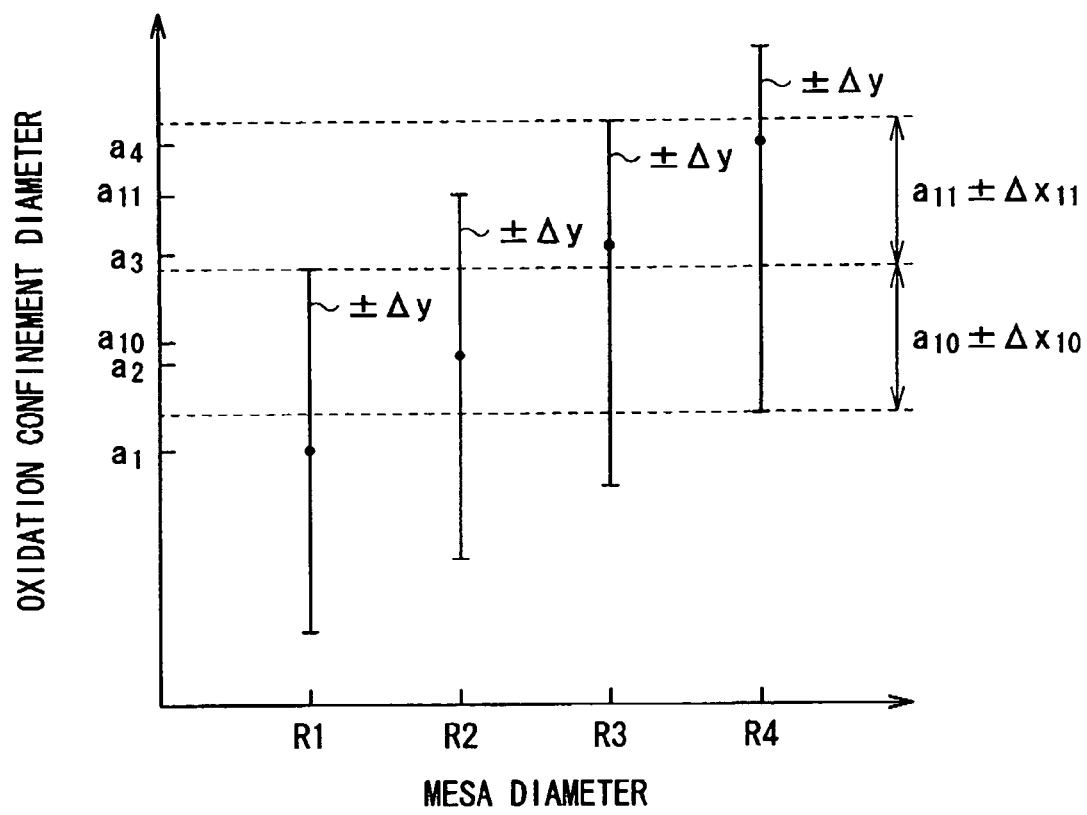
FIG. 6 is a relation diagram for explaining another example of a relation between the mesa diameter and the oxidation confinement diameter.

Further, for example, when a plurality of criteria adjacent to each other are provided, on the assumption that the oxidation depth b has the error $\pm\Delta y$ at the maximum, for example, as shown in FIG. 6, the diameters R1 to R4 of the respective mesas M1 to M4 are set so that at least one oxidation confinement diameter of the respective mesas M1 to M4 corresponds with one of tolerances ($a_{10}\pm\Delta x_{10}$ and $a_{11}\pm\Delta x_{11}$) necessary for the oxidation confinement diameter in a given purpose and usage. Thereby, when the error of the oxidation depth b is $\pm\Delta y$ or less, at least one of the oxidation confinement diameters $a_1$ to $a_4$ surely corresponds with one of the plurality of criteria ($a_{10}\pm\Delta x_{10}$ and $a_{11}\pm\Delta x_{11}$).

Figure 7:
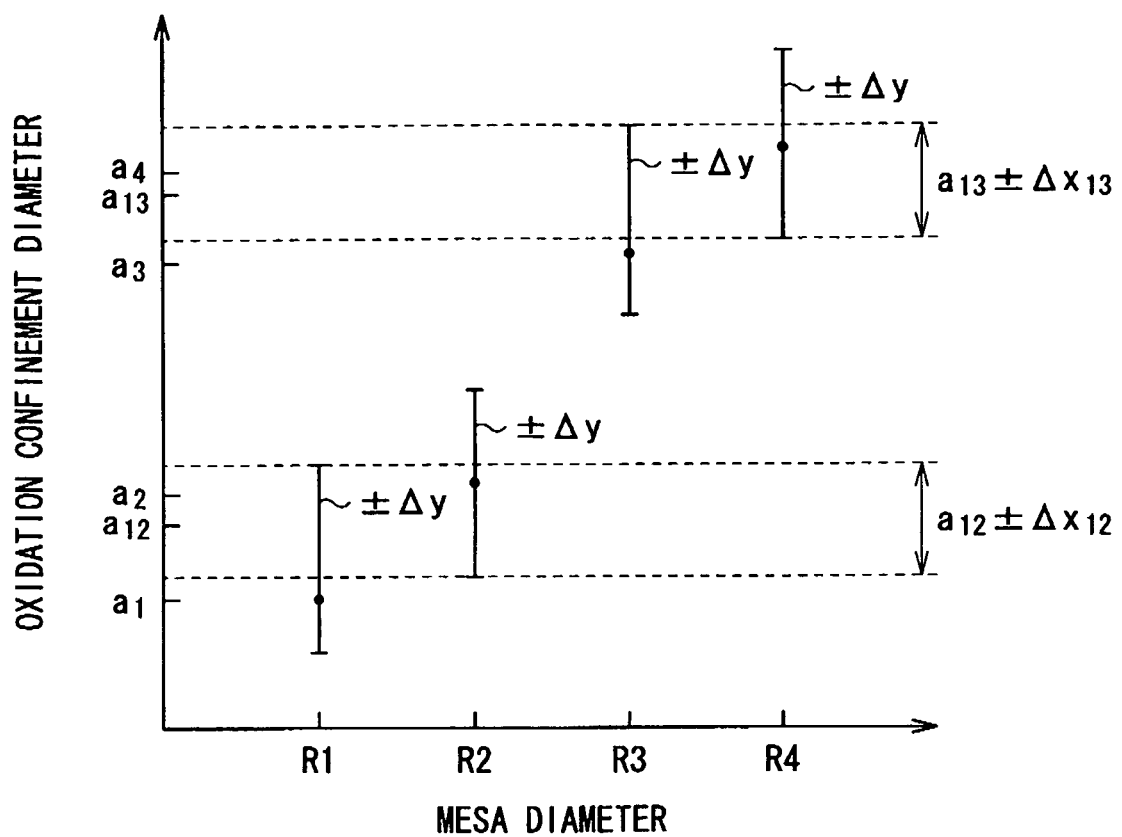
FIG. 7 is a relation diagram for explaining still another example of a relation between the mesa diameter and the oxidation confinement diameter.

Further, for example, when a plurality of criteria not adjacent to each other are provided, on the assumption that the oxidation depth b has the error $\pm\Delta y$ at the maximum, for example, as shown in FIG. 7, the diameters R1 to R4 of the respective mesas M1 to M4 are set so that at least one oxidation confinement diameter of the respective mesas M1 to M4 corresponds with a tolerance ($a_{12}\pm\Delta x_{12}$) necessary for the oxidation confinement diameter in a given purpose and usage, and at least one oxidation confinement diameter of the respective mesas M1 to M4 corresponds with a tolerance ($a_{13}\pm\Delta x_{13}$) necessary for the oxidation confinement diameter in a given purpose and usage. Thereby, when the error of the oxidation depth b is $\pm\Delta y$ or less, at least one of the oxidation confinement diameters $a_1$ to $a_4$ surely corresponds with one criterion ($a_{12}\pm\Delta x_{12}$), and at least one of the oxidation confinement diameters $a_1$ to $a_4$ surely corresponds with the other criterion ($a_{13}\pm\Delta x_{13}$).

Though described later in detail, in the VCSEL 1 of this embodiment, in the result that the mesa M2 is selected as a mesa having the oxidation confinement diameter corresponding with a given criterion in a measurement and evaluation step, the upper electrode 22 is formed on the top face of the mesa M2, and the electrode pad 23 is electrically connected to the upper electrode 22.

In the VCSEL 1 having the foregoing structure, when a given voltage is applied between the upper electrode 22 and the lower electrode 24, a current is injected into the active layer 13 through the portion of the non-oxidation region 15B formed in the mesa M2. Thereby, light is emitted due to electron-hole recombination. Such light is reflected by the pair of the lower DBR mirror layer 11 and the upper DBR mirror layer 16. Laser oscillation is generated at a given wavelength. Then, the light is emitted as a laser beam outside from the aperture 22A.

The VCSEL 1 according to this embodiment can be manufactured, for example, as follows.

Figure 8:
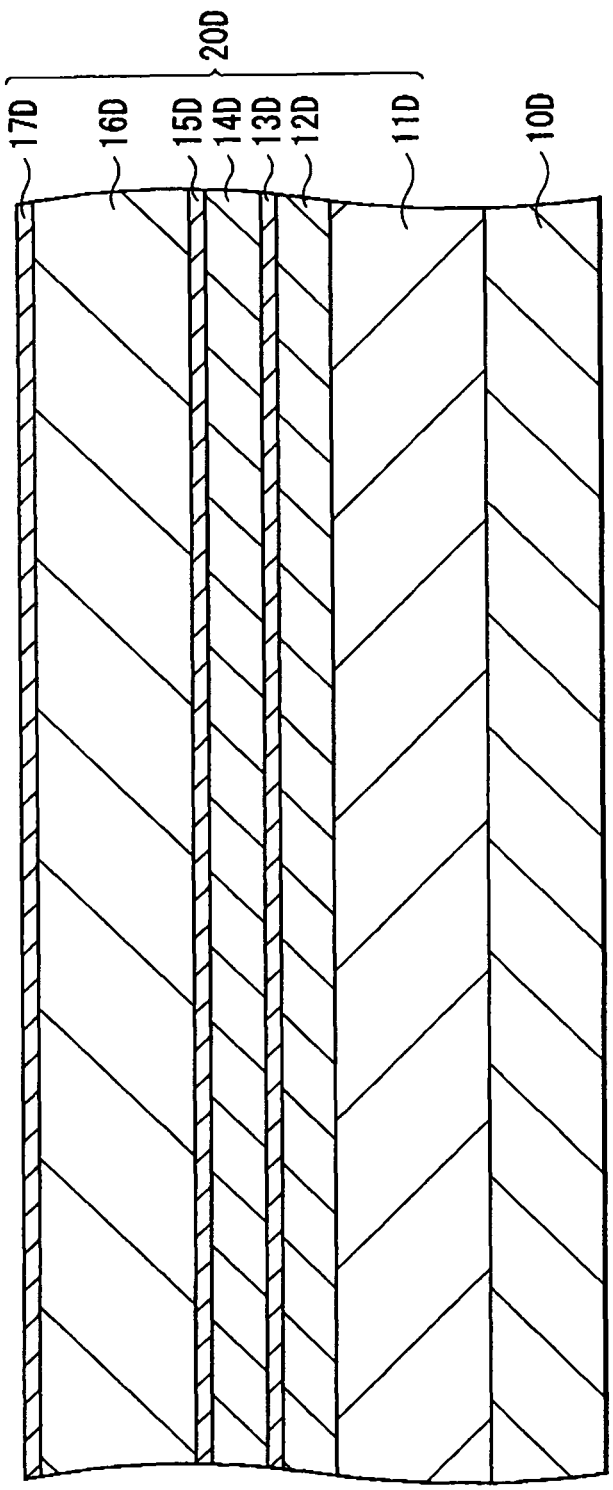
FIG. 8 is a cross section for explaining a manufacturing process of the semiconductor laser of FIG. 1.
Figure 9:
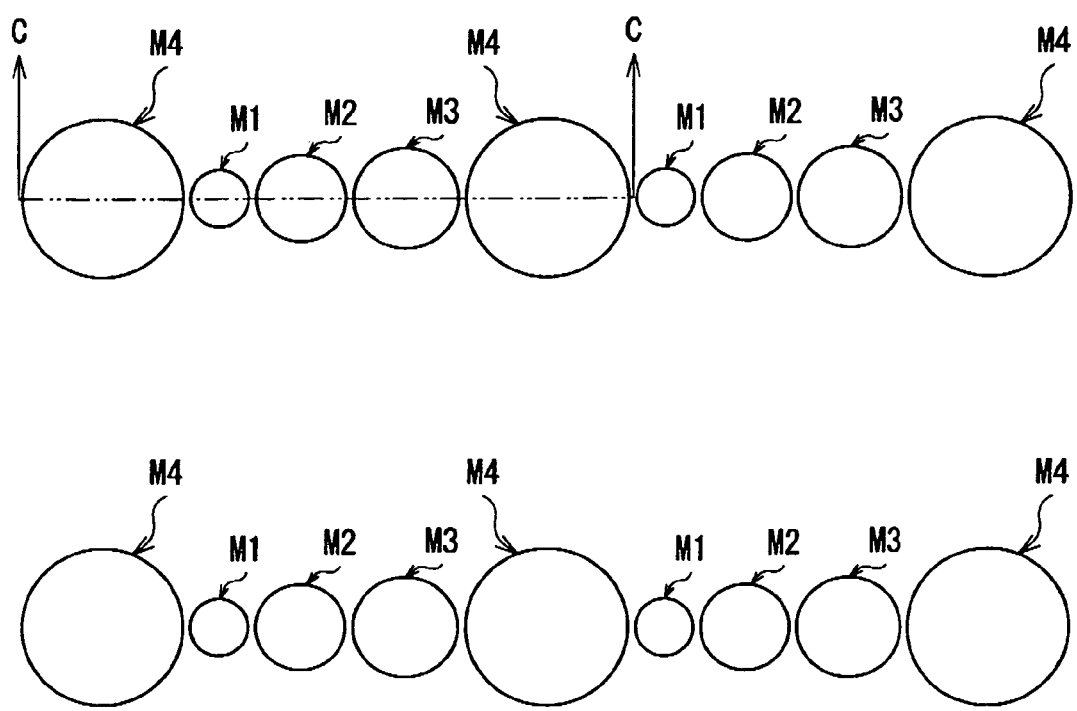
FIG. 9 is a top view for explaining a step following FIG. 8.
Figure 10:
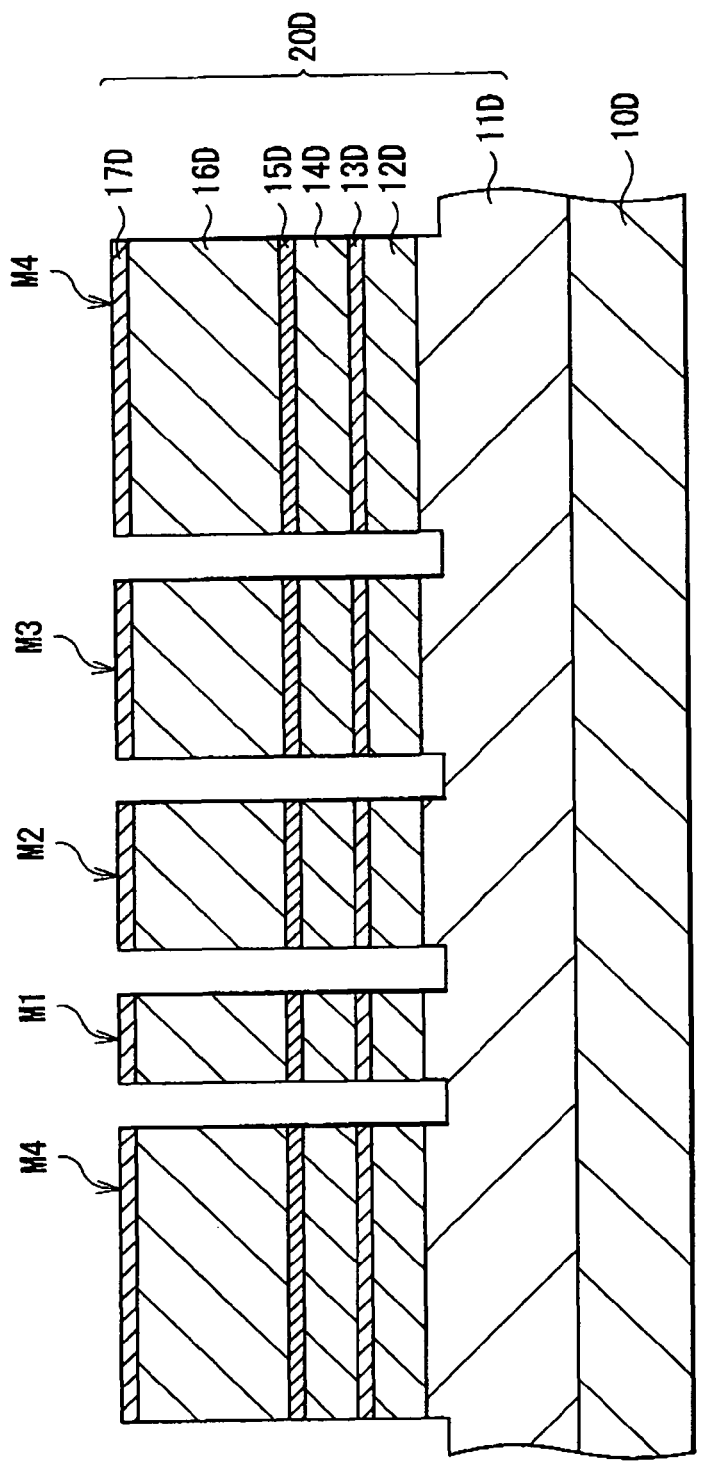
FIG. 10 is a view showing a cross sectional structure taken along the arrows C-C of FIG. 9.
Figure 12:
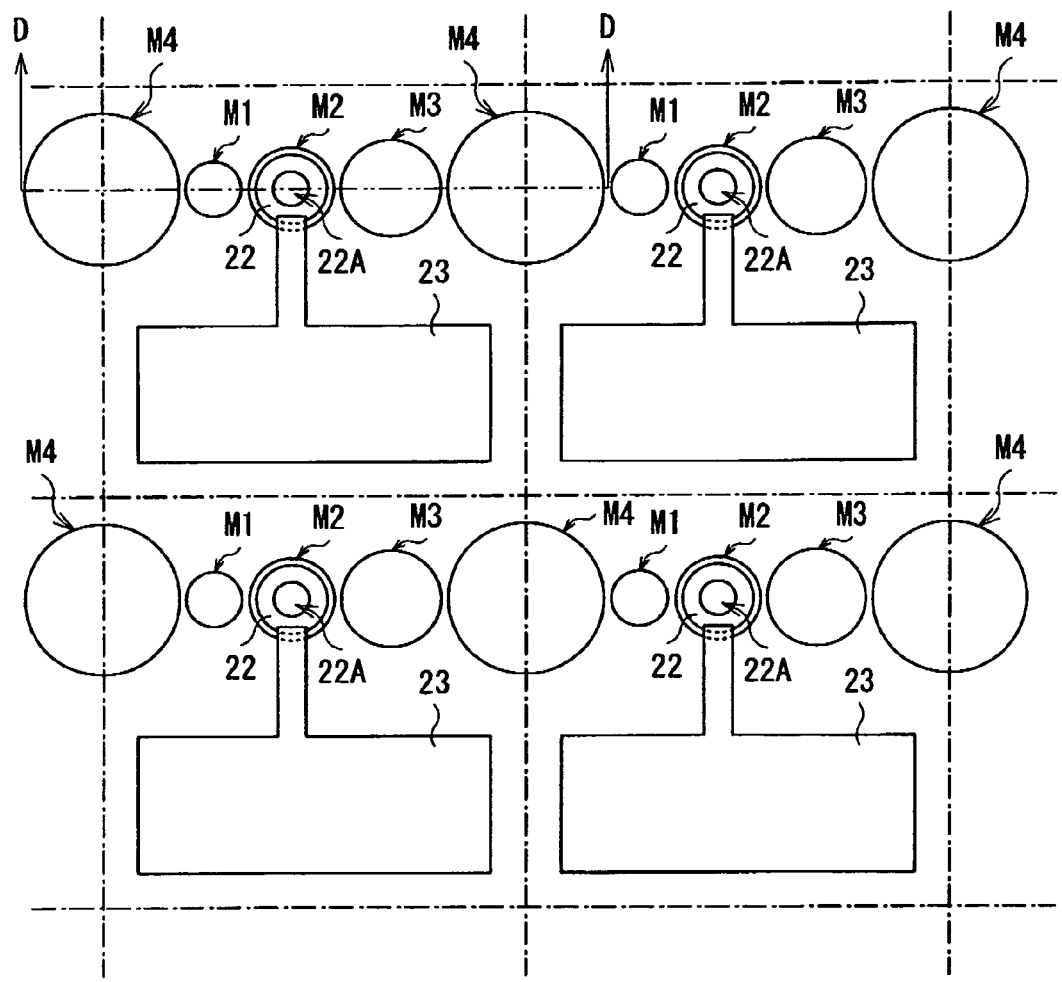
FIG. 12 is a top view for explaining a step following FIGS. 11A and 11B.
Figure 13:
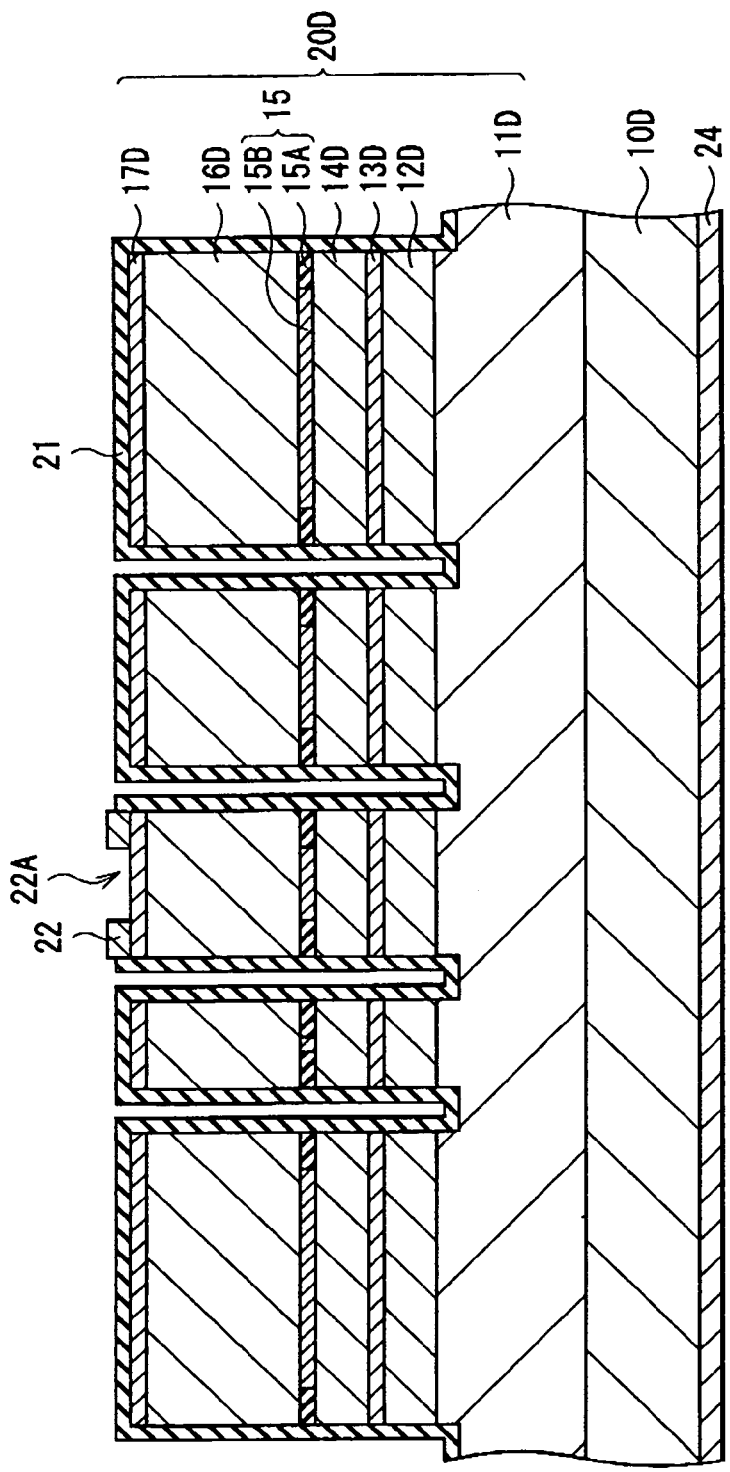
FIG. 13 is a view showing a cross sectional structure taken along the arrows D-D of FIG. 12.

FIG. 8 to FIG. 13 show a method of manufacturing the VCSEL 1 in the order of steps. FIG. 8 shows a cross sectional structure of part of the wafer in process of manufacturing. FIG. 9 shows part of the wafer surface in process of manufacturing. FIG. 10 is a cross sectional structure taken along the arrows C-C of FIG. 9. FIG. 11A shows a cross sectional structure when the wafer of FIG. 10 is provided with oxidation treatment. FIG. 11B shows part of the wafer surface of FIG. 11A. FIG. 12 shows a top face structure when the upper electrode 22 is formed on the wafer of FIG. 11B. FIG. 13 shows a cross sectional structure taken along the arrows D-D of FIG. 12. The dashed lines in FIG. 12 show the dicing location where the wafer is divided into small chips.

Here, a semiconductor layer 20D on a semiconductor layer 10D made of GaAs is formed by MOCVD (Metal Organic Chemical Vapor Deposition) method, for example. As a raw material of Group III-V compound semiconductor, for example, trimethyl aluminum (TMA), trimethyl gallium (TMG), trimethyl indium (TMIn), or arsine ($AsH_3$) is used. As a raw material of a donor impurity, for example, $H_2Se$ is used. As a raw material of an acceptor impurity, for example, dimethyl zinc (DMZ) is used. The symbol "D" at the end of the "substrate 10D" means that forming the substrate 10 of the VCSEL 1 is in the middle of process. The symbol "D" at the end of other elements has the same meaning.

Formation Step

First, a lower DBR mirror layer 11D, a lower cladding layer 12D, an active layer 13D, an upper cladding layer 14D, an AlGaAs layer 15D (precursor current confinement layer), an upper DBR mirror layer 16D, and a contact layer 17D are layered over the substrate 10D in this order (FIG. 8). Subsequently, part of the lower DBR mirror layer 11D, the lower cladding layer 12D, the active layer 13D, the upper cladding layer 14D, the AlGaAs layer 15D, the upper DBR mirror layer 16D, and the contact layer 17D are selectively etched, and thereby the four mesas M1 to M4 with the mesa diameters R1 to R4 different from each other are formed for every unit chip area (FIG. 9 and FIG. 10). Thereby, the AlGaAs layer 15D is exposed on the end face of the respective mesas M1 to M4.

The unit chip area means an area occupied by one chip when one wafer is divided into small chips by dicing. The unit chip area of this embodiment is an area equal to that of an existing VCSEL, and, for example, is an area of about 300 μm×300 μm. Therefore, in this embodiment, compared to the case that only one mesa is formed for every unit chip area (refer to FIG. 25), the number of mesas per unit chip area is quadruple.

Next, oxidation treatment is performed at a high temperature in the water vapor atmosphere to selectively oxidize Al of the AlGaAs layer 15D from the side face of the respective mesas M1 to M4 (FIGS. 11A and 11B). Thereby, the outer edge region of the respective mesas M1 to M4 of the AlGaAs layer 15D becomes the oxidation region 15A containing $Al_2O_3$ (aluminum oxide), and the central region of the respective mesas M1 to M4 becomes the non-oxidation region 15B. Thereby, the current confinement layer 15 is formed.

At this time, the oxidation time is controlled based on the standard oxidation rate of the AlGaAs layer 15D estimated by the thickness of the AlGaAs layer 15D, the impurity concentration or the like, as well as the temperature of the substrate 10D and the supply flow rate of reactive gas. Thereby, the error of $a_1$ to $a_4$ of the diameter of the non-oxidation region 15B of the respective mesas M1 to M4 (oxidation confinement diameter) is decreased as much as possible.

Measurement and Evaluation Step

Next, the top face of the respective mesas M1 to M4 is observed by, for example, an optical microscope. The oxidation confinement diameters $a_1$ to $a_4$ of the respective mesas M1 to M4 are measured, and what oxidation confinement diameter out of $a_1$ to $a_4$ corresponds with a given criterion is evaluated. By measuring the oxidation confinement diameters $a_1$ to $a_4$ and comparing the measurement value to the given criterion, the laser characteristics of the respective mesas M1 to M4 can be estimated indirectly.

In the result of the evaluation, the following can be found, for example. That is, in the case of FIG. 5, the oxidation confinement diameter $a_2$ of the mesa M2 corresponds with the given criterion ($a_{10} \pm \Delta x_{10}$). In the case of FIG. 6, the oxidation confinement diameter $a_2$ of the mesa M2 corresponds with the given criterion ($a_{10} \pm \Delta x_{10}$), and the oxidation confinement diameter $a_3$ of the mesa M3 and the oxidation confinement diameter $a_4$ of the mesa M4 correspond with the given criterion ($a_{11} \pm \Delta x_{11}$). In the case of FIG. 7, the oxidation confinement diameter $a_2$ of the mesa M2 corresponds with the given criterion ($a_{12} \pm \Delta x_{12}$), and the oxidation confinement diameter $a_4$ of the mesa M4 corresponds with the given criterion ($a_{13} \pm \Delta x_{13}$). Thereby, in the case of FIG. 5, the mesa M2 can be selected according to the purpose and the usage. In the case of FIG. 6, the mesas M2 to M4 can be selected according to the purpose and the usage. In the case of FIG. 7, the mesas M2 and M4 can be selected according to the purpose and the usage. Here, the mesa M2 is selected as a matter of convenience.

Next, the protective film 21 having an aperture on the top face of the selected mesa M2 is formed. After that, the upper electrode 22 having the aperture 22A is formed on the top face of the mesa M2 (FIG. 12 and FIG. 13). Further, the electrode pad 23 electrically connected to the upper electrode 22 is formed on the protective film 21 at a location apart from the mesas M1 to M4. The lower electrode 24 is formed on the rear face side of the substrate 10.

Dividing Step

Finally, the wafer is divided into chips by dicing in the location of, for example, the dashed lines of FIG. 12 so that at least the mesa M2 is not broken (divided). As above, the VCSEL 1 of this embodiment is manufactured.

As described above, it is often the case that the error of the oxidation confinement diameter generated in the oxidation step is larger than the precision necessary for the oxidation confinement diameter. Therefore, when one mesa with the identical mesa diameter is formed for every unit chip area of one wafer, there is a possibility that no chip having the oxidation confinement diameter corresponding with a given criterion is able to be obtained from one wafer.

Figure 43:
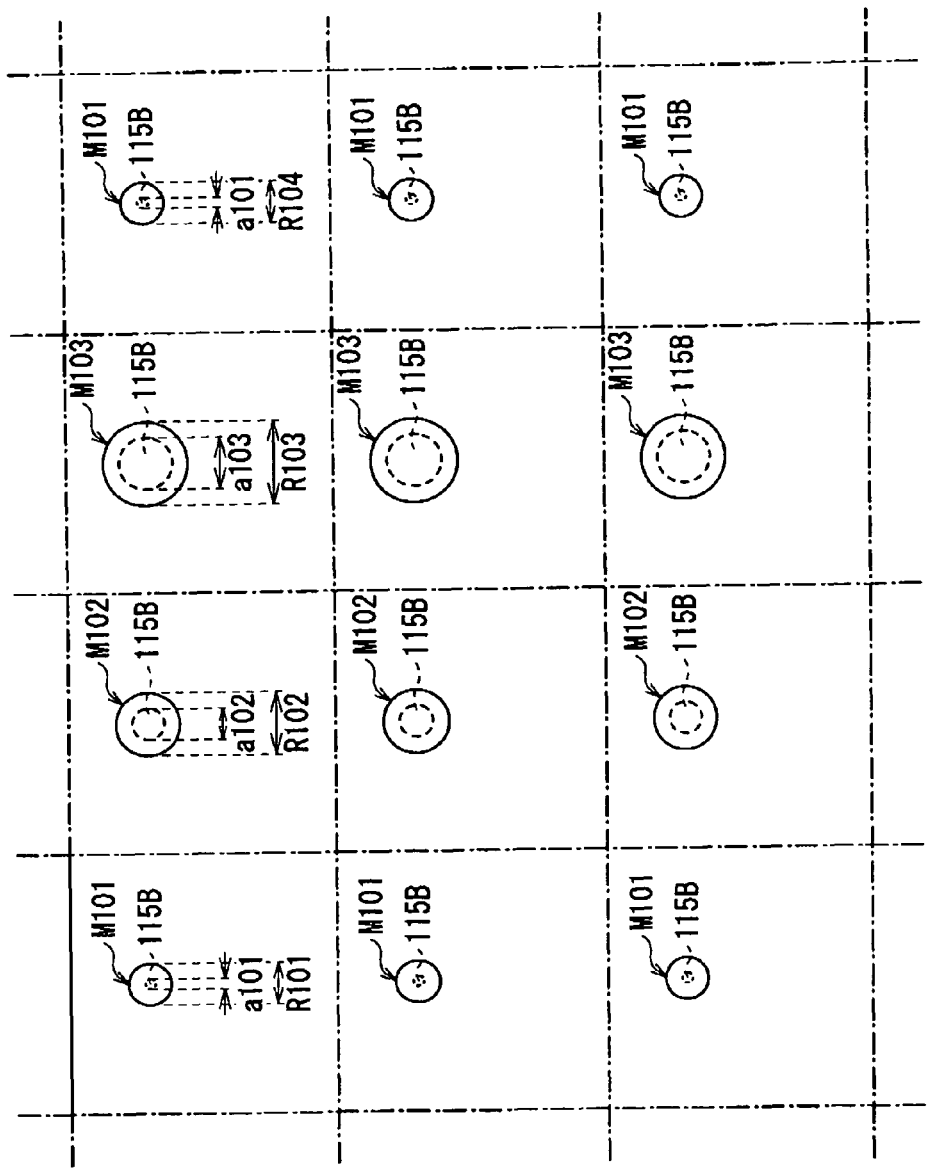
FIG. 43 is a top view for explaining a manufacturing step of a semiconductor laser of a related art.
Figure 44:
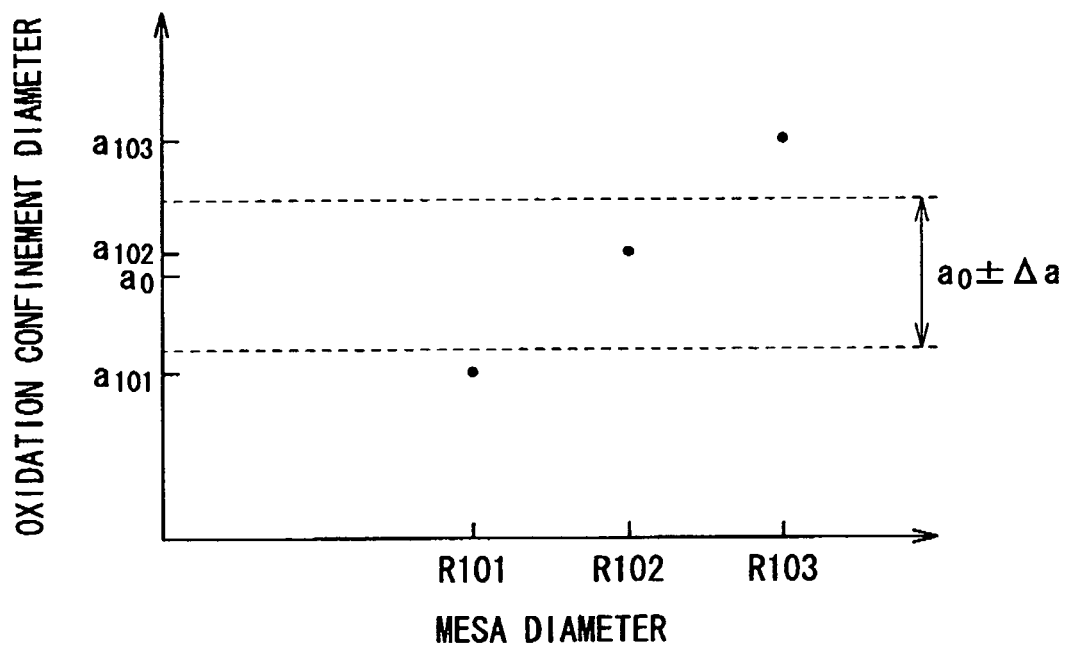
FIG. 44 is a relation diagram for explaining still another example of a relation between the mesa diameter and the oxidation confinement diameter.

Therefore, the following method can be cited. That is, as shown in FIG. 43, each of the plurality of mesas M101 to M103 with the mesa diameters R101 to R103 different from each other is formed for every unit chip area of one wafer, the AlAs layer (not shown) included therein is oxidized to form the non-oxidation region 115B with the oxidation confinement diameters $a_{101}$ to $a_{103}$ different from each other is formed. In this case, it may be possible that in one mesa of the plurality of mesas M101 to M103, the non-oxidation region 115B having the oxidation confinement diameter corresponding with a given criterion ($a_0 \pm \Delta a$) (refer to FIG. 44) is formed. However, chips having the oxidation confinement diameter not corresponding with the given criterion are naturally disposed. Therefore, the larger the number of types of mesa diameters is, the larger the ratio of the chips disposed is, leading to the decreased yield.

Meanwhile, in this embodiment, the diameters R1 to R4 of the respective mesas M1 to M4 are respectively set so that at least one oxidation confinement diameter of the respective mesas M1 to M4 surely corresponds with a given criterion. Thereby, even when the error of the oxidation confinement diameters $a_1$ to $a_4$ generated in the oxidation step is larger than the precision necessary for the oxidation confinement diameter, at least one mesa corresponding with the given criterion can be surely formed for every unit chip area. In the result, the waste such as disposing chips with a mesa not corresponding with a given criterion is not incurred, leading to largely increased yield.

Second Embodiment

In a VCSEL 2 of this embodiment, the diameters R1 to R4 of the respective mesas M1 to M4 are respectively set so that at least one oxidation confinement diameter of the respective mesas M1 to M4 surely corresponds with a given criterion. In this regard, the VCSEL 2 has a structure common to that of the VCSEL 1 of the foregoing first embodiment. However, the measurement and evaluation method of this embodiment are different from the measurement and evaluation method of the foregoing first embodiment in the following point. That is, in this embodiment, the VCSEL 2 is formed until laser oscillation is enabled in the respective mesas M1 to M4. After that, a current is injected into the respective mesas M1 to M4. Then, the laser characteristics of the respective mesas M1 to M4 are measured, and evaluation is made whether or not the measurement value corresponds with a given criterion. Further, the criterion in this embodiment is for the tolerance of one or a plurality of laser characteristics, and is different from the criterion (tolerance of the oxidation confinement diameter) in the foregoing first embodiment.

Therefore, a description will be hereinafter mainly given of points different from those in the foregoing first embodiment. Descriptions of the structure, operation, effects common to those of the foregoing first embodiment are omitted as appropriate.

Figure 14:
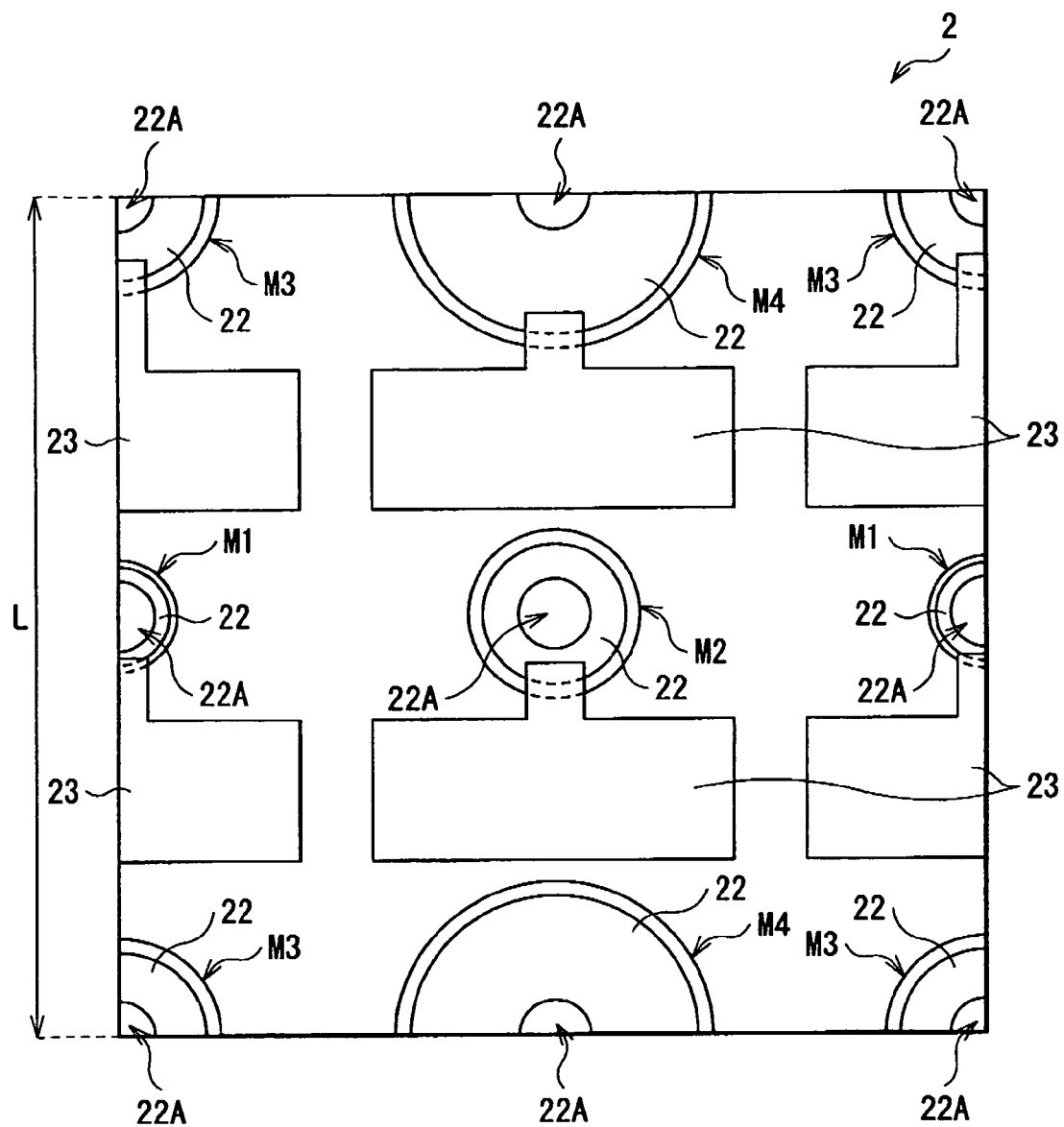
FIG. 14 is a top view of a semiconductor laser according to a second embodiment of the invention.

FIG. 14 shows a top face structure of the VCSEL 2 of this embodiment. In the VCSEL 2, the upper electrode 22 having the aperture 22A is formed on the top face of the respective mesas M1 to M4, and the electrode pad 23 is formed separately for every upper electrode 22 of the respective mesas M1 to M4. In the same manner as in the foregoing first embodiment, four mesas M1 to M4 are formed in the chip area equal to that of an existing VCSEL. The respective mesas M1 to M4 are arranged, for example, in a lattice shape in the chip. The mesa M2 is arranged in a location, for example, in the center of the chip, so that the mesa M2 is not divided by dicing. The mesa M1 is arranged, for example, in the vicinity of a pair of end faces sandwiching the mesa M2, and is divided by dicing. The mesa M3 is arranged, for example, in the vicinity of four corners, and is divided by dicing. The mesa M4 is arranged, for example, in the vicinity of a pair of end faces different from the pair of end faces sandwiching the mesa M2, and is divided by dicing. Therefore, only the mesa M2 out of the mesas M1 to M4 functions as a laser, and the mesas M1, M3 and M4 do not function as a laser.

Figure 15:
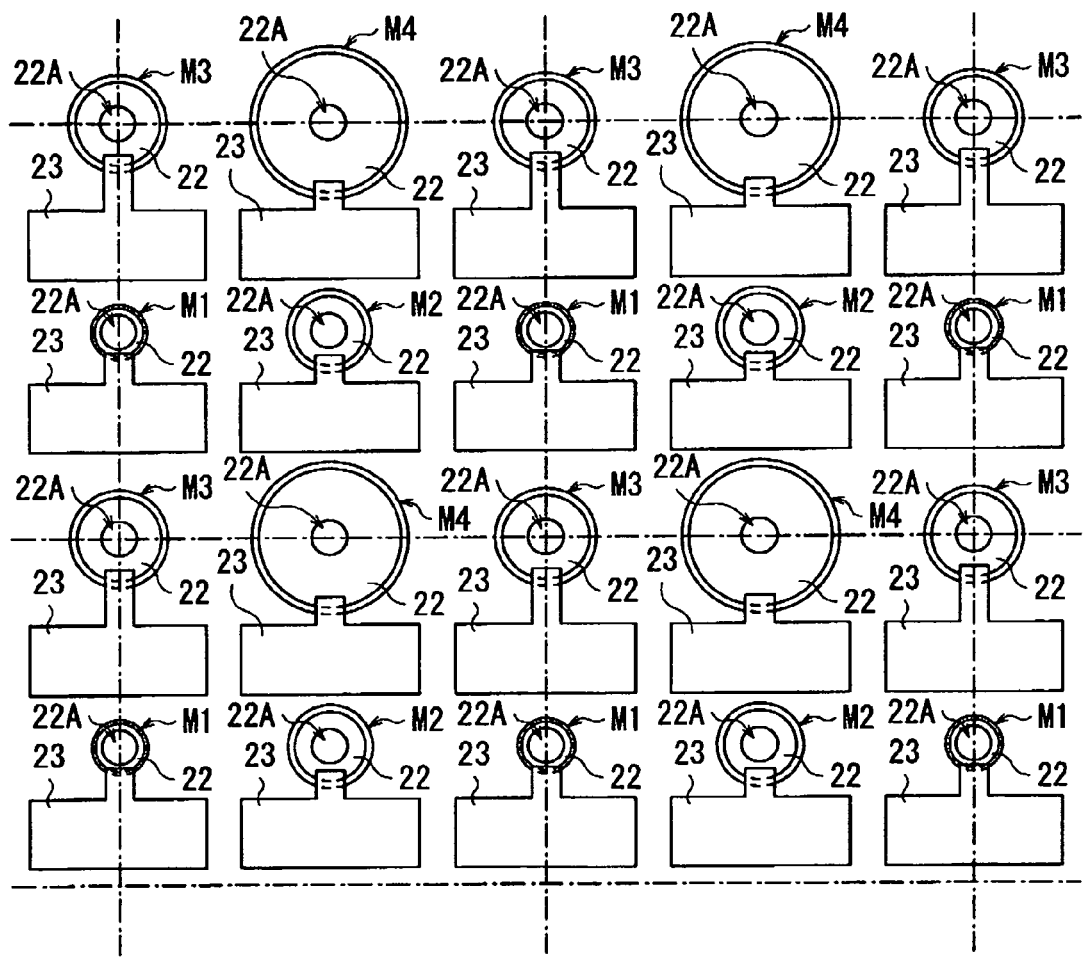
FIG. 15 is a top view for explaining a manufacturing process of the semiconductor laser of FIG. 14.

FIG. 15 shows part of the wafer surface in manufacturing process. Four mesas M1 to M4 are formed for every unit chip area. The upper electrode 22 having the aperture 22A is formed on the top face of the respective mesas M1 to M4, and the electrode pad 23 is formed separately for every upper electrode 22 of the respective mesas M1 to M4. Though not shown, the lower electrode 24 is formed on the rear face side of the substrate 10. That is, in the wafer surface, the respective mesas M1 to M4 can oscillate laser.

Measurement and Evaluation Step

After the wafer is formed so that the respective mesas M1 to M4 can oscillate laser, a voltage is applied between the upper electrode 22 of the respective mesas M1 to M4 and the lower electrode 24 to oscillate laser in the respective mesas M1 to M4 and to emit laser light from each aperture 22A. At this time, the laser characteristics of the respective mesas M1 to M4 are measured as follows. For example, the characteristics of the laser light emitted from each aperture 22A (for example, light output and NFP) are measured, and the threshold value current of the respective mesas M1 to M4 is measured. Evaluation is made whether or not the measurement value corresponds with a given criterion set according to a given purpose and usage. That is, in this embodiment, the laser characteristics of the respective mesas M1 to M4 are not estimated indirectly by comparing the measurement value of the oxidation confinement diameter to the given criterion as in the foregoing first embodiment. In this embodiment, the laser characteristics of the respective mesas M1 to M4 are directly evaluated. Thereby, the mesa having the laser characteristics that match with a given purpose and usage can be selected with a higher precision than the evaluation method in the foregoing first embodiment. In this embodiment, as the result of evaluation, the mesa M2 is selected as a matter of convenience.

Dividing Step

Finally, the wafer is divided into chips by dicing in the location of, for example, the dashed lines of FIG. 15, so that at least the selected mesa M2 is not broken (divided). As above, the VCSEL 2 of this embodiment is manufactured.

In the VCSEL 2 of this embodiment, in the same manner as in the foregoing embodiment, the diameters R1 to R4 of the respective mesas M1 to M4 are respectively set so that at least one oxidation confinement diameter of the respective mesas M1 to M4 surely corresponds with a given criterion. Thereby, even when the error of the oxidation confinement diameters $a_1$ to $a_4$ generated in the oxidation step is larger than the precision necessary for the oxidation confinement diameter, at least one mesa corresponding to the given criterion can be surely formed for every unit chip area. In the result, the waste such as disposing chips with a mesa not corresponding with a given criterion is not incurred, leading to largely increased yield.

Modification of Second Embodiment

Figure 16:
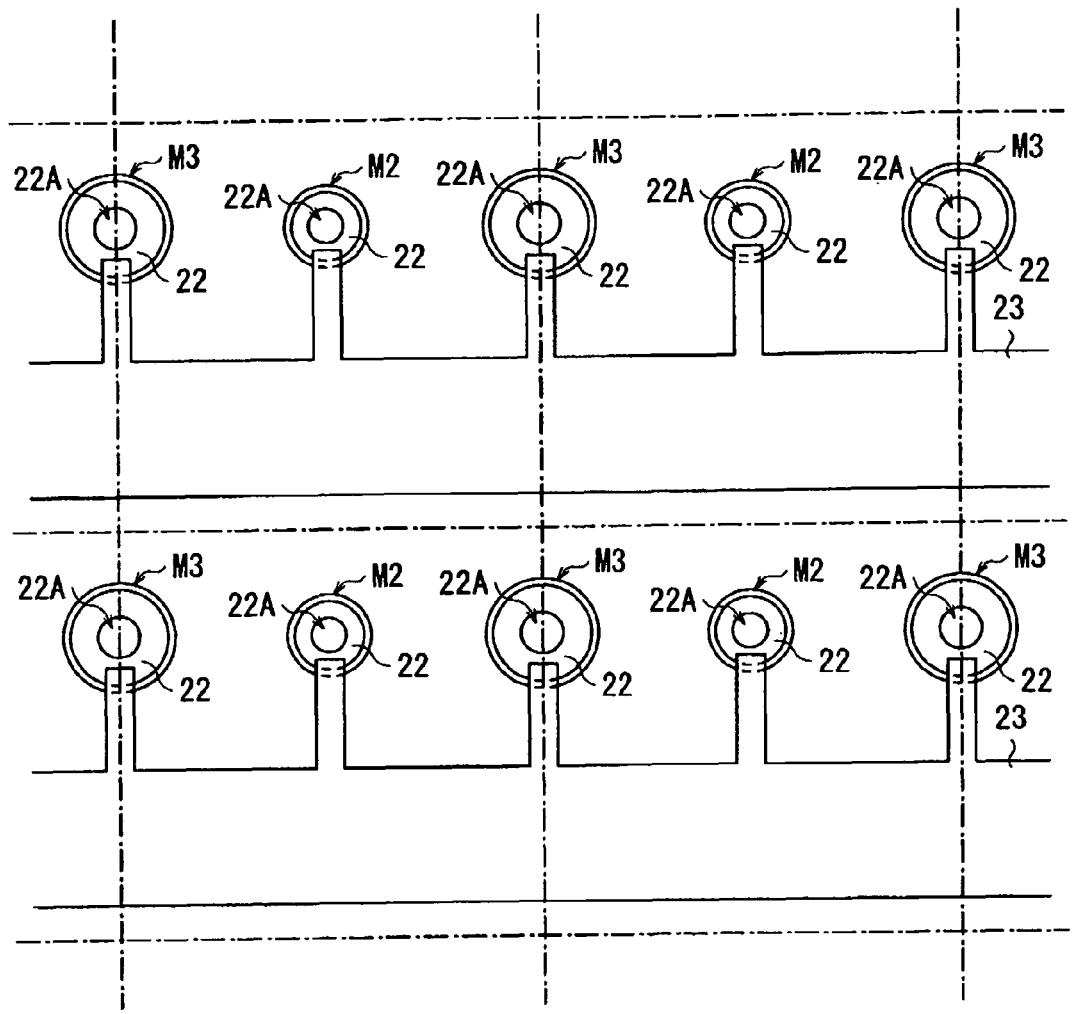
FIG. 16 is a top view for explaining a manufacturing process of a semiconductor laser of FIG. 18.
Figure 17:
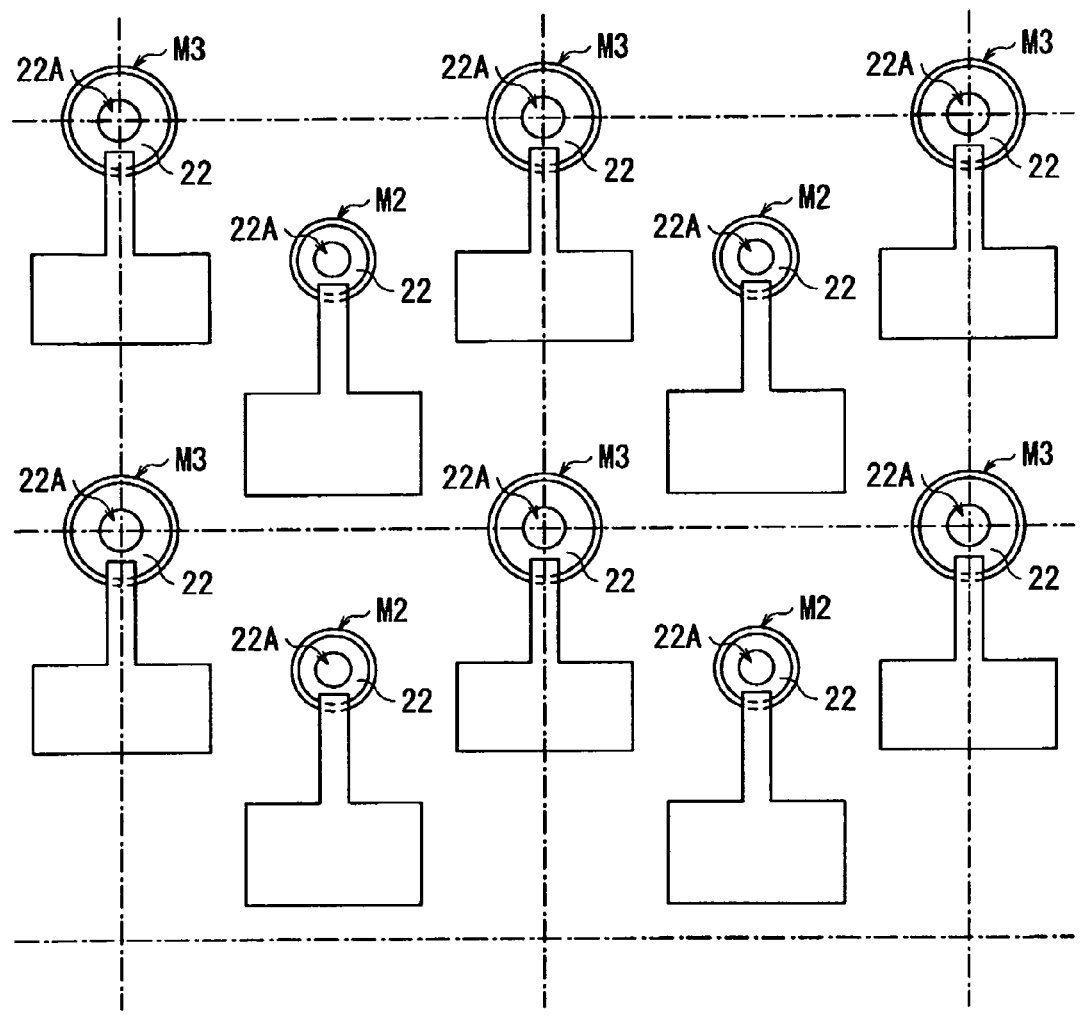
FIG. 17 is a top view for explaining a manufacturing process of a semiconductor laser of FIG. 19.
Figure 18:
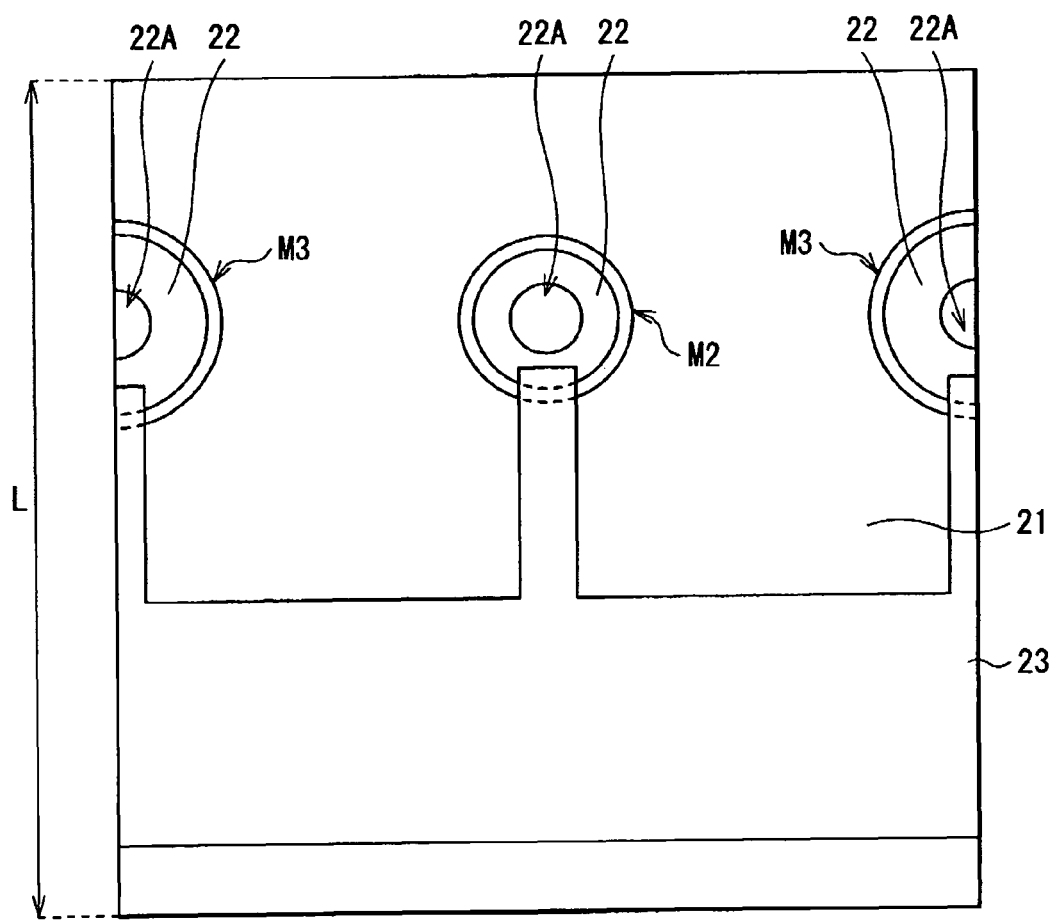
FIG. 18 is a top view showing a modification of the semiconductor laser of FIG. 14.
Figure 19:
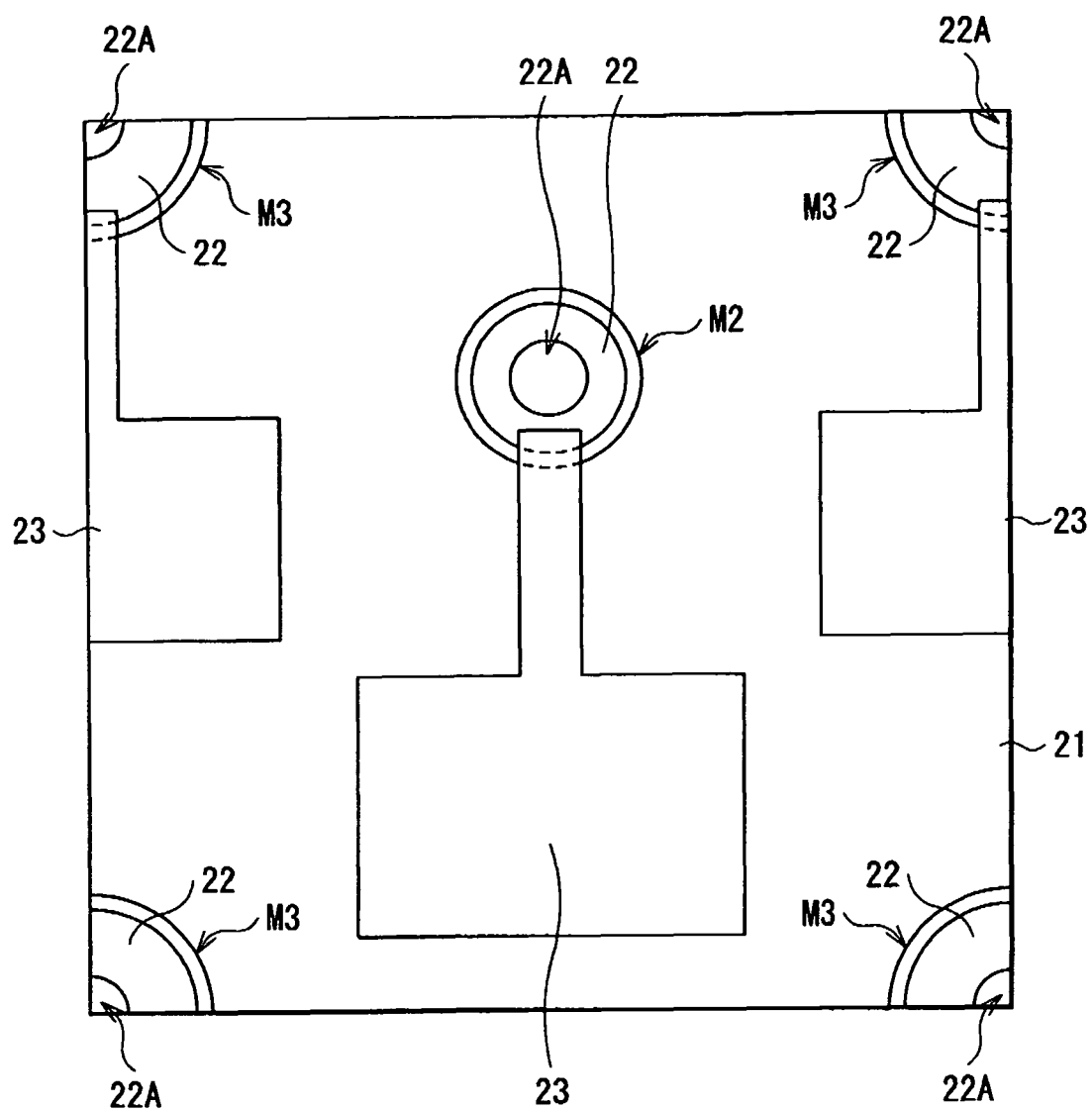
FIG. 19 is a top view showing another modification of the semiconductor laser of FIG. 14.

When the error of the oxidation confinement diameters generated in the oxidation step is not much large, a great number of mesas M1 to M4 are not necessarily formed for every unit chip area. For example, as shown in FIG. 16, two mesas M2 and M3 may be formed in a line for every unit chip area. Otherwise, as shown in FIG. 17, two mesas M2 and M3 may be formed in zigzags for every unit chip area. Then, measurement and evaluation similar to the foregoing measurement and evaluation can be made. When the mesa M2 is selected in the result of the evaluation, for example, it is possible that dicing is made in accordance with the dashed lines of FIG. 16 and thereby the semiconductor laser shown in FIG. 18 is formed, or it is possible that dicing is made in accordance with the dashed lines of FIG. 17 and thereby the semiconductor laser shown in FIG. 19 is formed.

Third Embodiment

In a VCSEL 4 of this embodiment, a cross section associated with dicing exists in an electrode pad 25 connected to the mesa having the laser characteristics matching with a given purpose and usage. Meanwhile, in the VCSEL 2 in the foregoing second embodiment, such a cross section does not exist in the electrode pad 23 connected to the mesa having the laser characteristics matching with the given purpose and usage. Therefore, the VCSEL 4 of this embodiment is mainly different from the VCSEL 2 of the foregoing second embodiment in the foregoing point.

Therefore, a description will be hereinafter mainly given of the point different from those in the foregoing second embodiment. Descriptions of the structure, operation, effects common to those of the foregoing second embodiment are omitted as appropriate.

Figure 20:
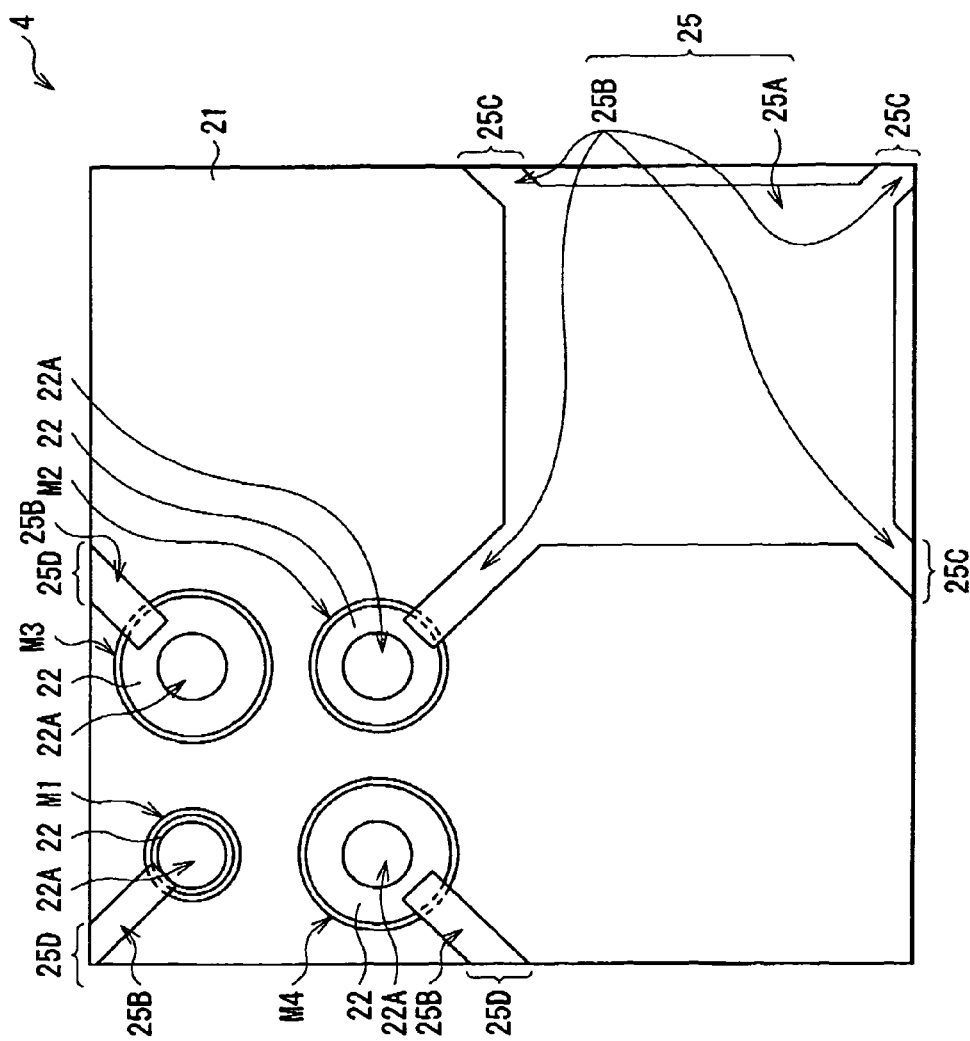
FIG. 20 is a top view of a semiconductor laser according to a third embodiment of the invention.

FIG. 20 shows a top face structure of the VCSEL 4 of this embodiment. The VCSEL 4 includes 4 types of mesas M1 to M4 and the electrode pad 25.

The respective mesas M1 to M4 are arranged, for example, as shown in FIG. 20, to be able to function as a laser without being broken by dicing.

In the electrode pad 25, for example, a Ti layer, a Pt layer, and an Au layer are layered in this order over the protective film 21. The electrode pad 25 has a pad portion 25A and four (the number equal to the number of mesas on the chip) linking arm portions 25B.

The pad portion 25A is a portion for wire bonding, and has for example, a rectangular shape. The respective linking arm portions 25B have, for example, a strip shape extending in a given direction. One end of each linking arm portion 25B is linked to the pad portion 25A. The other end of one of the respective linking arm portions 25B is directly connected to the upper electrode 22 of one mesa M2 out of the 4 types of mesas M1 to M4. The other ends other than the other end directly connected to the upper electrode 22 out of the respective linking arm portions 25B are cut by dicing. The face formed by the cutting (cross section 25C) is exposed on the end face of the chip. Therefore, the other ends other than the other end directly connected to the upper electrode 22 out of the respective linking arm portions 25B are not connected to the upper electrode 22 of the mesas M1 to M4.

Further, part of the electrode pad 25 (only the linking arm portion 25B in FIG. 20) is connected to the respective upper electrodes 22 of the three mesas M1, M3 and M4 to which the foregoing linking arm portion 25B is not connected out of the 4 types of mesas M1 to M4. The part of the electrode pad 25 connected to the respective upper electrodes 22 of the three mesas M1, M3 and M4 (hereinafter referred to as "microelectrode pad") is cut by dicing. The face formed by the cutting (each cross section 25D) is exposed on the end face of the chip. Therefore, the upper electrodes 22 on the three mesas M1, M3 and M4 connected to the microelectrode pad are electrically separated from the upper electrode 22 on the mesa M2 to which the microelectrode pad is not connected.

Further, the electrode pad 25 connected to the upper electrode 22 on the mesa M2 has the larger area than that of the microelectrode pad connected to the upper electrode 22 on the mesas M1, M3 and M4. That is, the electrode pad 25 connected to the upper electrode 22 on the mesa M2 has the area sufficient for wire bonding. Therefore, in this embodiment, only the mesa M2 is driven as a laser.

Figure 21:
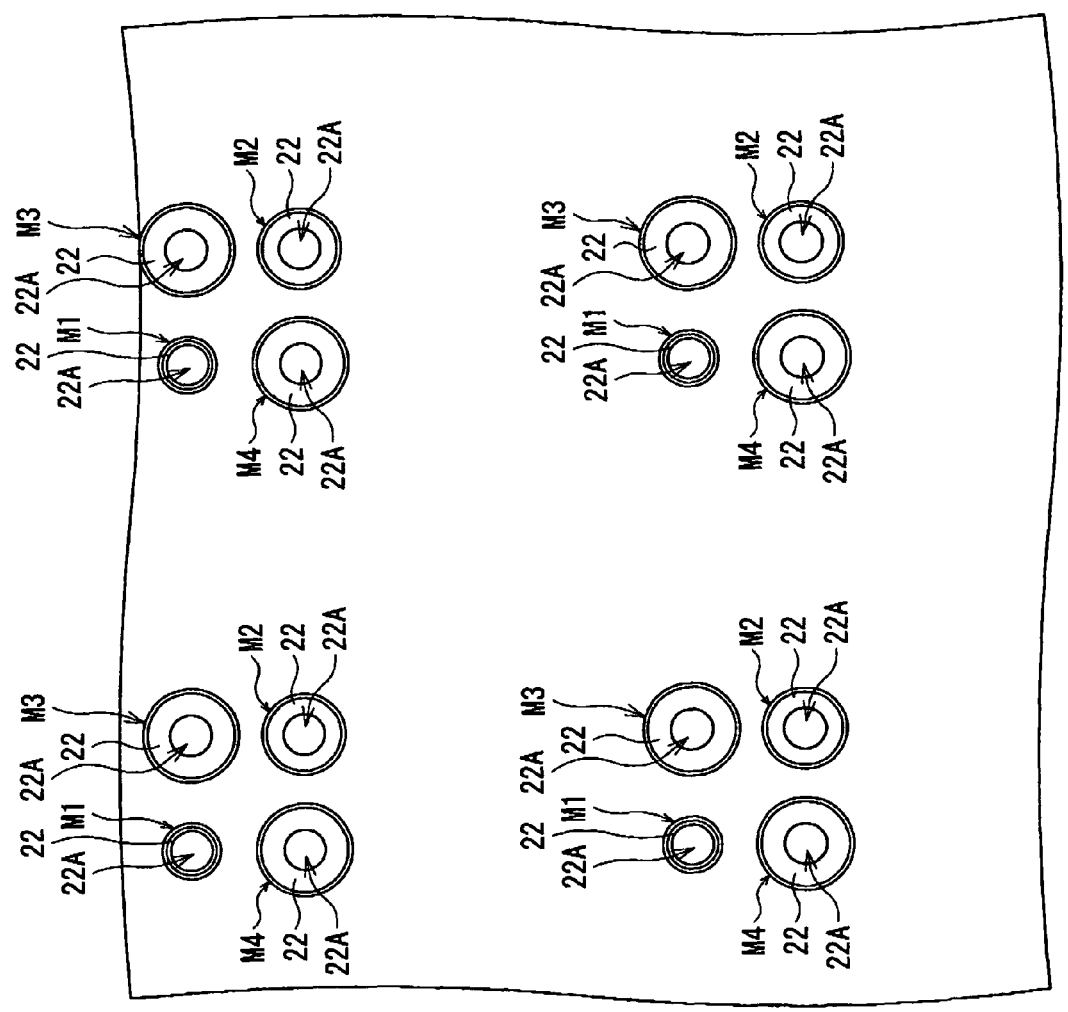
FIG. 21 is a top view for explaining a manufacturing process of the semiconductor laser of FIG. 20.

FIG. 21 shows part of the wafer surface in manufacturing process. Four types of mesas M1 to M4 are formed as one group for every unit chip area. The upper electrode 22 having the aperture 22A is formed on the top face of the mesas M1 to M4 in each group. Though not shown, the lower electrode 24 is formed on the rear face side of the substrate 10. That is, in the wafer, the respective mesas M1 to M4 can oscillate laser.

Electrode Pad Formation Step

Figure 22:
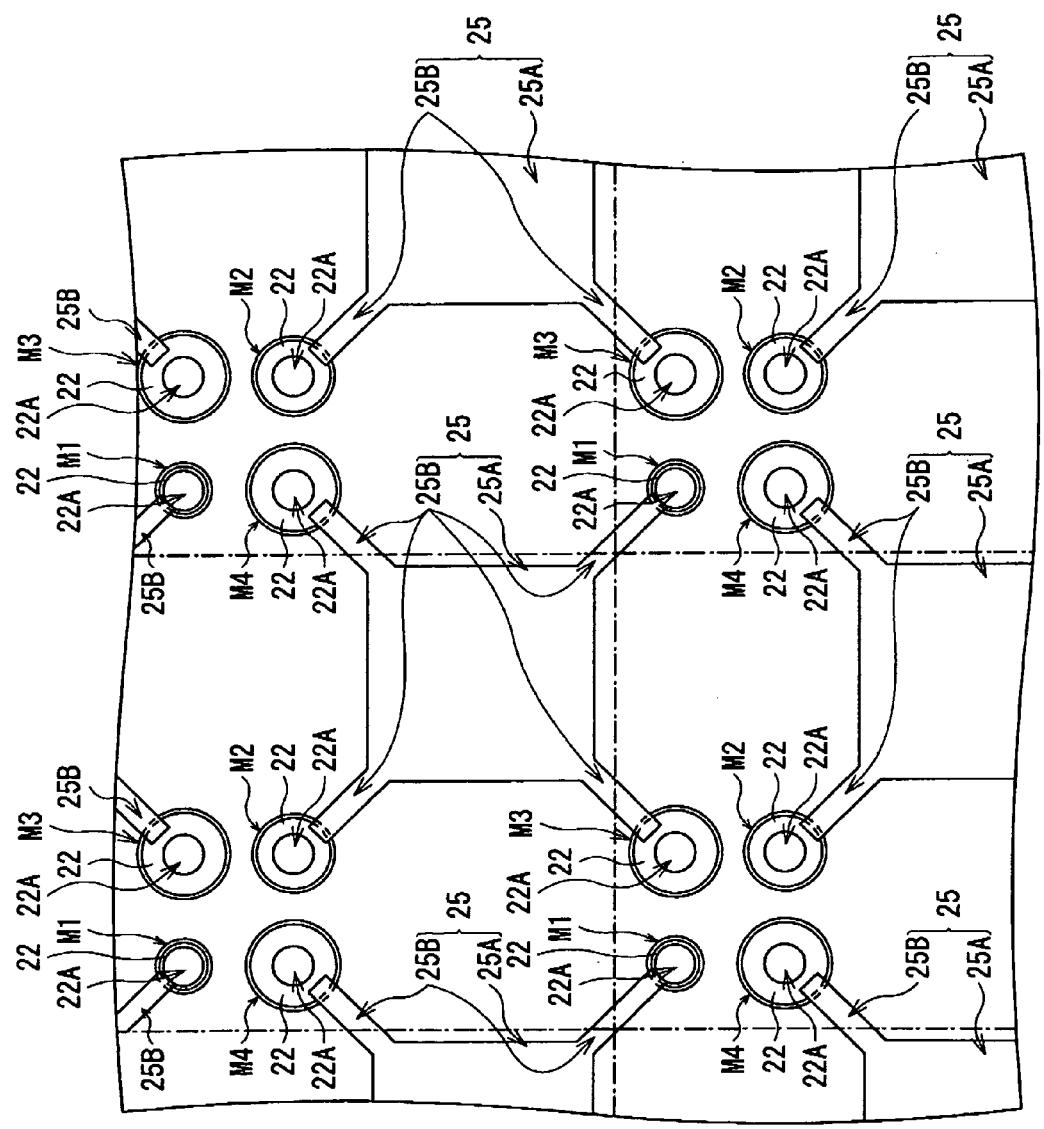
FIG. 22 is a top view for explaining a step following FIG. 21.

After the wafer is formed so that the respective mesas M1 to M4 can oscillate laser, one mesa with the oxidation confinement diameter different from each other is selected from each group out of a plurality of groups adjacent to each other. For example, each one of the four types of mesas M1 to M4 with the oxidation confinement diameter different from each other is selected from each group of four groups adjacent to each other. After that, the electrode pad 25 that connects the selected respective mesas M1 to M4 to each other is formed (FIG. 22).

That is, in this embodiment, the electrode pad 25 is not formed for every respective mesa M1 to M4, but is formed common to the plurality of mesas. Further, the electrode pad 25 is not formed commonly to a plurality of mesas with the oxidation confinement diameter equal to each other, but is formed commonly to the plurality of mesas with the oxidation confinement diameter different from each other, and is preferably formed commonly to the respective mesas M1 to M4 with the oxidation confinement diameter different from each other. Further, the electrode pad 25 is not formed commonly to the plurality of mesas in one group, but is formed commonly to a plurality of mesas belonging to the group different from each other.

Further, for a given group on the wafer, one electrode pad 23 is formed for every mesa M1 to M4 instead of the electrode pad 25 (not shown). The electrode pad 23 is an electrode pad for test used when the characteristics of the individual mesas M1 to M4 are evaluated in the after-mentioned measurement and evaluation step. However, when it is possible that a current is supplied from the common electrode pad 25 to the mesas M1 to M4, the respective mesas M1 to M4 are driven as a laser, and thereby the characteristics of the respective mesas M1 to M4 are evaluated, the electrode pad 23 for test is not necessarily formed.

Measurement and Evaluation Step

Next, a voltage is applied between the upper electrode 22 of the respective mesas M1 to M4 connected to the electrode pad 23 for test and the lower electrode 24 to oscillate laser in the respective mesas M1 to M4 and to emit laser light from each aperture 22A. Then, the laser characteristics of the respective mesas M1 to M4 are measured as follows. For example, the characteristics of the laser light emitted from each aperture 22A (for example, light output and NFP) are measured, and the threshold value current of the respective mesas M1 to M4 is measured. Evaluation is made whether or not the measurement value corresponds with a given criterion set according to a given purpose and usage. That is, in this embodiment, the laser characteristics of the respective mesas M1 to M4 are directly evaluated in the same manner as in the foregoing second embodiment. Thereby, the mesa having the laser characteristics that match with a given purpose and usage can be selected with a higher precision than the evaluation method in the foregoing first embodiment. In this embodiment, as the result of evaluation, the mesa M2 is selected as a matter of convenience.

(Dividing Step)

Finally, the electrical connection between the upper electrode 22 of the selected mesa M2 and the upper electrode 22 of the unselected mesas M1, M3 and M4 is cut. In addition, the wafer is divided into chips by dicing in the location of, for example, the dashed lines in FIG. 22 so that at least the selected mesa M2 is not broken (divided). As above, the VCSEL 4 of this embodiment is manufactured.

In the VCSEL 4 of this embodiment, in the same manner as in the foregoing embodiments, the diameters R1 to R4 of the respective mesas M1 to M4 are respectively set so that at least one oxidation confinement diameter of the respective mesas M1 to M4 surely corresponds with a given criterion. Thereby, even when the error of the oxidation confinement diameters $a_1$ to $a_4$ generated in the oxidation step is larger than the precision necessary for the oxidation confinement diameter, at least one mesa corresponding with the given criterion can be surely formed for every unit chip area. In the result, the waste such as disposing chips with a mesa not corresponding with a given criterion is not incurred, leading to largely increased yield.

Further, in this embodiment, the electrode pad 25 common to the plurality of mesas is formed in manufacturing process. Therefore, the number of electrode pads on the wafer can be decreased more than in the case that the electrode pad is formed for individual mesas. Thereby, it is possible to decrease the area for every unit chip and to increase the types (levels) of mesas with the oxidation confinement diameter different from each other. Therefore, the yield is improved more than in the case that the electrode pad is formed for individual mesas.

Modification of Third Embodiment

Figure 23:
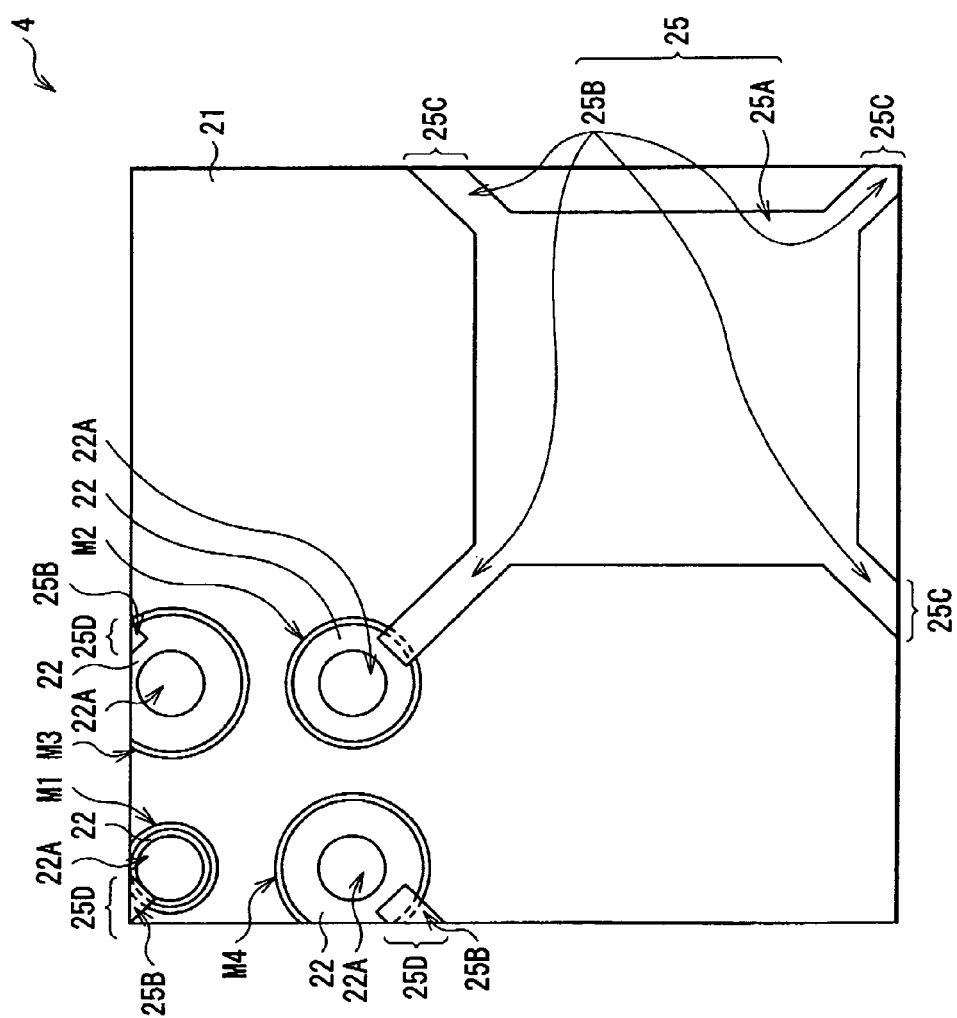
FIG. 23 is a top view showing another modification of the semiconductor laser of FIG. 20.

In the foregoing third embodiment, the respective mesas M1 to M4 are arranged without being broken by dicing so that the respective mesas M1 to M4 can be driven. However, for example, as shown in FIG. 23, three mesas M1, M3 and M4 other than the selected mesa M2 may be arranged being broken by dicing. In this case, however, there is a possibility that the upper electrode 22 of the broken mesas M1, M3 and M4 is electrically connected to the upper electrode 22 of the mesa M2 through the electrode pad 25 according to the dicing location. To avoid such an electrical connection, it is necessary to cut the linking arm portions 25B connected to the upper electrode 22 of the mesas M1, M3 and M4 by dicing.

Fourth Embodiment

The VCSEL 4 of the foregoing third embodiment is a VCSEL including the plurality of different levels of mesas. Meanwhile, a VCSEL 5 of this embodiment is a VCSEL including a plurality of the same level mesas. Therefore, the VCSEL 5 of this embodiment is mainly different from the VCSEL of the foregoing third embodiment in the foregoing point. Therefore, a description will be hereinafter mainly given of the point different from that in the foregoing third embodiment. Descriptions of the structure, operation, effects, and manufacturing steps common to those of the foregoing third embodiment are omitted as appropriate.

Figure 24:
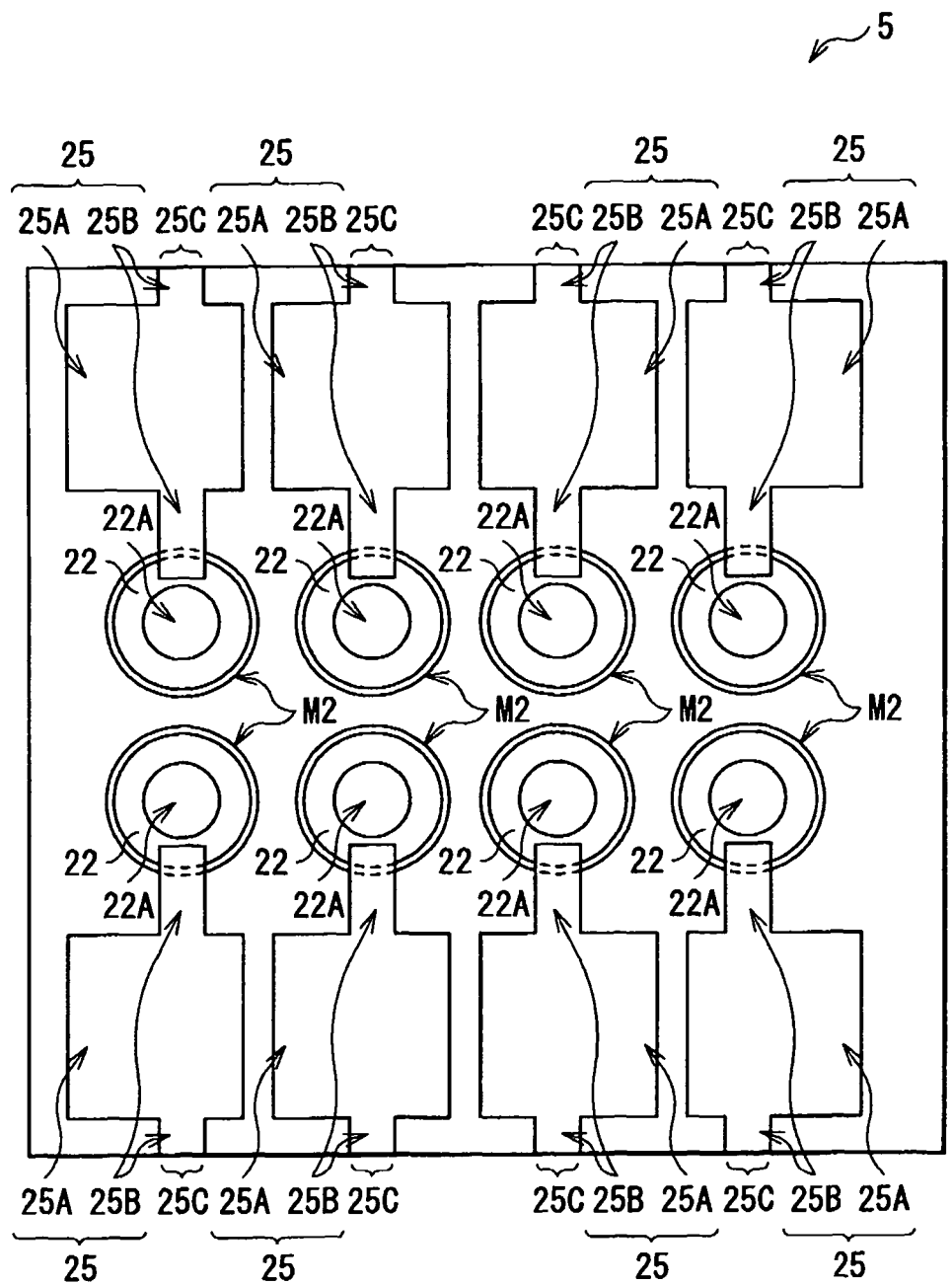
FIG. 24 is a top view of a semiconductor laser according to a fourth embodiment of the invention.

FIG. 24 shows a top face structure of the VCSEL 5 of this embodiment. The VCSEL 5 is an 8 channel laser array that includes eight same types of the mesas M2 and the electrode pads 25 formed for every mesa M2.

In the VCSEL 5, only the mesas M2 corresponding with a given criterion are provided. Mesas not corresponding with the given criterion are removed by dicing as will be described later.

Each electrode pad 25 has the pad portion 25A and two linking arm portions 25B. Here, in each electrode pad 25, one end of each linking arm portion 25B is linked to the pad portion 25A. Further, in each electrode pad 25, the other end of one of linking arm portion 25B is directly connected to the upper electrode 22 of the respective mesas M2, and the other end of the other linking arm portion 25B is broken by dicing.

The face formed by the cutting (cross section 25C) is exposed on the end face of the chip. Therefore, in each electrode pad 25, the other end other than the end directly connected to the upper electrode 22 out of the two linking arm portions 25B is not connected to any portion.

In FIG. 24, each mesa M2 appears to have the size equal to that of each electrode pad 25. However, in reality, each electrode pad 25 has the area sufficient for wire bonding. Therefore, the length of one side of each electrode pad 25 is several times of the diameter of the mesa M2 or more, and the occupancy ratio of the eight electrode pads 25 is extremely larger than the occupancy ratio of the eight mesas M2. That is, the eight electrode pads 25 occupy most area of the chip surface.

Figure 25:
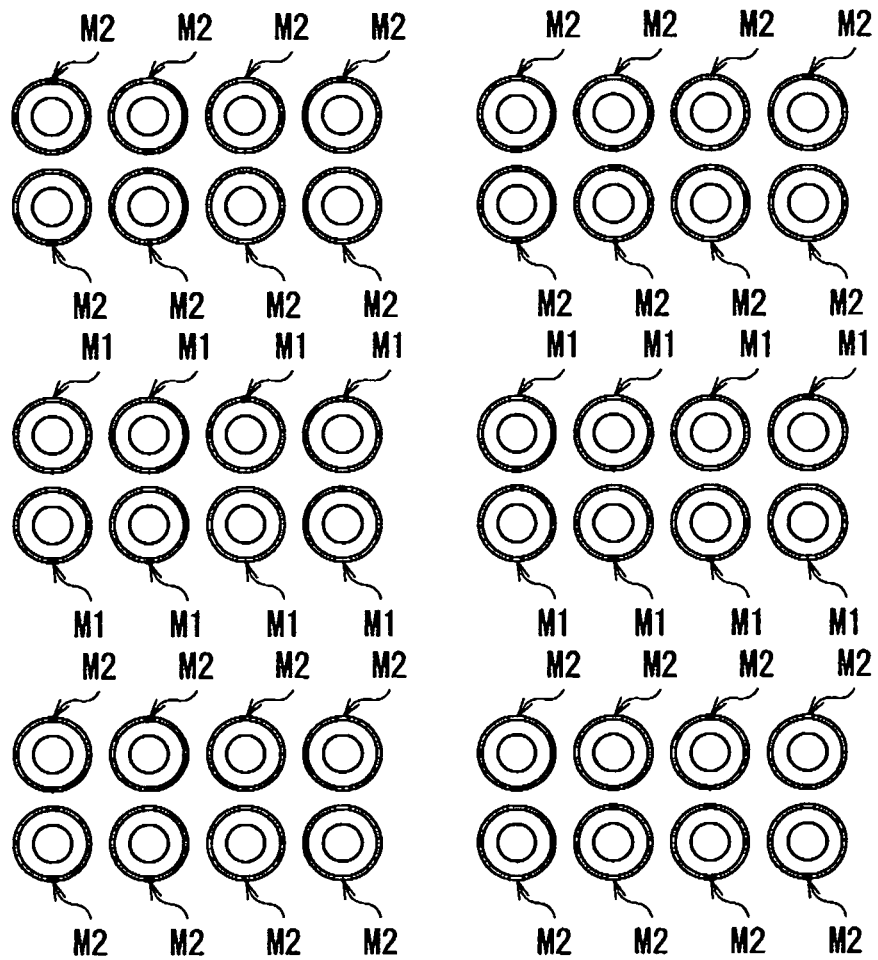
FIG. 25 is a cross section for explaining a manufacturing process of the semiconductor laser of FIG. 24.

FIG. 25 shows part of the wafer surface in manufacturing process. Eight same type mesas M2 as one group are formed in a line on the wafer for every unit chip area. Eight mesas M1 of the type different from that of the mesa M2 as one group are formed in a line on the wafer for every unit chip area. Further, on the wafer, the group of mesas M1 and the group of mesas M2 are arranged alternately in the direction perpendicular to the arrangement direction.

Further, the upper electrode 22 having the aperture 22A is formed on the top face of the respective mesas M1 and M2. Though not shown, the lower electrode 24 is formed on the rear face side of the substrate 10. That is, in the wafer, the respective mesas M1 and M2 can oscillate laser.

Electrode Pad Formation Step

Figure 26:
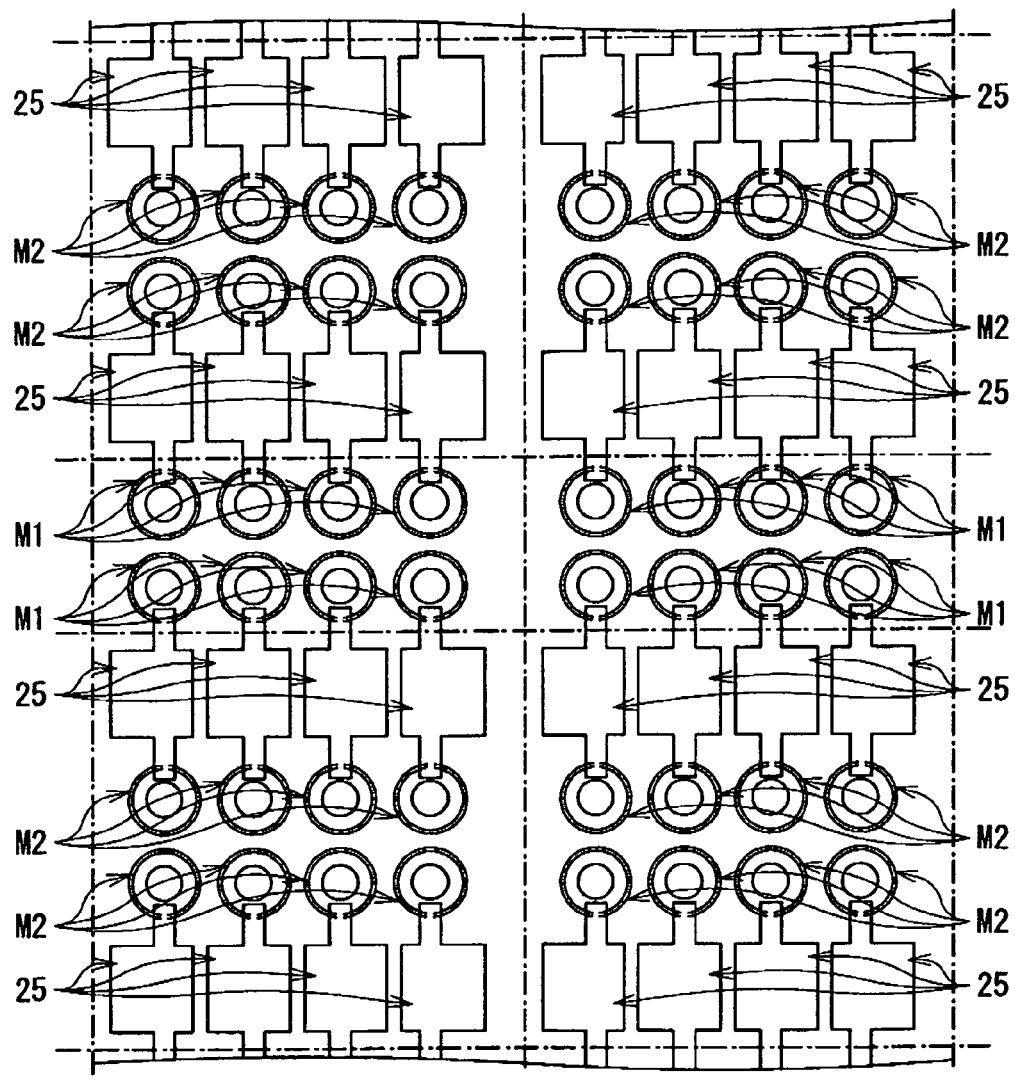
FIG. 26 is a top view for explaining a step following FIG. 25.

After the wafer is formed so that the respective mesas M1 and M2 can oscillate laser, the electrode pad 25 that connects the upper electrode 22 of one mesa M1 included in one group to the upper electrode 22 of one mesa M2 included in other group is formed for every set of mesas M1 and M2 between each mesa M1 and each mesa M2 (FIG. 26). That is, in this embodiment, the electrode pad 25 is not formed for every respective mesa M1 and M2, but is formed commonly for every one set of mesas M1 and M2.

Further, instead of the electrode pad 25, one electrode pad 23 is formed for every mesa M1 and M2 in a given location on the wafer (not shown). The electrode pad 23 is an electrode pad for test used when the characteristics of the individual mesas M1 and M2 are evaluated in the after-mentioned measurement and evaluation step. However, when it is possible that a current is supplied from the common electrode pad 25 to the mesas M1 and M2, the respective mesas M1 and M2 are driven as a laser, and thereby the characteristics of the respective mesas M1 and M2 are evaluated, the electrode pad 23 for test is not necessarily formed.

Measurement and Evaluation Step

Next, a voltage is applied between the upper electrode 22 of the respective mesas M1 and M2 connected to the electrode pad 23 for test and the lower electrode 24 to oscillate laser in the respective mesas M1 and M2 and to emit laser light from each aperture 22A. Then, the laser characteristics of the respective mesas M1 and M2 are measured as follows. For example, the characteristics of the laser light emitted from each aperture 22A (for example, light output and NFP) are measured, and the threshold value current of the respective mesas M1 and M2 is measured. Evaluation is made whether or not the measurement value corresponds with a given criterion set according to a given purpose and usage. That is, in this embodiment, the laser characteristics of the respective mesas M1 and M2 are directly estimated in the same manner as in the foregoing third embodiment. Thereby, the mesa having the laser characteristics that match with a given purpose and usage can be selected with a higher degree than the evaluation method in the foregoing first embodiment. In this embodiment, as the result of evaluation, the mesa M2 is selected as a matter of convenience.

Dividing Step

Finally, the electrical connection between the upper electrode 22 of the selected mesa M2 and the upper electrode 22 of the unselected mesa M1 is cut. In addition, the wafer is divided into chips by dicing in the location of, for example, the dashed lines in FIG. 26 so that at least the selected mesa M2 is not broken (divided). That is, dicing is made so that the region closest to the mesa M2 corresponding with a given criterion in the electrode pad 25 is separated from the region closest to the mesa M1 not corresponding with a given criterion in the electrode pad 25. In the result, the unselected mesa M1 is removed from the chip in which the selected mesa M2 is formed. As above, the VCSEL 5 of this embodiment is manufactured.

In the VCSEL 5 of this embodiment, in the same manner as in the foregoing embodiments, the diameters R1 and R2 of the respective mesas M1 and M2 are respectively set so that at least one oxidation confinement diameter of the respective mesas M1 and M2 surely corresponds with a given criterion. Thereby, even when the error of the oxidation confinement diameters $a_1$ and $a_2$ generated in the oxidation step is larger than the precision necessary for the oxidation confinement diameter, at least one of the mesas M1 and M2 can correspond with the given criterion. In the result, the waste such as disposing a whole wafer with a mesa not corresponding with a given criterion is not incurred, leading to largely increased yield.

In general, the electrode pad needs the area sufficient for wire bonding. Therefore, as the number of channels (the number of beams) for every chip is increased, it becomes more difficult to decrease the area for every unit chip. Therefore, when one electrode pad is formed for every mesa M1 and M2 in the case of manufacturing multi channel laser array chips, the number of chips including the mesa M2 corresponding with a given criterion that are capable of being obtained from one wafer becomes smaller, compared to in the case of manufacturing single channel laser chips.

Meanwhile, in this embodiment, one common electrode pad 25 is formed for every set of mesas M1 and M2 in the manufacturing step. In addition, the electrode pad for one group including the mesas M1 and other group including the mesas M2 is commonly formed. Thereby, the number of electrodes formed on one wafer can be more decreased than in the case that one electrode pad is formed for every mesa M1 and M2. Therefore, the number of chips including the mesa M2 corresponding with a given criterion that are capable of being obtained from one wafer can be increased, and the yield can be improved.

Modifications of the Foregoing Respective Embodiments

Figure 27:
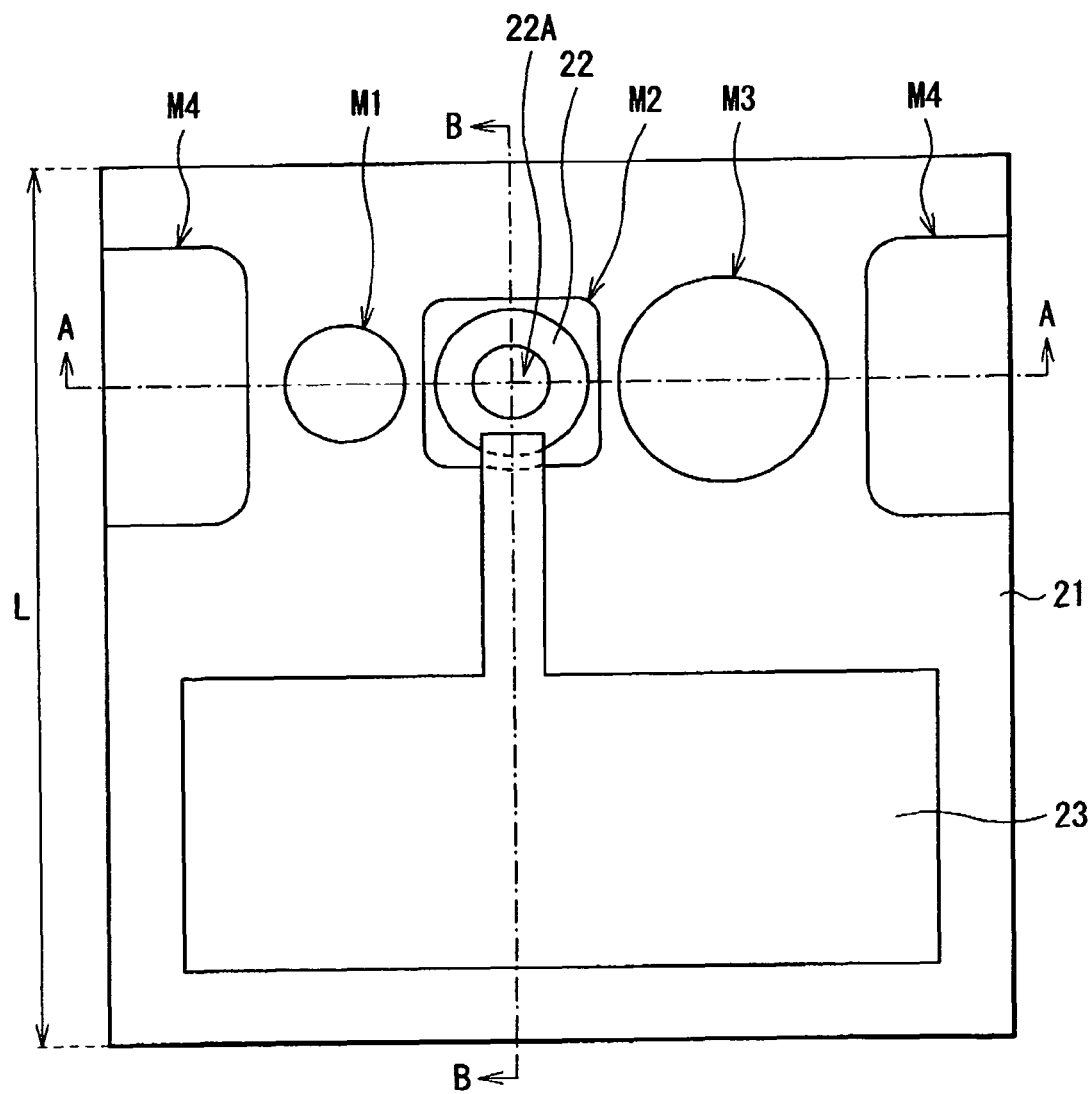
FIG. 27 is a top view showing another modification of the semiconductor laser of FIG. 24.

In the foregoing respective embodiments, the mesas M1 to M4 are in the shape of a cylinder. However, according to a given purpose and usage, for example, as shown in FIG. 27, it is possible that the mesas M1 to M4 are in the shape of a rectangular column. When oxidation treatment is performed for the mesas M1 to M4 in the shape of a rectangular column as above, the non-oxidation region 15B in the shape different from that of the mesas M1 to M4 in the shape of a cylinder can be formed.

In the foregoing respective embodiments, the projecting mesas M1 to M4 are formed. However, for example, it is possible that a circular trench is formed in the semiconductor layer, and a hole type mesa is provided in the portion surrounded by the trench.

Figure 28:
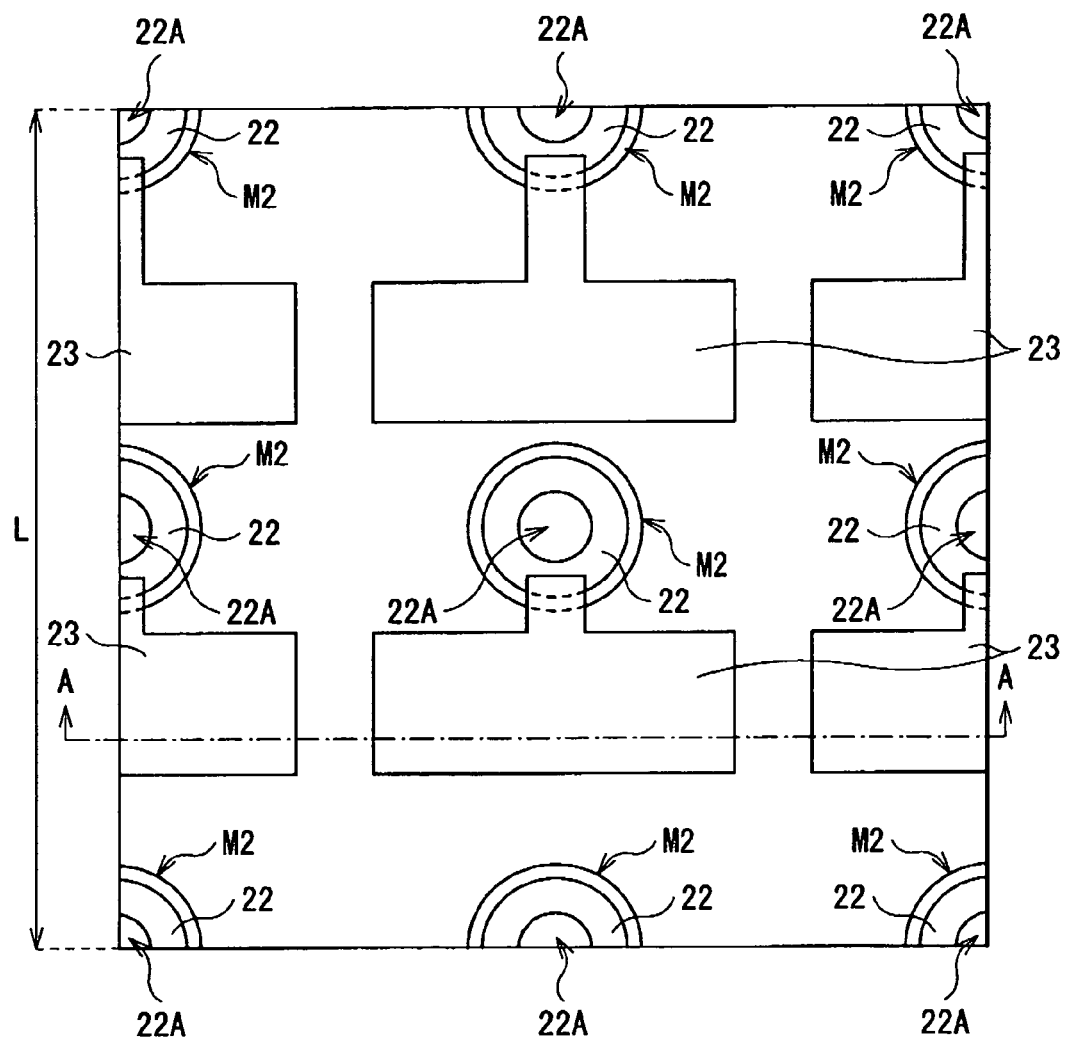
FIG. 28 is a top view showing still another modification of the semiconductor laser of FIG. 24.
Figure 29:
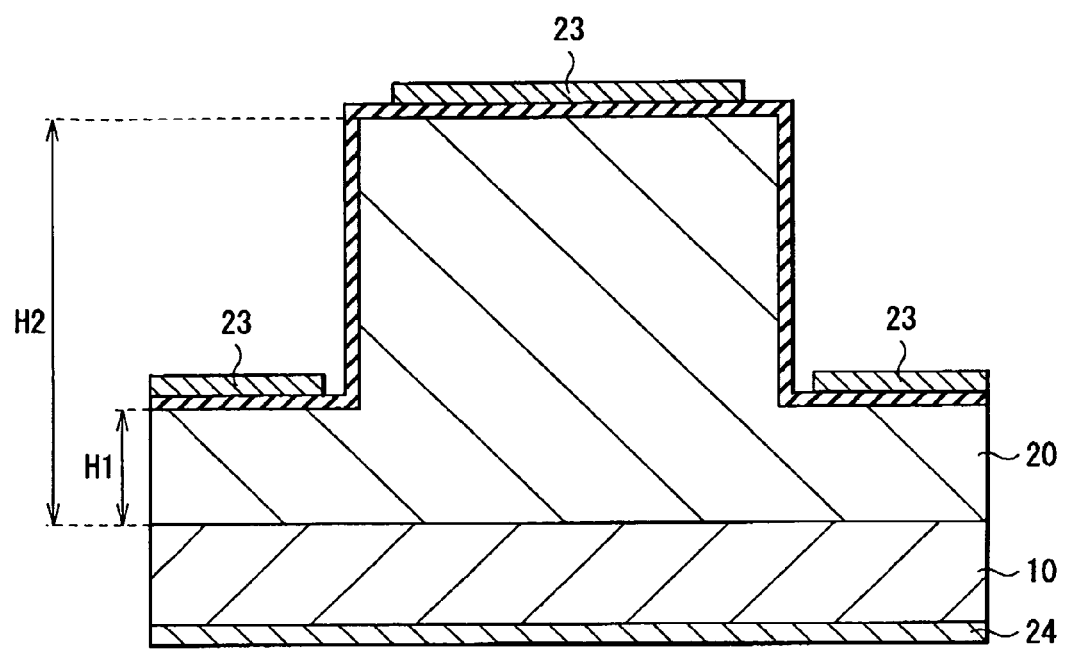
FIG. 29 is a view showing a cross sectional structure taken along the arrows A-A of FIG. 28.

Further, in the foregoing respective embodiments, the mesa diameter is used as a parameter. However, a functional portion with the characteristics being easily changed by an as-manufactured error, for example, the thickness of the portion corresponding to the electrode pad 23 in the semiconductor layer 20 may be used as a parameter. When such a thickness is changed, the capacitance of the electrode pad 23 is changed. Therefore, there is a possibility that due to the as-manufactured error, the capacitance of the electrode pad 23 is largely changed, and the laser characteristics are deviated from a given criterion. In that case, as shown in FIG. 28 and FIG. 29 (cross section taken along the arrows A-A of FIG. 28), the mesas M2 with the mesa diameter equal to each other are formed in a lattice shape, the portion different from the mesa M2 in the semiconductor layer 20 is selectively etched to form a plurality of placing regions 20A with the thickness H1 and H2 different from each other. Further, the electrode pad 23 is separately formed over each placing region 20A with the protective film 21 in between. Thereby, even when the capacitance of the electrode pad 23 is largely changed due to the as-manufactured error, at least one mesa M2 connected to the electrode pad 23 with the laser characteristics corresponding to a given criterion can be surely formed for every unit chip area. In the result, the waste such as disposing chips with the electrode pad 23 not corresponding with a given criterion is not incurred, leading to largely increased yield.

Further, in the foregoing respective embodiments, nothing is provided in the aperture 22A particularly. However, for example, an insulating layer (not shown) for adjusting the reflectance in the aperture 22A may be formed. At this time, when the film thickness of the insulating layer is changed, the reflectance is also changed. Therefore, there is a possibility that the reflectance is largely changed due to the as-manufactured error, and thus the laser characteristics become out of a given criterion. In that case, though not shown, the mesas M2 with the mesa diameter equal to each other are formed in a lattice shape, and insulating layers with the film thicknesses different from each other are formed on the top face of the respective mesas M2. Thereby, even when the reflectance of the insulating layer is largely changed due to the as-manufactured error, at least one mesa M2 having an insulating layer with the laser characteristics corresponding to a given criterion can be surely formed for every unit chip area. In the result, the waste such as disposing chips having an insulating layer not corresponding with a given criterion is not incurred, leading to largely increased yield.

In the foregoing respective embodiments, the descriptions have been given of the case that the invention is applied to the VCSEL. A description will be hereinafter given of a case that the invention is applied to an edge-emitting laser.

Fifth Embodiment

Figure 30:
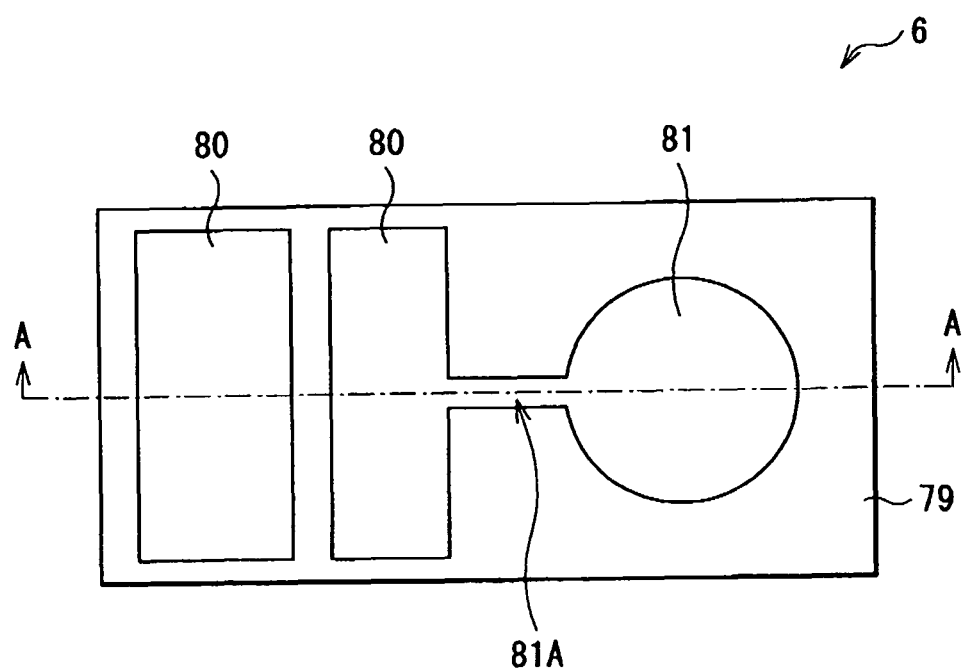
FIG. 30 is a top view of a semiconductor laser according to a fifth embodiment of the invention.
Figure 31:
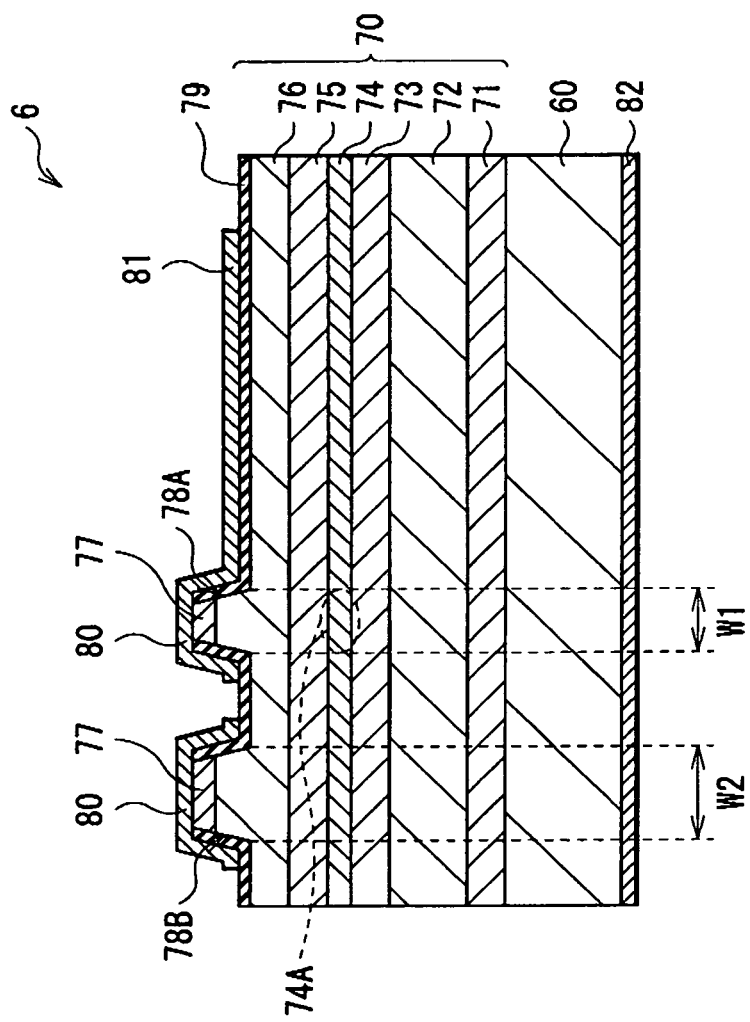
FIG. 31 is a view showing a cross sectional structure taken along the arrows A-A of the semiconductor laser of FIG. 30.

FIG. 30 shows a top face structure of an edge-emitting laser 6 according to a fifth embodiment of the invention. FIG. 31 shows a cross sectional structure taken along the arrows A-A of the edge-emitting laser 6 of FIG. 30. FIGS. 30 and 31 are schematic views, and the dimensions and the shape thereof are different from the actual dimensions and the actual shape.

The edge-emitting laser 6 includes two ridges with at least one parameter value out of the height, the width, and the shape of the ridge different from each other, based on at least one of the height, the width, and the shape of the ridge as a parameter. Two ridges are formed in a chip area equal to that of an existing edge-emitting laser. A description will be given of the edge-emitting laser 6 including 2 ridges 78A and 78B with the ridge width different from each other, based on the width of the ridge (ridge width) as a parameter.

The edge-emitting laser 6 includes a semiconductor layer 70 on one face of a substrate 60. In the semiconductor layer 70, a buffer layer 71, a lower cladding layer 72, a lower guide layer 73, an active layer 74, an upper guide layer 75, an upper cladding layer 76, and a contact layer 77 are layered in this order from the substrate 60 side.

The substrate 60 is, for example, a GaN substrate. The semiconductor layer 70 is made of Group III-V nitride semiconductor. The Group III-V nitride semiconductor is a gallium nitride (GaN) compound containing gallium (Ga) and nitrogen (N). For example, GaN, AlGaN (aluminum gallium nitride), AlGaInN (aluminum gallium indium nitride) or the like can be cited.

The buffer layer 71 is made of, for example, n-type GaN. The lower cladding layer 72 is made of, for example, n-type AlGaN. The lower guide layer 73 is made of, for example, n-type GaN. The active layer 74 has, for example, an undoped GaInN multi-quantum well structure. The upper guide layer 75 is made of, for example, p-type GaN. The upper cladding layer 76 is made of, for example, AlGaN. The contact layer 77 is made of, for example, p-type GaN.

As an n-type impurity, for example, a Group IV element and a Group VI element such as Si (silicon), Ge (germanium), O (oxide), and Se (selenium) can be cited. As a p-type impurity, for example, a Group II element and a Group IV element such as Mg (magnesium), Zn (zinc), and C (carbon) can be cited.

In the edge-emitting laser of this embodiment, two stripe-shaped ridges (projecting portions) 78A and 78B extending in a given direction in the lamination face are provided by forming the layers up to the contact layer 77 and then performing selective etching as will be described later. In this embodiment, the portion corresponding to ridge 78A out of the two ridges 78A and 78B is a light emitting region 74A. The light emitting region 74A has the stripe width with the size equal to the size of the bottom portion of the opposing ridge 78A (portion of the upper cladding layer 76). The light emitting region 74A corresponds to the current injection region into which a current confined by the ridge 78A is injected.

The widths (ridge widths) W1 and W2 of the respective ridges 78A and 78B are set by considering that the error ±y at the maximum is generated in the standard ridge width d when the ridge shape is formed by selectively removing part of the upper cladding layer 76 and the contact layer 77 in the etching step described later.

In general, the height, the width, and the shape of the ridge are strictly set to a value so that the laser characteristics necessary for a given purpose and usage can be obtained. The precision necessary for the height, the width, and the shape of the ridge somewhat varies according to the purpose and usage. However, in general, it is often the case that such a precision is stricter than the error generated in the etching step. Therefore, in this embodiment, on the assumption that the ridge width has the large error and the height and the shape of the ridge do not have a large error, for example, the widths d1 and d2 of resist layers RS1 and RS2 described later are set so that at least one of ridge widths W1 and W2 of the respective ridges 78A and 78B corresponds with the tolerance necessary for the ridge width in a given purpose and usage. Thereby, at least one of the ridge widths W1 and W2 surely corresponds with a given criterion.

Further, in the edge-emitting laser 6 of this embodiment, the both side faces of the ridges 78A and 78B are covered with an insulating film 79. An upper electrode 80 is formed on the contact layer 77 of the ridges 78A and 78B. An electrode pad 81 is provided from the side face of the ridge 78A to the flat face around the ridge 78A in the insulating film 79. The electrode pad 81 is connected to the ridge 78A through a junction arm portion 81A. Meanwhile, a lower electrode 82 is provided on the rear face of the substrate 60.

The insulating film 79 is made of, for example, SiO$_2$ (silicon oxide) or SiN (silicon nitride). In the upper electrode 80 and the electrode pad 81, for example, a palladium (Pd) layer and a platinum (Pt) layer are layered in this order. The lower electrode 82 has a structure in which an alloy layer of gold and germanium (Ge), a nickel (Ni) layer, and gold (Au) layer are layered in this order from the substrate 60 side.

Further, reflector films (not shown) are respectively formed on a pair of end faces (cleaved faces) perpendicular to the extending direction of the ridge 78. The reflector film on the side from which light is mainly emitted is made of, for example, Al$_2$O$_3$ (aluminum oxide), and adjusted to have the low reflectance. Meanwhile, the reflector film on the side by which light is mainly reflected has a structure in which Al$_2$O$_3$ (aluminum oxide) and amorphous silicon are alternately layered, for example, and is adjusted to have the high reflectance.

In the edge-emitting laser 6 of this embodiment, when a given voltage is applied between the upper electrode 80 and the lower electrode 82, a current is confined by the ridge 78A, the current is injected into the current injection region of the active layer 74, and thereby light is emitted due to electron-hole recombination. Such light is reflected by the reflector films (not shown) including a pair of end face on the light emitting side and end face on the rear side. Then, laser oscillation is generated at a given wavelength, and is emitted outside as a laser beam.

The VCSEL 6 having the foregoing structure can be manufactured, for example, as follows.

Figure 32:
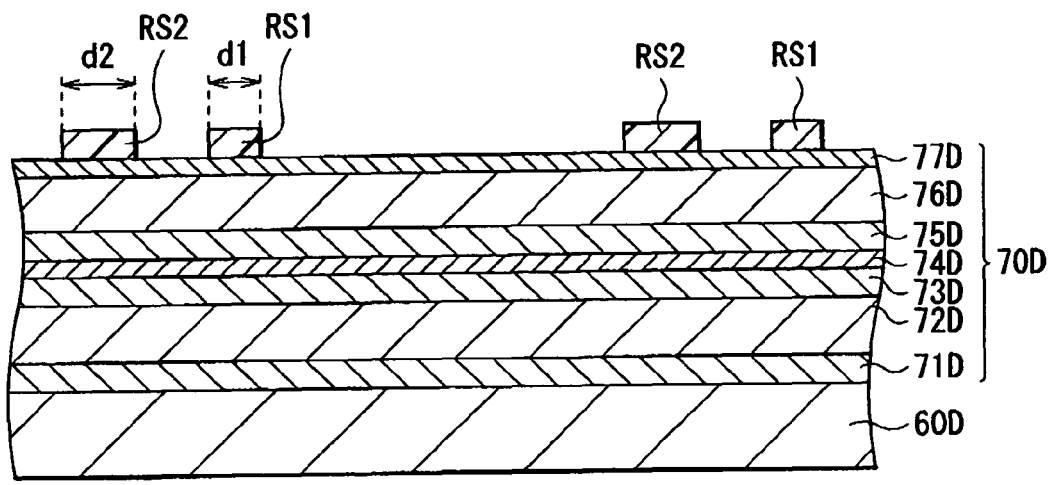
FIG. 32 is a cross section for explaining a manufacturing process of the semiconductor laser of FIG. 30.
Figure 33:
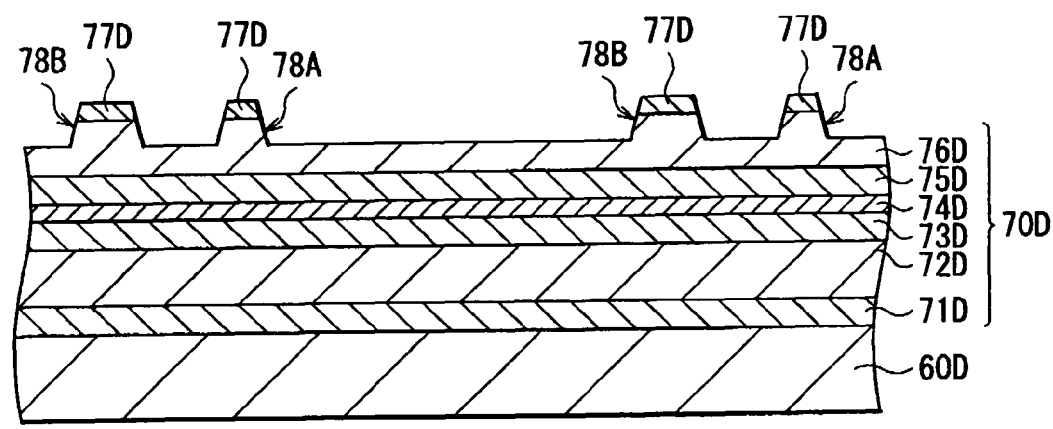
FIG. 33 is a cross section for explaining a step following FIG. 32.
Figure 34:
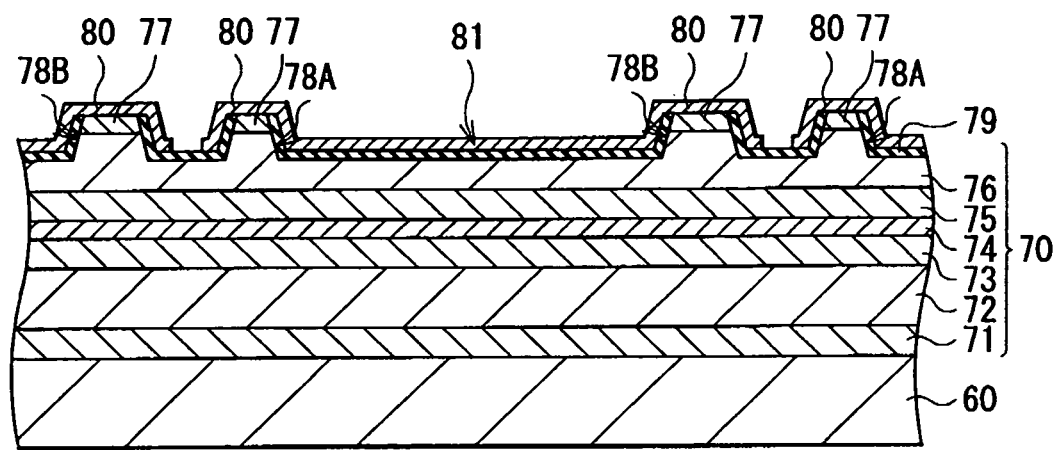
FIG. 34 is a cross section for explaining a step following FIG. 33.
Figure 35:
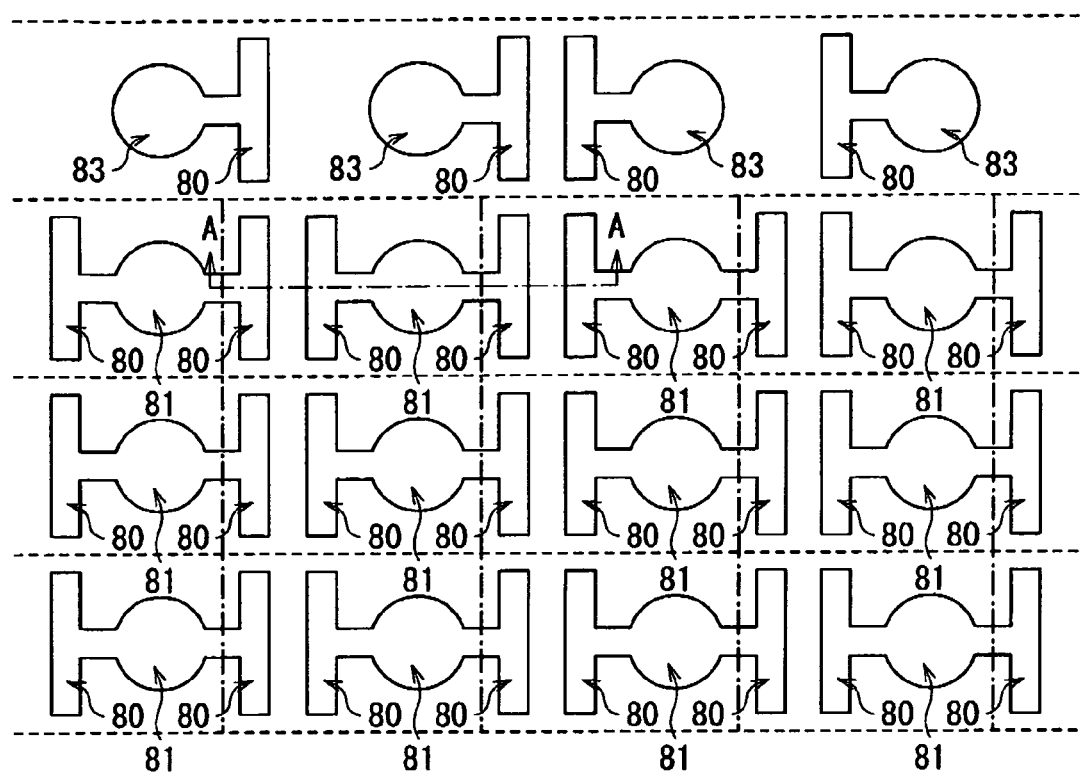
FIG. 35 is a top view of a wafer of FIG. 34.

FIG. 32 to FIG. 35 show a method of manufacturing VCSEL 6 in the order of steps. FIGS. 32, 33, and 34 show a cross sectional structure of part of the wafer in manufacturing process. FIG. 35 shows part of the wafer surface in manufacturing process. FIG. 34 is a cross sectional structure taken along the arrows A-A of FIG. 35. The dotted lines in FIG. 35 show the location where the wafer is cleaved into bars. The dashed lines in FIG. 35 show the dicing location where the cleaved bar-shaped wafer is further divided into chips.

To manufacture the edge-emitting laser 6, the semiconductor layer 70 made of Group III-V nitride semiconductor on a semiconductor layer 60D made of GaN is formed by MOCVD method, for example. Then, as a raw material of GaN compound semiconductor, for example, trimethyl aluminum (TMA), trimethyl gallium (TMG), trimethyl indium (TMIn), or ammonia (NH$_3$) is used. As a raw material of a donor impurity, for example, hydrogen selenide (H$_2$Se) is used. As a raw material of an acceptor impurity, for example, dimethyl zinc (DMZn) is used. The symbol "D" at the end of the "substrate 60D" means that forming the substrate 60 of the edge-emitting laser 6 is in the middle of process. The symbol "D" at the end of other elements has the same meaning.

First, a buffer layer 71D, a lower cladding layer 72D, a lower guide layer 73D, an active layer 74D, an upper guide layer 75D, an upper cladding layer 76D, and a contact layer 77D are layered in this order from the substrate 60D side (FIG. 32).

Next, a mask layer (not shown) is formed on the contact layer 77D, and lithography treatment is performed. Thereby, a strip-shaped resist layer RS1 with the width d1 is formed in the region where the ridge 78A is to be formed and a strip-shaped resist layer RS2 with the width d2 is formed in the region where the ridge 78B is to be formed (FIG. 32).

Next, by using the foregoing resist layers RS1 and RS2 as a mask, for example, the contact layer 77D and part of the upper cladding layer 76D are selectively removed by, for example, Reactive Ion Etching (RIE) method. After that, the mask layers RS1 and RS2 are removed. Thereby, one group composed of the stripe-shaped ridges 78A and 78B that extend in a given direction and are adjacent to each other is cyclically formed in the direction perpendicular to the extending direction (FIG. 33).

Next, an insulating material is formed on the whole surface. After that, lithography treatment and etching step are performed, and thereby an insulating film 79D having an aperture is formed on the contact layer 77D of the ridges 78A and 78B. Subsequently, one ridge with the ridge width different from each other is selected from each group of a plurality of groups adjacent to each other. For example, each one of 2 types of ridges 78A and 78B with the ridge width different from each other is selected from each group of 2 groups adjacent to each other. After that, lithography treatment, etching step, and lift-off step are performed, and thereby the upper electrode 80 electrically connected to the contact layer 77D over the ridges 78A and 78B is intermittently formed for every resonator length in the extending direction of the respective ridges 78A and 78B. In addition, the electrode pad 81 that connects the upper electrode 80 on the selected respective ridges 78A and 78B to each other is formed (FIG. 34 and FIG. 35). Thereby, each set of the upper electrode 80 on the ridge 78A, the upper electrode 80 on the ridge 78B, and the electrode pad 81 is formed for every unit chip area.

That is, in this embodiment, the electrode pad 81 is not formed respectively for every upper electrode 80, but is formed commonly to the plurality of upper electrodes 80. Further, the electrode pad 81 is not formed commonly to the plurality of upper electrodes 80 on the ridges with the ridge width equal to each other, but is formed commonly to the respective upper electrodes 80 on the plurality of ridges with the ridge width different from each other, and preferably formed commonly to the respective upper electrodes 80 on the respective ridges with the ridge width different from each other. Further, the electrode pad 81 is not formed for the plurality of ridges in one group, but is formed for the plurality of ridges belonging to the group different from each other.

Further, for a given group on the wafer, instead of the electrode pad 81, one electrode pad 83 is formed for every upper electrode 80 (refer to FIG. 35). The electrode pad 83 is an electrode pad for test used when the characteristics of the individual ridges 78A and 78B are evaluated in the after-mentioned measurement and evaluation step. However, when it is possible that a current is supplied from the common electrode pad 81 to the upper electrode 80 on the ridge 78A and the upper electrode 80 on the ridge 78B, the respective ridges 78A and 78B are driven as a laser, and thereby the characteristics of the respective ridges 78A and 78B are evaluated, the electrode pad 83 for test is not necessarily formed.

Next, the wafer is cleaved into bars at the dotted lines in FIG. 35, specifically cleaved between the respective upper electrodes 80 formed on the ridge 78A and between the respective upper electrodes 80 formed on the ridge 78B.

Measurement and Evaluation Step

Next, by using the bar formed with the electrode pad 83 for test out of the bars divided from the wafer, a voltage is applied between the upper electrode 80 of the respective ridges 78A and 78B connected to the electrode pad 83 for test and the lower electrode 82 to oscillate laser in the respective ridges 78A and 78B and to emit laser light from the both cleaved faces. Then, the laser characteristics of the respective ridges 78A and 78B are measured as follows. For example, the characteristics of the laser light emitted from the both cleaved faces (for example, light output and NFP) are measured, and the threshold value current of the respective ridges 78A and 78B is measured. Evaluation is made whether or not the measurement value corresponds with a given criterion set according to a given purpose and usage. That is, in this embodiment, the laser characteristics of the respective ridges 78A and 78B are directly evaluated. Thereby, the ridge having the laser characteristics that match with a given purpose and usage can be selected with a higher precision than the evaluation method by measuring the ridge width of the respective ridges 78A and 78B. In this embodiment, as the result of evaluation, the ridge 78A is selected as a matter of convenience.

Next, the reflector films are formed on the both cleaved faces (not shown). In the foregoing evaluation step, it is possible that on the basis of correction of the structure of the reflector films based on the measurement value, the reflector films are formed on the both cleaved faces.

(Dividing Step)

Finally, the electrical connection between the upper electrode 80 of the selected ridge 78A and the upper electrode 80 of the unselected ridge 78B is cut. In addition, the wafer is divided into chips by dicing in the location of, for example, the dashed lines of FIG. 35 so that at least the selected ridge 78A is not broken (divided). As above, the edge-emitting laser 6 of this embodiment is manufactured.

In the edge-emitting laser 6 of this embodiment, the widths d1 and d2 of the resist layers RS1 and RS2 are respectively set so that at least one of the ridge widths, W1 and W2 of the respective ridges 78A and 78B surely corresponds with a given criterion. Thereby, even when the error of the ridge width generated in the oxidation step is larger than the precision necessary for the ridge width, at least one ridge width corresponding with the given criterion can be surely formed for every unit chip area. In the result, the waste such as disposing chips with a ridge not corresponding with a given criterion is not incurred, leading to largely increased yield.

Further, in this embodiment, the common electrode pad 81 is formed for the plurality of upper electrodes 80 in the manufacturing process. Therefore, the number of electrode pads on the wafer can be decreased more than in the case that the electrode pad is formed for the individual upper electrodes 80. Thereby, it is possible to decrease the area for every unit chip and to increase the types (levels) of ridges with at least one of the height, the width, and the shape of the ridge different from each other. Therefore, the yield is improved more than in the case that the electrode pad is formed for the individual upper electrodes 80.

Sixth Embodiment

The edge-emitting laser 6 of the foregoing fifth embodiment is the edge-emitting laser including each one level ridge respectively for the plurality of levels of ridges. Meanwhile, an edge-emitting laser 7 of this embodiment is an edge-emitting laser including a plurality of ridges respectively for a plurality of levels of ridges. Therefore, the edge-emitting laser 7 of this embodiment is mainly different from the edge-emitting laser 6 of the foregoing fifth embodiment in the foregoing point. Therefore, a description will be hereinafter mainly given of the point different from that in the foregoing fifth embodiment. Descriptions of the structure, operation, effects and manufacturing steps common to those of the foregoing fifth embodiment are omitted as appropriate.

Figure 36:
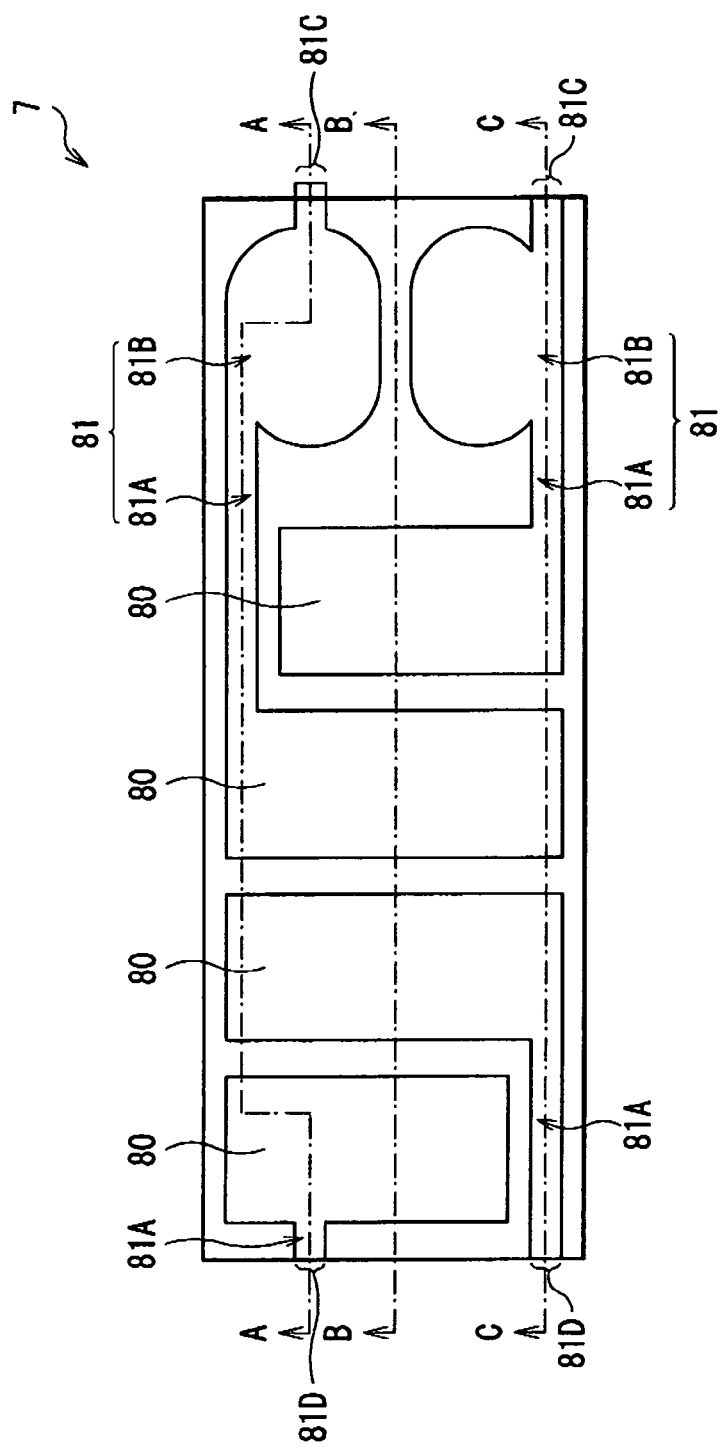
FIG. 36 is a top view of a semiconductor laser according to a sixth embodiment of the invention.
Figure 37:
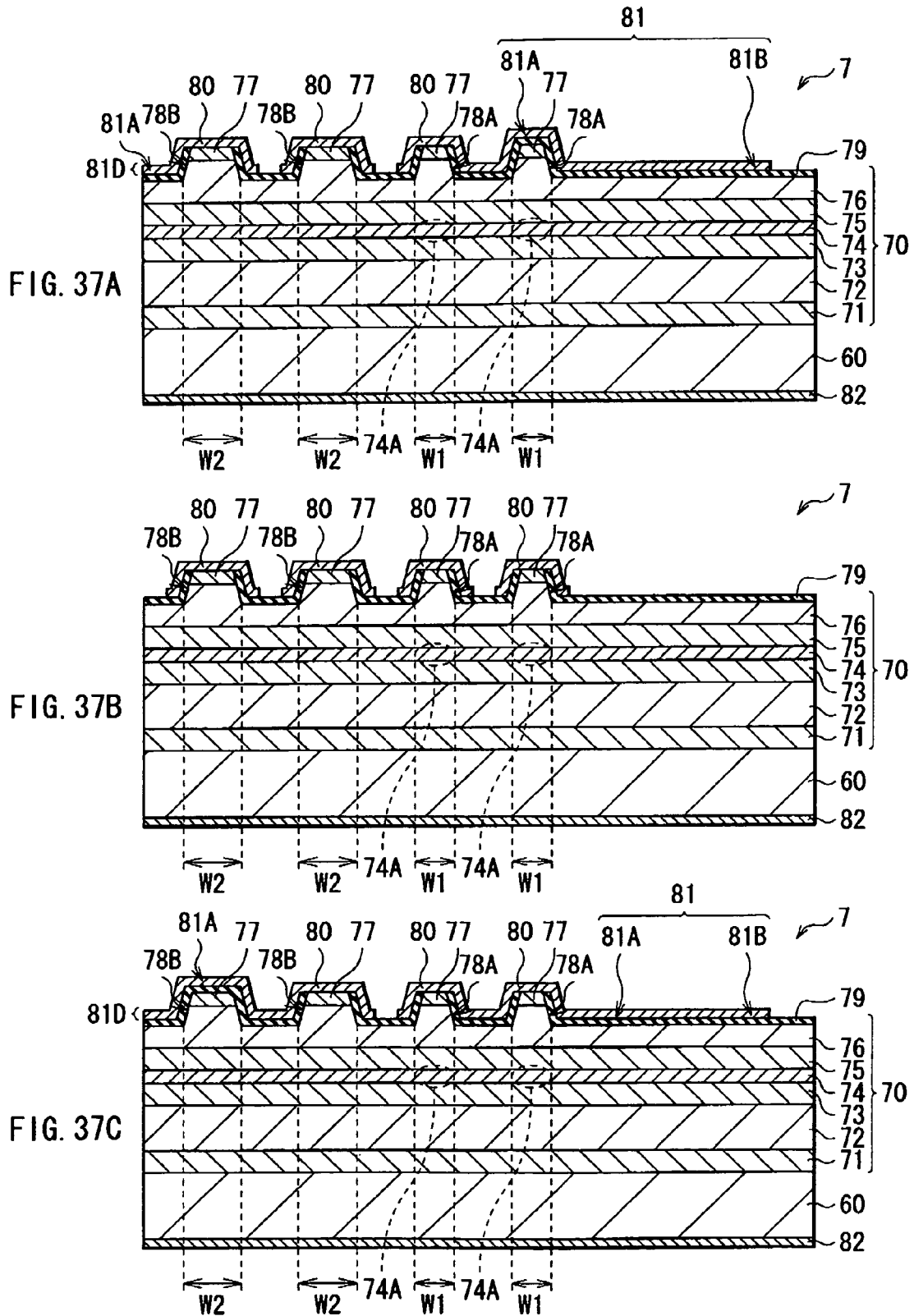
FIGS. 37A, 37B, and 37C are views showing cross sections taken along the arrows A-A, B-B, and C-C of the semiconductor laser of FIG. 36.

FIG. 36 shows a top face structure of the edge-emitting laser 7 of this embodiment. FIG. 37A shows a cross sectional structure taken along the arrows A-A of FIG. 36. FIG. 37B shows a cross sectional structure taken along the arrows B-B of FIG. 36. FIG. 37C shows a cross sectional structure taken along the arrows C-C of FIG. 36. The edge-emitting laser 7 is a 2 channel laser array that includes two same type ridges 78A, two ridges 78B of the type different from the type of the ridge 78A, and the electrode pad 81 formed respectively for every ridge 78B. That is, the edge-emitting laser 7 is provided with the ridge 78B not corresponding with a given criterion, in addition to the ridge 78A corresponding with the given criterion.

In the electrode pad 81, for example, a Ti layer, a Pt layer, and an Au layer are layered in this order over the insulating film 79. The electrode pad 81 has two (the number equal to the number of channels) pad portions 81B and four linking arm portions 81A (two which is the number equal to the number of channels is provided for every pad portion 81B).

The electrode pad 81 is a portion for wire bonding, and, for example, has the shape of a circle or an oval. The respective linking arm portions 81A have, for example, a strip shape extending in a given direction. In each electrode pad 81, one end of each linking arm portion 81A is linked to the pad portion 81B. Further, in each electrode pad 81, one other end of the two linking arm portions 81A is directly connected to the upper electrode 80 of the ridge 78A different from each other. Further, in each electrode pad 81, the other end other than the end directly connected to the upper electrode 80 out of the two linking arm portions 81A is cut by dicing. The face formed by the cutting (cross section 81O) is exposed on the end face of the chip. Therefore, the other ends other than the end directly connected to the upper electrode 80 out of the respective linking arm portions 81A are not connected to the upper electrode 80 of the ridges 78A and 78B.

Further, part of the electrode pad 81 (only part of the linking arm portion 81A in FIG. 36 and FIGS. 37A to 37C) is connected to the respective upper electrodes 80 of the ridge 78B to which the foregoing arm linking portion 81A is not connected out of the two 2 ridges 78A and 78B. Part of the electrode pad 81 connected to the respective upper electrodes 80 of the ridge 78B (hereinafter referred to as "microelectrode pad") is cut by dicing. The face formed by the cutting (each cross section 81D) is exposed on the end face of the chip. Therefore, the upper electrode 80 on the ridge 78B to which the microelectrode pad is connected is electrically separated from the upper electrode 80 on the ridge 78A to which the microelectrode pad is not connected.

Further, the electrode pad 81 connected to the upper electrode 80 on the ridge 78A has the larger area than that of the microelectrode pad connected to the upper electrode 80 on the ridge 78B. That is, the electrode pad 81 has the area sufficient for wire bonding. Therefore, in this embodiment, only the two ridges 78A are driven as a laser.

Figure 38:
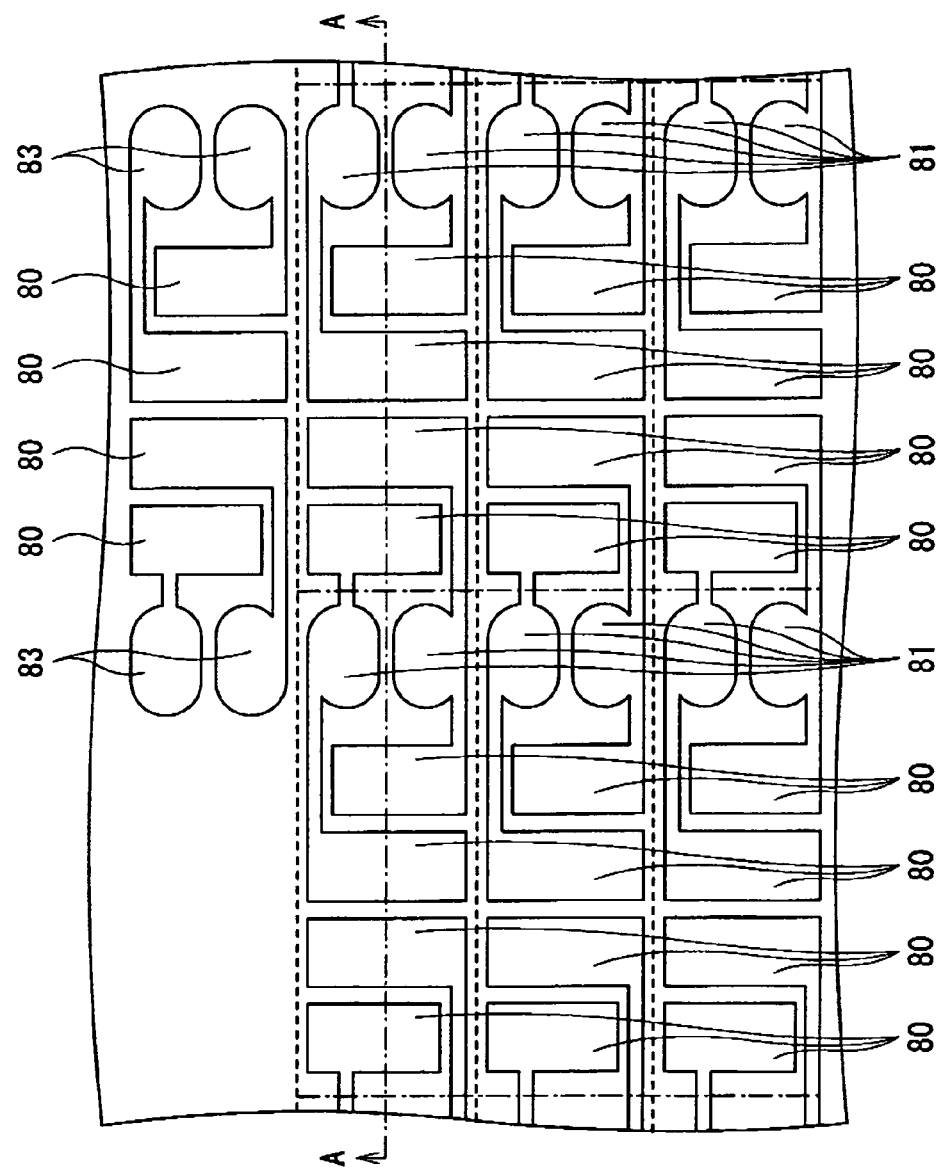
FIG. 38 is a top view for explaining a manufacturing step of the semiconductor laser of FIG. 36.
Figure 39:
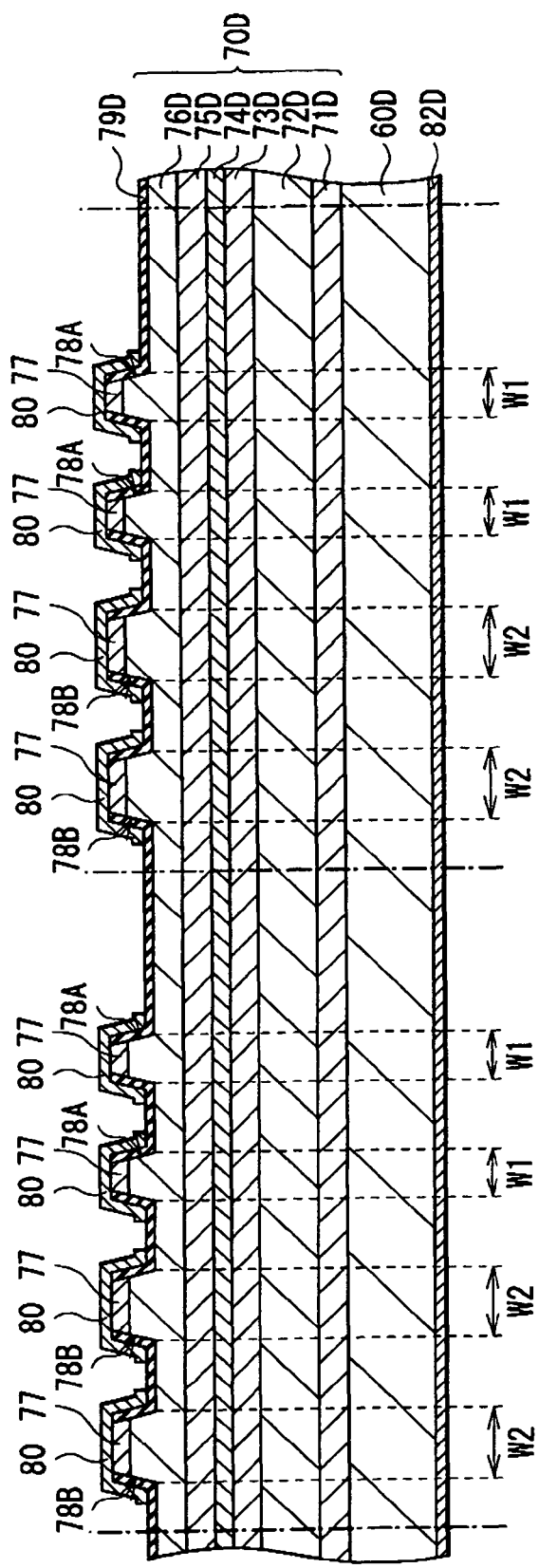
FIG. 39 is a view showing a cross sectional structure taken along the arrows A-A of a wafer of FIG. 38.

FIG. 38 shows part of the wafer surface in the manufacturing process. FIG. 39 shows a cross sectional structure taken along the arrows A-A of FIG. 38. Two same type ridges 78A and the two ridges 78B of the type different from the type of the ridge 78A are formed as one group for every chip area.

The pair of same type ridges 78A formed adjacent to each other and the pair of ridges 78B of the type different from the type of the ridge 78A that is formed adjacent to each other are alternately arranged in the direction perpendicular to the extending direction of the ridges 78A and 78B. The upper electrode 80 is intermittently formed for every resonator length on the respective ridges 78A. Similarly, the upper electrode 80 is intermittently formed for every resonator length on the respective ridges 78B. Further, the common electrode pad 81 that electrically connects the upper electrode 80 on one ridge 78A of the pair of ridges 78A to the upper electrode 80 on one ridge 78B of the pair of ridges 78B is formed between the pair of ridges 78A and the pair of ridges 78B for every set of ridges 78A and 78B. Further, the lower electrode 82D is formed on the rear face side of the substrate 60D. That is, in the wafer, the respective ridges 78A and 78B can oscillate laser.

Further, for a given group on the wafer, instead of the electrode pad 81, one electrode pad 83 is formed for every upper electrode 80 (refer to FIG. 38). The electrode pad 83 is an electrode pad for test used when the characteristics of the individual ridges 78A and 78B are evaluated in the after-mentioned measurement and evaluation step. However, when it is possible that a current is supplied from the common electrode pad 81 to the upper electrode 80 on the ridge 78A and the upper electrode 80 on the ridge 78B, the respective ridges 78A and 78B are driven as a laser, and thereby the characteristics of the respective ridges 78A, and 78B are evaluated, the electrode pad 83 for test is not necessarily formed.

Next, the wafer is cleaved into bars at the dotted lines of FIG. 38, specifically cleaved between the respective upper electrodes 80 formed on the ridge 78A and between the respective upper electrodes 80 formed on the ridge 78B.

Measurement and Evaluation Step

Next, by using the bar formed with the electrode pad 83 for test out of the bars divided from the wafer, a voltage is applied between the upper electrode 80 on the respective ridges 78A and 78B connected to the electrode pad 83 for test and the lower electrode 82 to oscillate laser in the respective ridges 78A and 78B and to emit laser light from the both cleaved faces. Then, the laser characteristics of the respective ridges 78A and 78B are measured as follows. For example, the characteristics of the laser light emitted from the both cleaved faces (for example, light output and NFP) are measured, and the threshold value current of the respective ridges 78A and 78B is measured. Evaluation is made whether or not the measurement value corresponds with a given criterion set according to a given purpose and usage. That is, in this embodiment, the laser characteristics of the respective ridges 78A and 78B are directly evaluated. Thereby, the ridge having the laser characteristics that match with a given purpose and usage can be selected with a higher precision than the evaluation method by measuring the ridge width of the respective ridges 78A and 78B. In this embodiment, as the result of evaluation, the ridge 78A is selected as a matter of convenience.

Next, the reflector films are formed on the both cleaved faces (not shown). In the foregoing evaluation step, it is possible that on the basis of correction of the structure of the reflector film based on the measurement value, the reflector films are formed on the both cleaved faces.

(Dividing Step)

Finally, the electrical connection between the upper electrode 80 of the selected ridge 78A and the upper electrode 80 of the unselected ridge 78B is cut. In addition, the wafer is divided into chips by dicing in the location of, for example, the dashed lines of FIG. 38 and FIG. 39 so that at least the selected ridge 78A is not broken (divided). As above, the edge-emitting laser 7 of this embodiment is manufactured.

In the edge-emitting laser 7 of this embodiment, the widths d1 and d2 of the resist layers RS1 and RS2 are respectively set so that at least one of the ridge widths, W1 and W2 of the respective ridges 78A and 78B surely corresponds with a given criterion. Thereby, even when the error of the ridge width generated in the oxidation step is larger than the precision necessary for the ridge width, at least one ridge width corresponding with the given criterion can be surely formed for every unit chip area. In the result, the waste such as disposing chips with a ridge not corresponding with a given criterion is not incurred, leading to largely increased yield.

In general, the electrode pad needs the area sufficient for wire bonding. Therefore, as the number of channels (the number of beams) for every chip is increased, it becomes more difficult to decrease the area for every unit chip. As a result, when one electrode pad is formed for every ridge 78A and 78B in the case of manufacturing multi channel laser array chips, the number of chips including the ridge 78A corresponding with a given criterion that are capable of being obtained from one wafer becomes smaller, compared to in the case of manufacturing single channel laser chips.

Meanwhile, in this embodiment, one electrode pad 81 common to the set of ridges 78A and 78B is formed in the manufacturing step, and thus the electrode pad is common to one group. Thereby, it is possible to increase the number of chips including the ridge 78A corresponding with a given criterion that are capable of being obtained from one wafer, compared to in the case of forming one electrode pad for every respective ridge 78A and 78B. In the result, the yield is improved.

Modification of the Foregoing Fifth and Sixth Embodiments

Figure 40A:
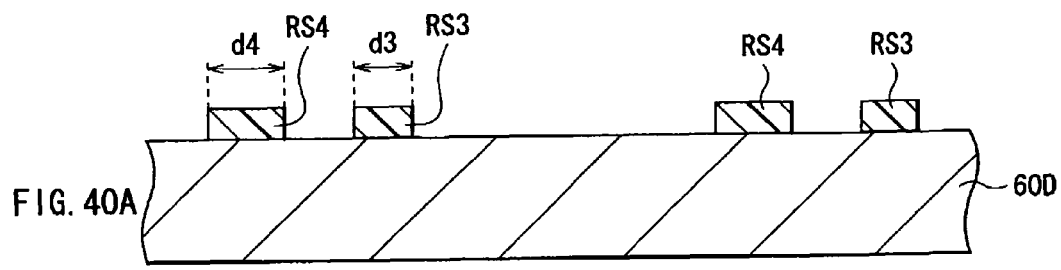
FIGS. 40A, 40B, and 40C are cross sections showing a modification of the semiconductor laser of FIG. 36.
Figure 40B:
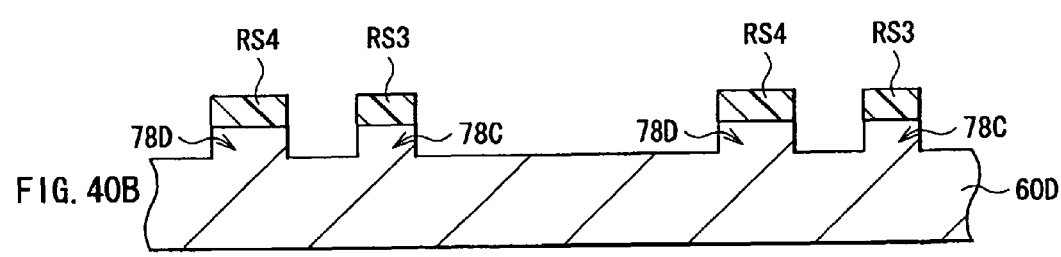
Figure 40C:
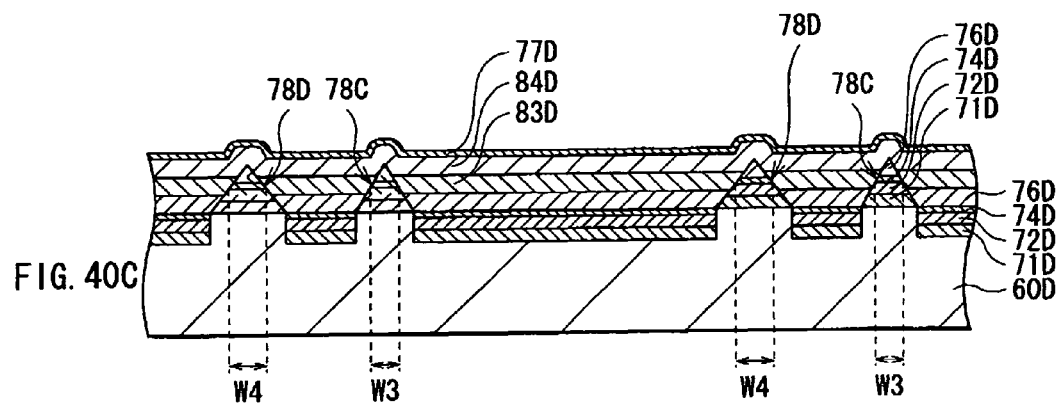

In the foregoing fifth and the sixth embodiments, the ridges 78A and 78B are formed by selectively etching the semiconductor layer 70D. However, the ridge can be formed by other method. For example, first, resist layers RS3 and RS4 are formed on the (100) crystal face of the substrate 60D made of GaAs (FIG. 40A). After that, by using the resist layers RS3 and RS4 as a mask, the (100) crystal face is selectively etched to form stripe-shaped protrusions 61 and 62 extending in the direction of [011] axis (FIG. 40B). Subsequently, the resist layers RS3 and RS4 are removed. After that, the buffer layer 71D, the lower cladding layer 72D, the active layer 74D, the upper cladding layer 76D, a current block layer 83D, a second upper cladding layer 84D, and the contact layer 77D are formed by epitaxial crystal growth over the surface of the substrate 60D including the protrusions 61 and 62. In the result, ridges 78C and 78D are formed (FIG. 40C).

However, when the ridges 78C and 78D are formed as above, for example, it is necessary that, for example, the widths d3 and d4 of the resist layers RS3 and RS4 are respectively set so that at least one of ridge widths W3, W4 (widths of the active layers 74 and 74D) of the respective ridges 78C and 78D (protrusions 61 and 62) surely corresponds with a given criterion.

Descriptions have been hereinbefore given of the invention with the embodiments and the modifications thereof. However, the invention is not limited to the foregoing embodiments and the like, and various modifications may be made.

Figure 41:
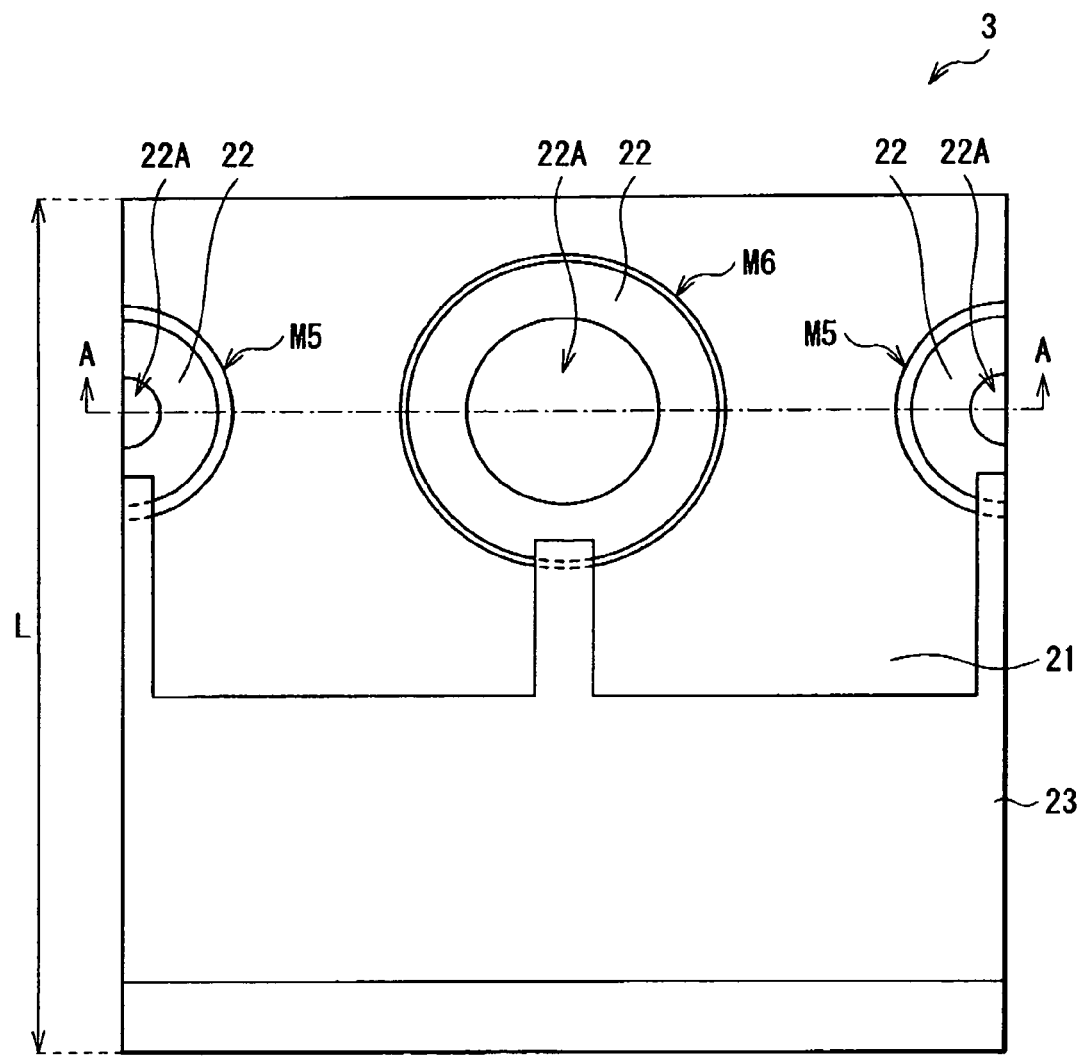
FIG. 41 is a top view of a photo-detection device according to another embodiment of the invention.
Figure 42:
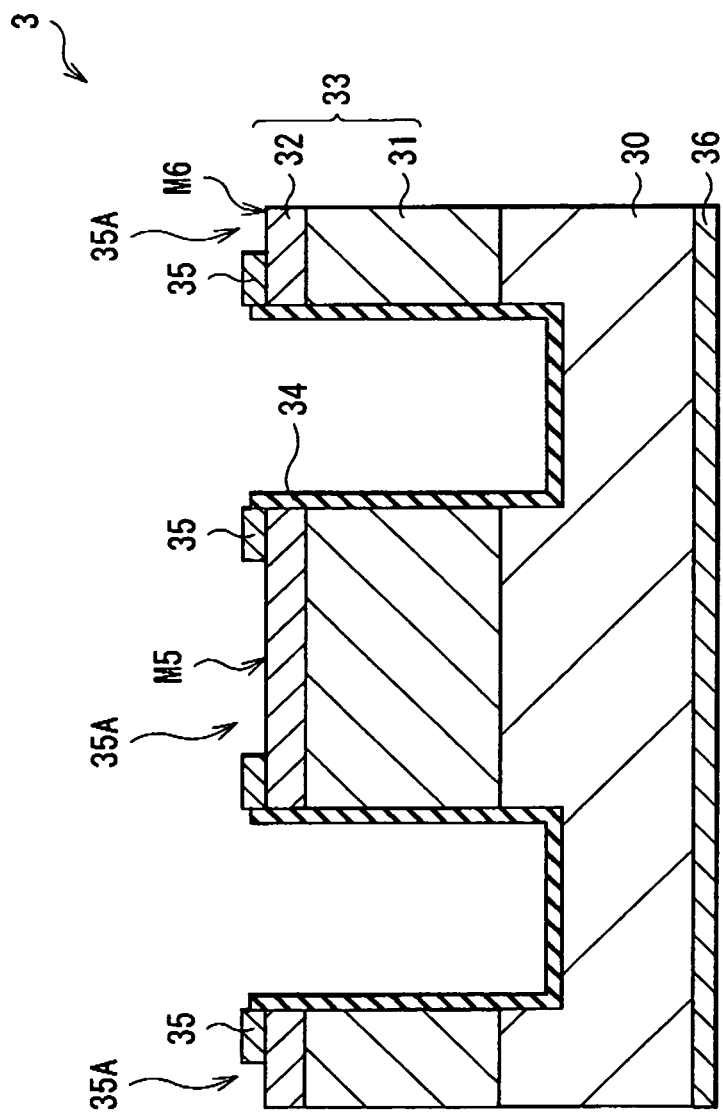
FIG. 42 is a view showing a cross sectional structure taken along the arrows A-A of FIG. 41.

For example, in the first to the fourth embodiments and the modifications thereof, the invention has been described with taking the VCSEL as an example. In the fifth to sixth embodiments and the modifications thereof, the invention has been described with taking the edge-emitting laser as an example. However, the invention can be applied to other semiconductor device such as a photo-detection device. For example, as shown in FIG. 41 and FIG. 42 (cross section taken along the arrows A-A of FIG. 41), a photo-detection device 3 includes a semiconductor layer 33 including a light absorption layer 31 and a p-type contact layer 32 on an n-type substrate 30. In the semiconductor layer 33, mesas M5 and M6 are formed by selectively etching the semiconductor layer 33 from the p-type contact layer 32 side. Further, a circular upper electrode 35 having an aperture 35A is formed on the top face of the mesas M5 and M6. A lower electrode 36 is formed on the rear face side of the n-type substrate 30. The size of the respective mesas M5 and M6 is different from each other. Thereby, the volume of the light absorption layer 31 of the respective mesas M5 and M6 is different from each other. That is, the photo-detection device 3 includes two mesas M5 and M6 with the different volume of the light absorption layer 31, based on the volume of the light absorption layer 31 as a parameter. Two mesas M5 and M6 are formed in the chip area equal to that of the existing VCSEL.

Further, in the photo-detection device 3, the volumes of the light absorption layer 31 of the respective mesas M5 and M6 are respectively set so that the characteristics of at least one light absorption layer 31 of the respective mesas M5 and M6 surely correspond with a given criterion. Thereby, even when the characteristics of the light absorption layer 31 are largely changed due to the as-manufactured error, at least one mesa having the light absorption layer 31 with the characteristics corresponding with the given criterion can be surely formed for every unit chip area. In the result, the waste such as disposing chips with a mesa having the characteristics not corresponding with a given criterion is not incurred, leading to largely increased yield.

Further, in the foregoing embodiments, only one mesa is selected in the measurement and evaluation step. However, when a plurality of mesas corresponding with a given criterion exist for every unit chip area, for example, the plurality of mesas can be selected (used concurrently) according to the purpose and usage.

Further, in the foregoing embodiments, the mesa not corresponding with a given criterion in the measurement and evaluation step is left as it is. However, such a handling is limited to the case that the mesa not corresponding with the given criterion does not adversely affect the mesa corresponding with the given criterion. Therefore, when the mesa not corresponding with the given criterion somewhat adversely affects the mesa corresponding with the given criterion, the mesa not corresponding with the given criterion is preferably broken to the degree that adverse effects are not caused, or preferably removed.

Further, in the foregoing embodiments, the invention has been described by taking the AlGaAs compound semiconductor laser and the GaN compound semiconductor laser. However, the invention can be also applied to other compound semiconductor lasers such as a GaInP compound semiconductor laser, an AlGaInP compound semiconductor laser, an InGaAs compound semiconductor laser, a GaInP compound semiconductor laser, an InP compound semiconductor laser, a GaInN compound semiconductor laser, and a GaInNAs compound semiconductor laser.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a semiconductor device comprising:
   a step of forming a semiconductor layer on a substrate;
   a step of etching said semiconductor layer, mesas resulting from the step of etching;
   a step of measuring a parameter value in each of the mesas, said parameter value being used to identify one of the mesas, and thereafter;
   a step of separating said one of the mesas from others of the mesas, another of the mesas being diced during the step of separating.

2. The method of manufacturing a semiconductor device according to claim 1, wherein said parameter value is a laser characteristic.

3. The method of manufacturing a semiconductor device according to claim 1, wherein a difference is between a film thickness of an insulating layer on said one of the mesas and a film thickness of the insulating layer on said another of the mesas, said parameter value being said difference.

4. The method of manufacturing a semiconductor device according to claim 3, wherein an electrode pad is on said insulating layer, said electrode pad being electrically connected to said one of the mesas.

5. The method of manufacturing a semiconductor device according to claim 1, wherein a light absorption layer of the semiconductor layer is between said substrate and a contact layer, said parameter value being a volume of the light absorption layer.

6. The method of manufacturing a semiconductor device according to claim 1, wherein a height, a width, and a shape of the mesas are said parameter value.

7. The method of manufacturing a semiconductor device according to claim 1, wherein after the step of forming the semiconductor layer includes:
 a step of forming an AlGaAs layer on an upper cladding layer, an upper DBR mirror layer being formed on said AlGaAs layer.

8. The method of manufacturing a semiconductor device according to claim 7, wherein said parameter value is a diameter of a non-oxidized portion of the AlGaAs layer.

9. The method of manufacturing a semiconductor device according to claim 7, wherein the step of etching includes:
 a step of etching from said upper DBR mirror layer through said upper cladding layer.

10. The method of manufacturing a semiconductor device according to claim 7, wherein after the step of etching, the method comprises:
 a step of oxidizing said mesas, said AlGaAs layer in said mesas being partially oxidized during the step of oxidizing.

11. The method of manufacturing a semiconductor device according to claim 1, wherein after the step of measuring, the method further comprises:
 a step of forming a protective film on said mesas, an electrode pad on said protective film being electrically connected to said one of the mesas.

12. The method of manufacturing a semiconductor device according to claim 11, wherein the step of forming the protective film is before the step of separating.

* * * * *